(12) United States Patent
Kitagawa et al.

(10) Patent No.: US 12,520,655 B2
(45) Date of Patent: Jan. 6, 2026

(54) DISPLAY DEVICE AND METHOD FOR PRODUCING DISPLAY DEVICE

(71) Applicant: SHARP KABUSHIKI KAISHA, Sakai (JP)

(72) Inventors: Makoto Kitagawa, Sakai (JP); Jun Sakuma, Sakai (JP); Yunting Shen, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 380 days.

(21) Appl. No.: 18/272,372

(22) PCT Filed: Jan. 18, 2021

(86) PCT No.: PCT/JP2021/001479
§ 371 (c)(1),
(2) Date: Jul. 14, 2023

(87) PCT Pub. No.: WO2022/153535
PCT Pub. Date: Jul. 21, 2022

(65) Prior Publication Data
US 2024/0074269 A1     Feb. 29, 2024

(51) Int. Cl.
*H10K 50/115*     (2023.01)
*H10K 59/35*      (2023.01)
*H10K 71/00*      (2023.01)
*H10K 71/12*      (2023.01)
*H10K 102/00*     (2023.01)

(52) U.S. Cl.
CPC ........... *H10K 50/115* (2023.02); *H10K 59/35* (2023.02); *H10K 71/00* (2023.02); *H10K 71/12* (2023.02); *H10K 2102/331* (2023.02)

(58) Field of Classification Search
CPC ...... H10K 50/115; H10K 59/35; H10K 71/00; H10K 71/12; H10K 2102/331; H10K 50/11; H10K 59/30; H10K 59/38; H10K 59/122; H05B 33/10; H05B 33/12; H05B 33/14

See application file for complete search history.

(56) References Cited

FOREIGN PATENT DOCUMENTS

JP     2012-234748 A     11/2012

*Primary Examiner* — Donald L Raleigh
(74) *Attorney, Agent, or Firm* — ScienBiziP, P.C.

(57) ABSTRACT

A display device is a display device provided with a display region including a plurality of pixels and a frame region surrounding the display region, and includes: a thin film transistor layer; and a light-emitting element layer including a plurality of light-emitting elements, each including a first electrode, a function layer, and a second electrode, and each having a different luminescent color, wherein the function layer includes a light-emitting layer, and a pair of holding layers sandwiching the light-emitting layer and each including a photosensitive material and a conductive nanoparticle.

18 Claims, 62 Drawing Sheets

DISPLAY DEVICE AND METHOD FOR PRODUCING DISPLAY DEVICE

TECHNICAL FIELD

The disclosure relates to a display device and a method for manufacturing a display device.

BACKGROUND ART

In recent years, self-luminous display devices are developed and put into practical use in place of non-self-luminous liquid crystal display devices. In such a display device that does not require a backlight device, a light-emitting element, such as an organic light-emitting diode (OLED) or a quantum dot light-emitting diode (QLED), for example, is provided for each pixel.

A self-luminous display device as described above is provided with a first electrode, a second electrode, and a function layer that is disposed between the first electrode and the second electrode and that includes at least a light-emitting layer. Furthermore, with such a display device, in order to easily manufacture a high-definition display device at a low cost, formation of the light-emitting layer using a technique of dripping droplets such as an ink-jet application method instead of formation using the existing vapor deposition technique is proposed (refer to, for example, PTL 1 below), for example.

CITATION LIST

Patent Literature

PTL 1: JP 2012-234748 A

SUMMARY

Technical Problem

However, in a known display device and method for manufacturing a display device such as described above, a bank that partitions pixels is provided on a per pixel basis, and the light-emitting layer is formed in an interior of the bank.

However, in a known display device and method for manufacturing a display device such as described above, a film thickness of the light-emitting layer cannot be easily controlled, and thus a light-emitting layer having an appropriate film thickness may not be easily formed. As a result, in the known display device and method for manufacturing a display device, a problem arises that the light emission performance deteriorates.

Specifically, in the known display device and method for manufacturing a display device, droplets including a constituent material of the light-emitting layer and a predetermined solvent are dripped into the interior of the bank, and the droplets are further dried (the solvent is evaporated) to form the light-emitting layer. Therefore, this known display device and method for manufacturing a display device requires the droplets to be precisely dripped into the interior of the bank while controlling the position of the droplets with high precision, may give rise to a coffee ring phenomenon with the droplets during solvent evaporation, and may result in a film thickness of a central portion of the light-emitting layer that is thinner than that of peripheral portions of the light-emitting layer, causing thickness non-uniformity in the light-emitting layer. Therefore, in the known display device and method for manufacturing a display device, the light-emitting layer may not function properly, resulting in the problem of deterioration in light emission performance.

In light of the problems described above, an object of the disclosure is to provide a display device and a method for manufacturing a display device that can prevent display performance deterioration even when a light-emitting layer is formed by using a dripping technique.

Solution to Problem

A display device according to one aspect of the disclosure is a display device provided with a display region including a plurality of pixels and a frame region surrounding the display region, and includes: a thin film transistor layer; and a light-emitting element layer including a plurality of light-emitting elements, each including a first electrode, a function layer, and a second electrode, and each having a different luminescent color, wherein the function layer includes a light-emitting layer, and a pair of holding layers sandwiching the light-emitting layer and each including a photosensitive material and a conductive nanoparticle.

A method for manufacturing a display device according to another aspect of the disclosure is a method for manufacturing a display device provided with a display region including a plurality of pixels and a frame region surrounding the display region, the display device including a thin film transistor layer, and a light-emitting element layer including a plurality of light-emitting elements, each including a first electrode, a function layer, and a second electrode, and each having a different luminescent color, and the method includes: a) forming the function layer on the first electrode, wherein the a) forming the function layer includes b) forming a first charge transport layer included in the function layer on the first electrode, c) forming one holding layer of a pair of holding layers that sandwich a light-emitting layer and are included in the function layer on the first charge transport layer using a first photosensitive material and a first conductive nanoparticle, d) forming the light-emitting layer on the one holding layer, e) forming the other holding layer of the pair of holding layers included in the function layer on the light-emitting layer using a second photosensitive material and a second conductive nanoparticle, and f) forming a second charge transport layer included in the function layer on the other holding layer.

DESCRIPTION OF EMBODIMENTS

Embodiments of the disclosure will be described below in detail with reference to the drawings. Note that the technique according to the disclosure is not limited to the embodiments to be described below. In the following description, a "same layer" means that the layer is formed through the same process (film formation process), a "lower layer" means that the layer is formed in a process before the layer being compared, and an "upper layer" means that the layer is formed in a process after the layer being compared. In each of the drawings, the dimensions of constituent elements are not precisely illustrated as the actual dimensions of the constituent elements and the dimensional proportions of each of the constituent elements.

First Embodiment

Figure 1:
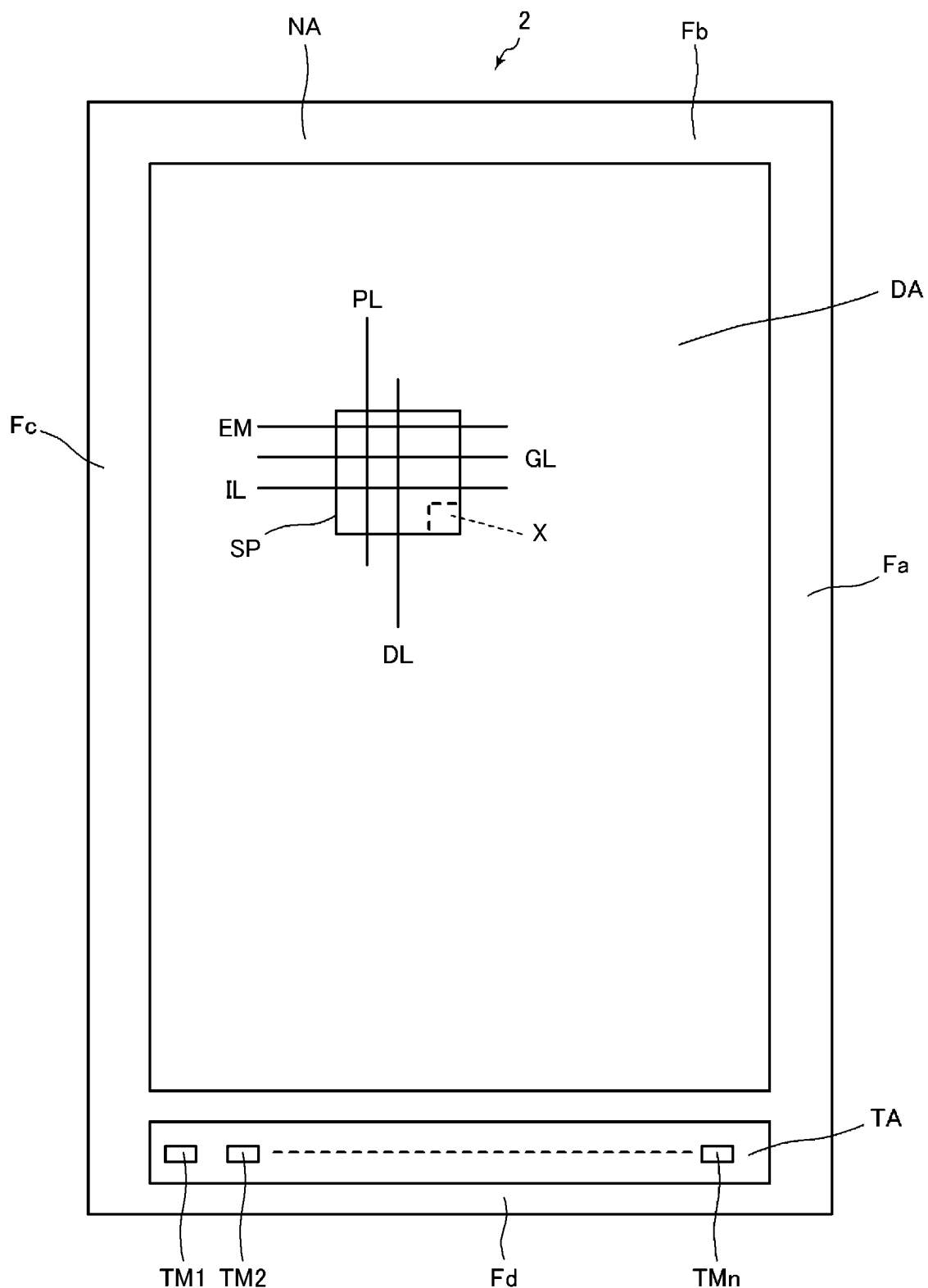
FIG. 1 is a schematic view illustrating a configuration of a display device according to a first embodiment of the disclosure.
Figure 2:
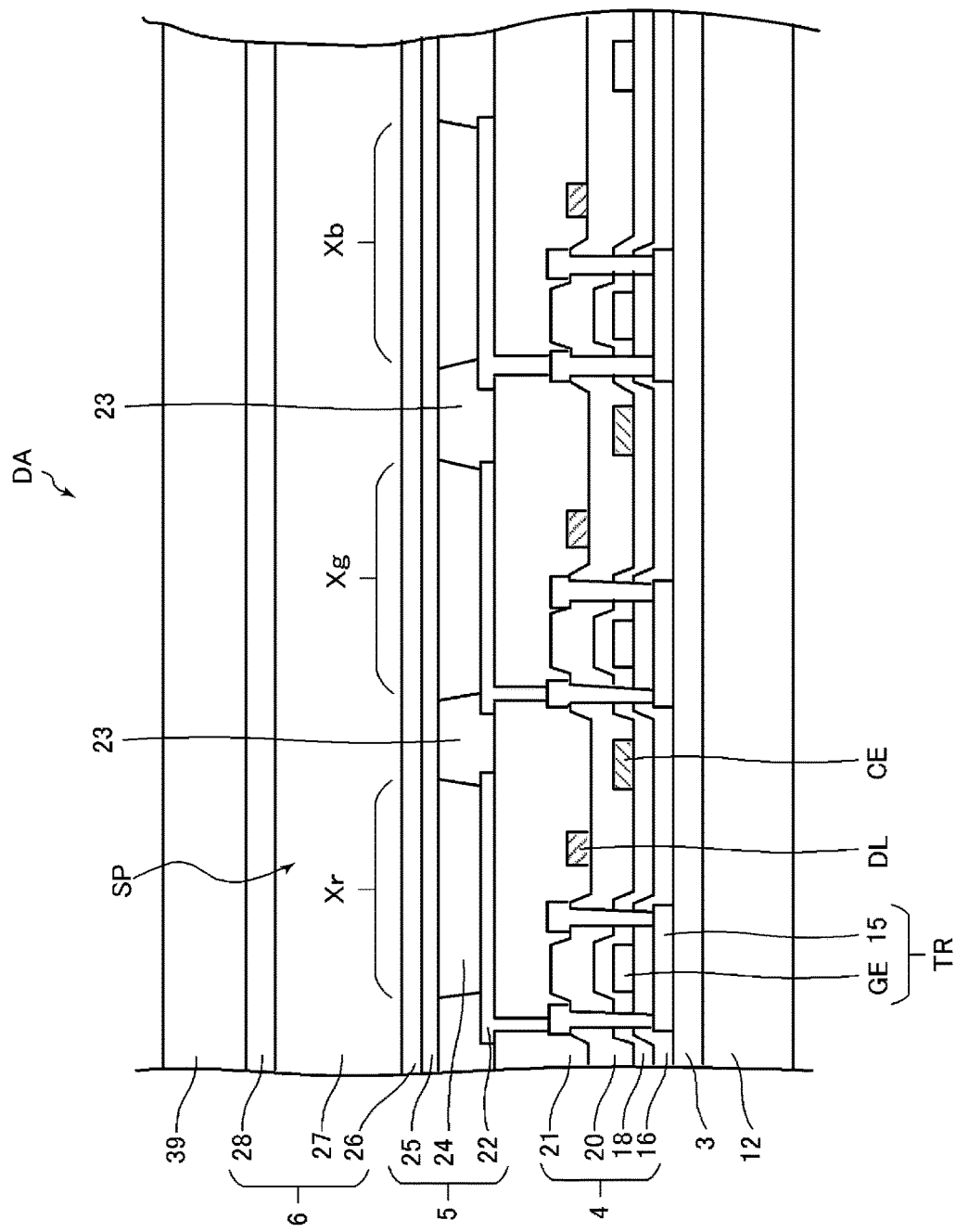
FIG. 2 is a cross-sectional view illustrating a configuration of main portions of the display device illustrated in FIG. 1.
Figure 3:
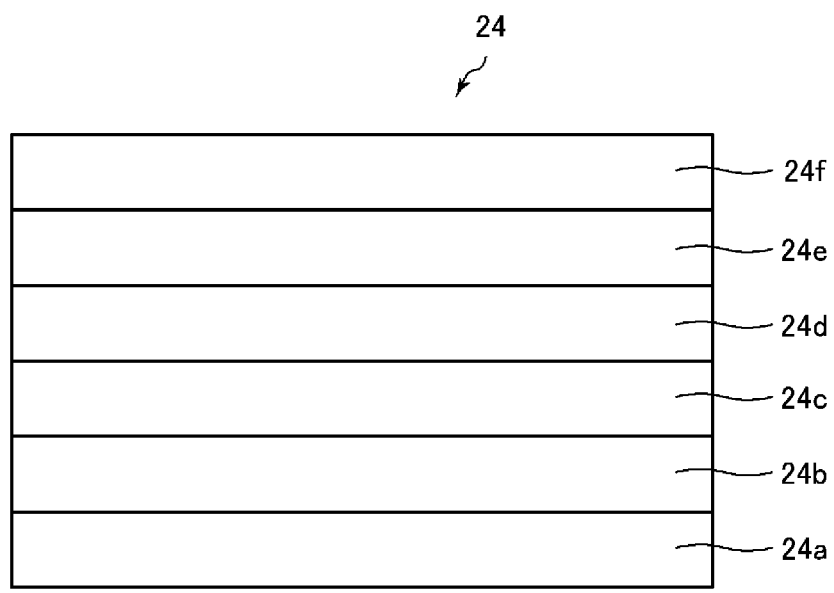
FIG. 3 is a cross-sectional view illustrating a specific configuration of a function layer illustrated in FIG. 2.

FIG. 1 is a schematic view illustrating a configuration of a display device according to a first embodiment of the disclosure. FIG. 2 is a cross-sectional view illustrating a configuration of main portions of the display device illustrated in FIG. 1. FIG. 3 is a cross-sectional view illustrating a specific configuration of a function layer illustrated in FIG. 2.

As illustrated in FIG. 1 and FIG. 2, in a display device 2 of the present embodiment, a barrier layer 3, a thin film transistor (TFT) layer 4, a top emission light-emitting element layer 5, and a sealing layer 6 are provided in this order on a base material 12, and a plurality of subpixels SP are formed in a display region DA. A frame region NA surrounding the display region DA includes four side edges Fa to Fd, and a terminal portion TA for mounting an electronic circuit board (an IC chip, a FPC, or the like) is formed at the side edge Fd. The terminal portion TA includes a plurality of terminals TM1, TM2 and TMn (where n is an integer of 2 or greater). As illustrated in FIG. 1, the plurality of terminals TM1, TM2, and TMn are provided along one side of the four sides of the display region DA. Note that driver circuits (not illustrated) may be formed on each of the side edges Fa to Fd.

The base material 12 may be a glass substrate or a flexible substrate including a resin film such as polyimide. The base material 12 may also configure a flexible substrate formed of two layers of resin films and an inorganic insulating film interposed between these resin films. Furthermore, a film such as a polyethylene terephthalate (PET) film may be applied to a lower face of the base material 12. When a flexible substrate is used as the base material 12, the display device 2 having flexibility, that is, a flexible display device, may also be formed.

The barrier layer 3 is a layer that inhibits foreign matters such as water and oxygen from penetrating the thin film transistor layer 4 and the light-emitting element layer 5. For example, the barrier layer 3 can be configured by a silicon oxide film, a silicon nitride film, or a silicon oxynitride film, or a layered film thereof formed by chemical vapor deposition (CVD).

As illustrated in FIG. 2, the thin film transistor layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 20 as an upper layer overlying the second metal layer, a third metal layer (including a data signal line DL) as an upper layer overlying the inorganic insulating film 20, and a flattening film 21 as an upper layer overlying the third metal layer.

The semiconductor layer described above is configured by, for example, amorphous silicon, low-temperature polycrystalline silicon (LTPS), or an oxide semiconductor, and a thin film transistor TR is configured to include the gate electrode GE and the semiconductor film 15.

Note that, although the thin film transistor TR of a top gate type is exemplified in the present embodiment, the thin film transistor TR may be a thin film transistor of a bottom gate type.

A light-emitting element X and a control circuit thereof are provided for each of the subpixels SP in the display region DA, and the control circuit and wiring lines connected to the control circuit are formed in the thin film transistor layer 4. Examples of the wiring lines connected to the control circuit include a scanning signal line GL and a light emission control line EM both formed in the first metal layer, an initialization power source line IL formed in the second metal layer, and the data signal line DL and a high voltage power source line PL both formed in the third metal layer. The control circuit includes a drive transistor that controls the current of the light-emitting element X, a writing transistor that electrically connects to a scanning signal line, a light emission control transistor that electrically connects to a light emission control line (not illustrated).

The first metal layer, the second metal layer, and the third metal layer described above are each formed of a single layer film or a multi-layer film of metal, the metal including at least one of aluminum, tungsten, molybdenum, tantalum, chromium, titanium, and copper, for example.

Each of the inorganic insulating films 16, 18, and 20 can be formed of, for example, a silicon oxide ($SiO_x$) film or a silicon nitride ($SiN_x$) film, or a layered film of these, formed by using a CVD method. The flattening film 21 can be formed of, for example, a coatable organic material such as polyimide or acrylic resin.

The light-emitting element layer 5 includes a first electrode (anode electrode) 22 as an upper layer overlying the flattening film 21, an edge cover film 23 having insulating properties and covering an edge of the first electrode 22, a function layer 24 as an upper layer overlying the edge cover film 23, and a second electrode (cathode electrode) 25 as an upper layer overlying the function layer 24. That is, the light-emitting element layer 5 is formed with a plurality of light-emitting elements X, each including the first electrode 22, a light-emitting layer described below included in the function layer 24, a pair of holding layers sandwiching the light-emitting layer, and the second electrode 25, and each having a different luminescent color. The edge cover film 23 is formed by applying an organic material such as polyimide or acrylic resin and then patterning the organic material by photolithography, for example. This edge cover film 23 overlaps an end portion of a surface of the first electrode 22 having an island shape to partition a pixel (subpixel SP). The edge cover film 23 is a bank that defines the plurality of pixels (subpixels SP) corresponding to each of the plurality of light-emitting elements X. The function layer 24 is an electroluminescence (EL) layer including an electroluminescence element.

The light-emitting element layer 5 is formed with a light-emitting element Xr (red), a light-emitting element Xg (green), and a light-emitting element Xb (blue) having luminescent colors different from each other and included in the light-emitting element X described above. Each light-emitting element X includes the first electrode 22, the function layer 24 (including the light-emitting layer), and the second electrode 25. The first electrode 22 is an island-shaped electrode provided for each light-emitting element X (that is, subpixel SP). The second electrode 25 is a solid-like common electrode common to all light-emitting elements X.

The light-emitting elements Xr, Xg, and Xb each may be, for example, an organic light-emitting diode (OLED) in which a light-emitting layer described below is an organic light-emitting layer, or may be a quantum dot light-emitting diode (QLED) in which the light-emitting layer is a quantum dot light-emitting layer.

For example, the function layer 24 is, for example, constituted by layering a hole injection layer 24a, a hole transport layer 24b, a first holding layer 24c, a light-emitting layer 24d, a second holding layer 24e, and an electron transport layer 24f, in this order, from the lower layer side. The hole injection layer 24a is provided between the anode electrode (first electrode 22) and the hole transport layer 24b, and is provided between the anode electrode (first electrode 22) and the first holding layer 24c. Further, an electron injection layer, an electron blocking layer, or a hole blocking layer may be provided in the function layer 24 as appropriate. The light-emitting layer 24d is formed into an island shape at an opening of the edge cover film 23 (for each subpixel SP) by a dripping technique such as an ink-jet method. Other layers are formed in the island shape described above or a solid-like shape (common layer) common to all of the light-emitting elements X. Further, the first holding layer 24c and the second holding layer 24e constitute a pair of holding layers that sandwich the light-emitting layer 24d, and thus sandwich the light-emitting layer 24d, and each includes a photosensitive material and conductive nanoparticles described below.

The display device 2 according to the present embodiment has a so-called known structure in which the anode electrode (first electrode 22), the function layer 24, and the cathode electrode (second electrode 25) are provided in this order from the thin film transistor layer 4 side, as exemplified in FIG. 2.

Further, as illustrated in FIG. 2, in the display device 2 according to the present embodiment, the light-emitting elements Xr, Xg, Xb are partitioned by the edge cover films 23 serving as banks. Further, in the light-emitting elements Xr, Xg, Xb, for example, the first electrode 22 having an island shape, the hole injection layer 24a having an island shape, the hole transport layer 24b having an island shape, the first holding layer 24c having an island shape, the light-emitting layer 24d having an island shape, and the second holding layer 24e having an island shape are provided for each light-emitting element X. Note that the term island shape used here refers to the shape of each subpixel SP in a plan view, which is partitioned per subpixel SP by the edge cover film (bank) 23. Further, in the light-emitting element X, the electron transport layer 24f that is solid-like and the second electrode 25 that is solid-like, both common to all subpixels SP, are provided. Further, in the light-emitting layer 24d, light-emitting layers 24dr, 24dg, 24db described below (collectively referred to as the light-emitting layer 24d) are provided with different light-emitting materials (functional materials) and different luminescent colors in accordance with the light-emitting elements Xr, Xg, Xb, respectively. Further, in addition to the above description, the configuration may be one in which the hole injection layer 24a that is solid-like and the hole transport layer 24b that is solid-like are used, for example.

When the organic light-emitting layer (light-emitting layer 24d) of the OLED is formed by vapor deposition, a fine metal mask (FMM) is used. The FMM is a sheet (made of Invar material, for example) including a large number of openings, and an island-shaped organic layer (corresponding to one subpixel SP) is formed of an organic material passing through one of the openings. Further, other than as described here, the organic light-emitting layer (light-emitting layer 24d) of the OLED can be formed by a dripping technique using a predetermined solution.

Further, when the light-emitting elements Xr, Xg, and Xb are OLEDs, positive holes and electrons recombine inside the light-emitting layer 24d in response to a drive current between the first electrode 22 and the second electrode 25, and light is emitted when the excitons generated in this manner transition to a ground state. Since the second electrode 25 has a high light-transmitting property and the first electrode 22 has light reflectivity, the light emitted from the function layer 24 is directed upward to configure a top-emitting structure.

For the quantum dot light-emitting layer (light-emitting layer 24d) of the QLED, an island-shaped quantum dot light-emitting layer (corresponding to one subpixel SP) can be formed by applying a solution in which quantum dots are diffused in a solvent, and patterning the applied solution using an ink-jet method or a photolithography method, for example.

Further, when the light-emitting elements Xr, Xg, and Xb are QLEDs, positive holes and electrons recombine inside the light-emitting layer 24d in response to a drive current between the first electrode 22 and the second electrode 25, and light (fluorescence) is emitted when the excitons generated in this manner transition from the conduction band level of the quantum dots to the valence band level.

A light-emitting element including a light-emitting element other than the OLED and QLED described above, such as an inorganic light-emitting diode, for example, may be used in the light-emitting element layer 5.

Further, in the following description, a case in which the light-emitting layer 24d is formed by a quantum dot light-emitting layer including quantum dots will be described as an example. That is, in the display device 2 according to the present embodiment, the red light-emitting element Xr includes a red quantum dot light-emitting layer that emits red light, the green light-emitting element Xg includes a green quantum dot light-emitting layer that emit green light, and the blue light-emitting element Xb includes a blue quantum dot light-emitting layer that emit blue light. A pair of holding layers included in each of the light-emitting elements Xr, Xg, and Xb including the red quantum dot light-emitting layer, the green quantum dot light-emitting layer, and the blue quantum dot light-emitting layer sandwich the red quantum dot light-emitting layer, the green quantum dot light-emitting layer, and the blue quantum dot light-emitting layer, respectively.

The quantum dot light-emitting layer (light-emitting layer 24d) includes quantum dots as a functional material contributing to the function of the light-emitting layer 24d and, in each of the light-emitting layers 24dr, 24dg, 24db of each color, at least the particle sizes of the quantum dots are configured to be different from each other in accordance with the light emission spectrum.

The first holding layer 24c and the second holding layer 24e include a negative resist material as a photosensitive material (details described below). Further, in the present embodiment, the hole transport layer 24b is provided between the first holding layer 24c as one holding layer and the first electrode 22 as the anode electrode. Furthermore, in the present embodiment, the electron transport layer 24f is provided between the second holding layer 24e as the other holding layer and the second electrode 25 as the cathode electrode.

The first electrode (anode electrode) 22 is composed of layering of an indium tin oxide (ITO) and silver (Ag) or an alloy including Ag, and has light reflectivity, for example. The second electrode (cathode electrode) 25 is a transparent electrode which is composed of, for example, a thin film of Ag, Au, Pt, Ni, Ir, or Al, a thin film of a MgAg alloy, or a light-transmissive conductive material such as ITO, or indium zinc oxide (IZO). Note that, other than those described, the configuration may be one in which a metal nanowire such as silver is used to form the second electrode 25, for example. When the second electrode 25, which is a solid-like common electrode on the upper layer side, is formed using such a metal nanowire, the second electrode 25 can be provided by applying a solution including the metal nanowire. As a result, in the light-emitting element layer 5 of the display device 2, each layer of the function layer 24 and the second electrode 25, other than the first electrode 22, can be formed by a dropping technique using a predetermined solution, making it possible to easily configure the display device 2 of simple manufacture.

The sealing layer 6 has a light-transmitting property, and includes an inorganic sealing film 26 directly formed on the second electrode 25 (in contact with the second electrode 25), an organic film 27 as an upper layer overlying the inorganic sealing film 26, and an inorganic sealing film 28 as an upper layer overlying the organic film 27. The sealing layer 6 covering the light-emitting element layer 5 inhibits foreign matters such as water and oxygen from penetrating the light-emitting element layer 5. Note that, when the light-emitting layer 24d is constituted by quantum dot light-emitting layer, installation of the sealing layer 6 can be omitted.

The organic film 27 has a flattening effect and is transparent, and can be formed by, for example, ink-jet application using a coatable organic material. The inorganic sealing films 26 and 28 are inorganic insulating films and can be formed of a silicon oxide film, a silicon nitride film, a silicon oxynitride film, or a layered film of these, formed by CVD, for example.

A function film 39 has at least one of an optical compensation function, a touch sensor function, a protection function, and the like.

Figure 4:
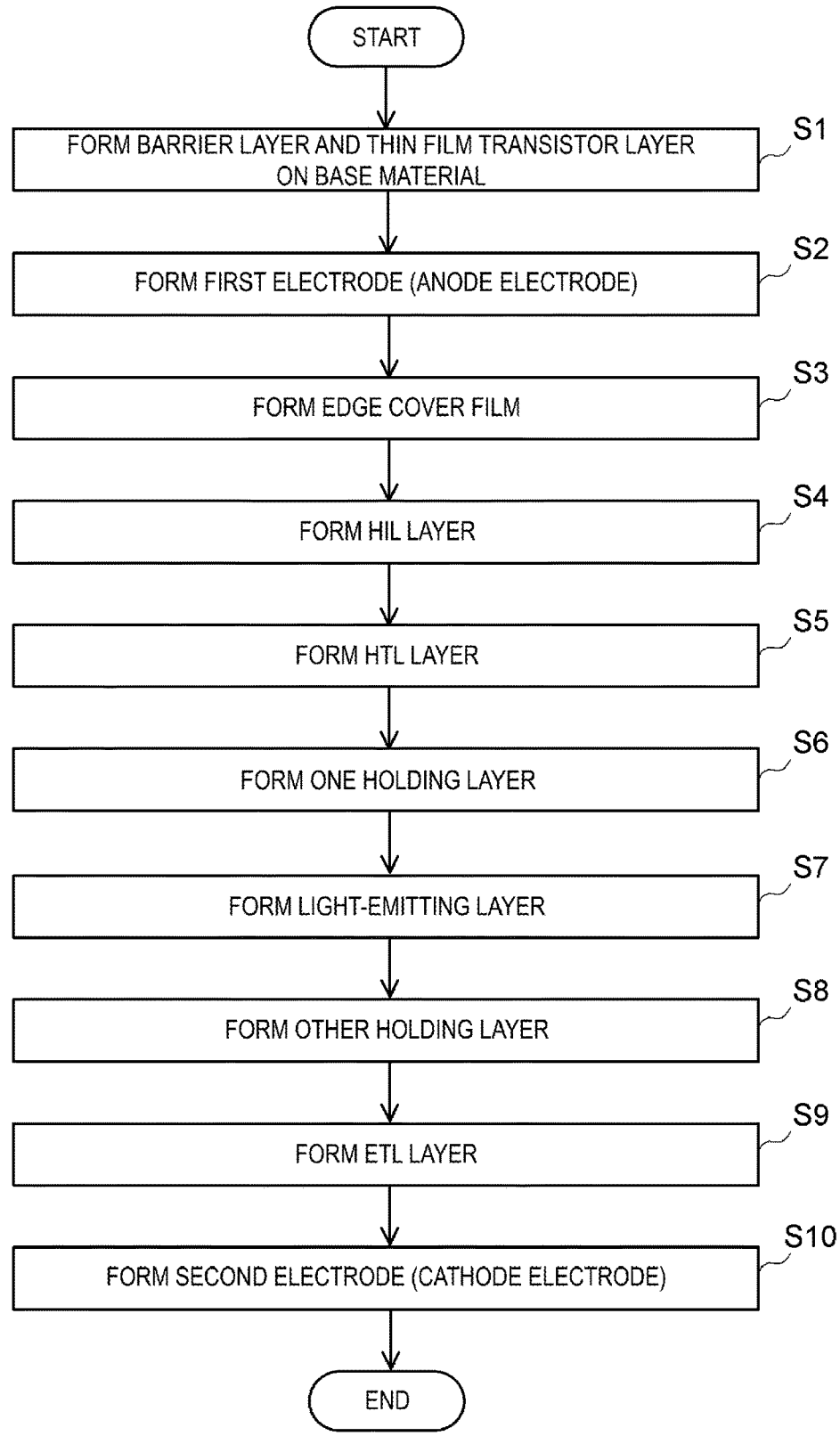
FIG. 4 is a flowchart illustrating a method for manufacturing the display device described above.
Figure 5:
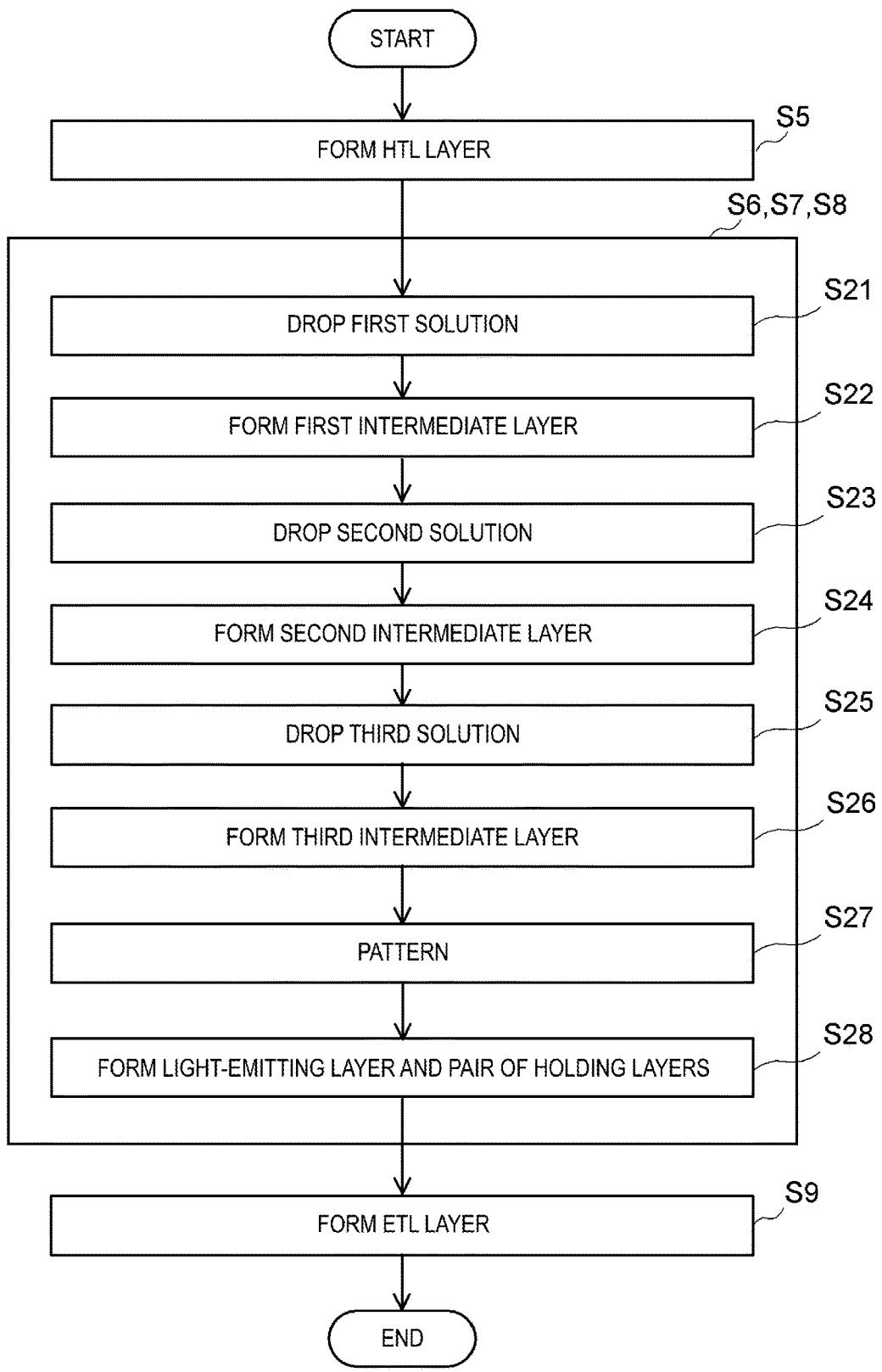
FIG. 5 is a flowchart illustrating a specific method for manufacturing a configuration of the main portions of the display device described above.
Figure 6:
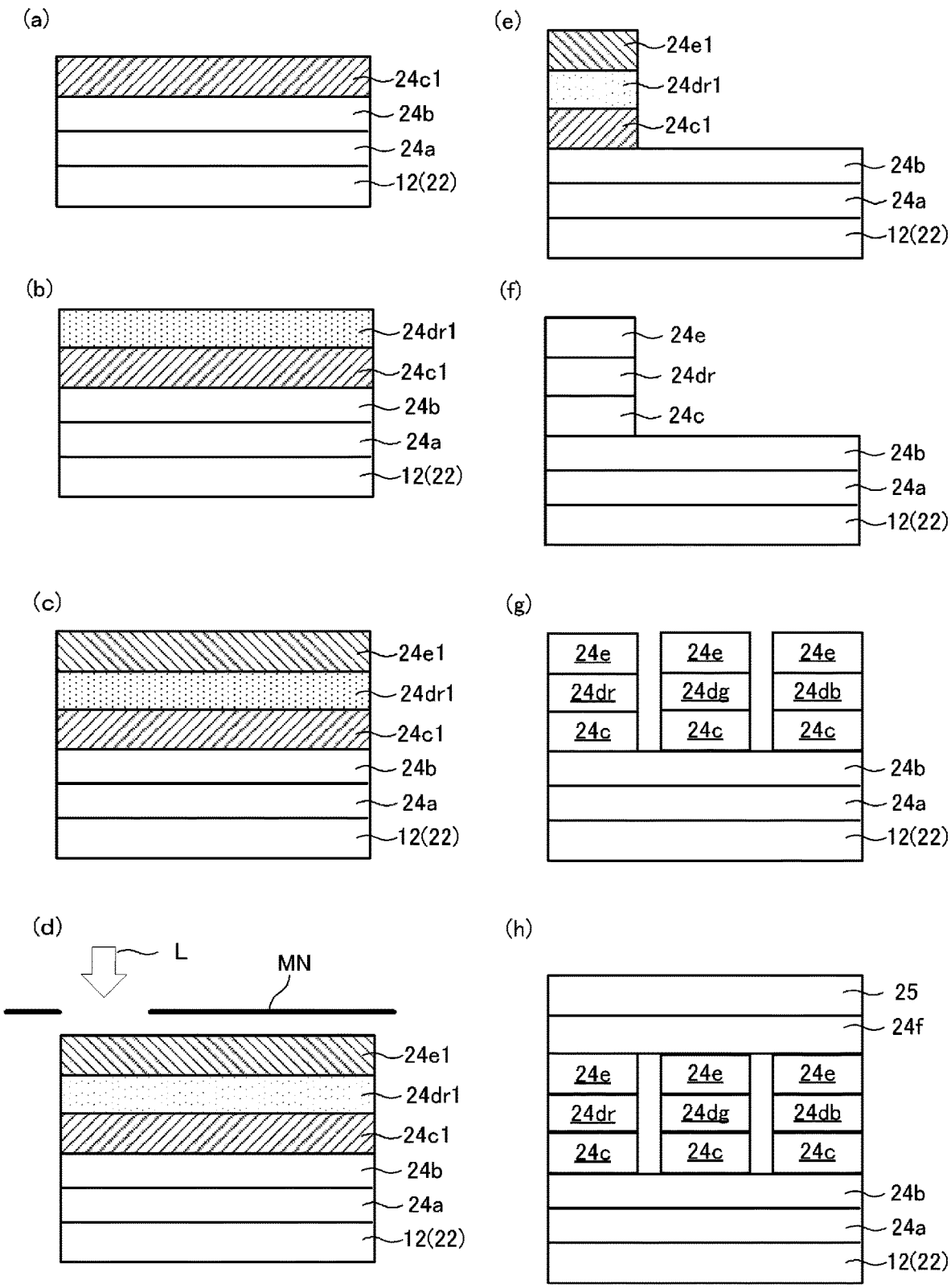
FIG. 6 is a diagram explaining a specific manufacturing process of a configuration of the main portions of the display device described above.

Next, with reference to FIGS. 4 to 6 as well, a method for manufacturing the display device 2 of the present embodiment will be specifically described. FIG. 4 is a flowchart illustrating a method for manufacturing the display device described above. FIG. 5 is a flowchart illustrating a specific method for manufacturing a configuration of the main portions of the display device described above. FIG. 6 is a diagram explaining a specific manufacturing process of a configuration of the main portions of the display device described above. Note that, in FIG. 6, for the sake of simplicity in the drawings, illustration of the first electrode 22 and the edge cover film 23 for each subpixel SP is omitted.

As illustrated in FIG. 4, in the method for manufacturing the display device 2 of the present embodiment, first, the barrier layer 3 and the thin film transistor layer 4 are formed on the base material 12 (step S1). Next, the first electrode (anode electrode) 22 is formed on the flattening film 21 by using, for example, a sputtering method and a photolithography method (step S2). Then, the edge cover film 23 is formed (step S3).

Next, the hole injection layer (HIL) 24a is formed by a dropping technique such as an ink-jet method (step S4). Specifically, in this HIL layer formation process, 2-propanol, butyl benzoate, toluene, chlorobenzene, tetrahydrofuran, or 1,4 dioxane, for example, is used as a solvent included in a solution for hole injection layer formation. For example, a polythiophene-based conductive material such as PEDOT: PSS, or an inorganic compound such as nickel oxide or tungsten oxide, is used as a solute, that is, hole injection material (functional material), included in the solution for hole injection layer formation. Then, in this HIL layer formation process, the hole injection layer 24a having a film thickness of, for example, from 20 nm to 50 nm is formed by baking, at a predetermined temperature, the solution for hole injection layer formation, that has been dropped onto the first electrode 22.

Note that, when the light-emitting elements Xr, Xg, and Xb are OLEDs, the hole injection material (functional material) of the solution for hole injection layer formation may be, in addition to the materials described above, benzene, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof, and chain-type conjugated organic polymers such as polysilane compounds, vinylcarbazole compounds, thiophene compounds, and aniline compounds, for example. Further, as the solvent of the solution for hole injection layer formation in the case of OLEDs, the same solvents as those in the case of QLEDs described above can be used.

Then, the hole transport layer (HTL) 24b serving as the first charge transport layer is formed by a dripping technique such as an ink-jet method (step S5). Specifically, in this HTL layer formation process, chlorobenzene, toluene, tetrahydrofuran, or 1,4 dioxane, for example, is used as a solvent included in a solution for hole transport layer formation. As a solute, that is, hole transport material (functional material), included in the solution for hole transport layer formation, for example, an organic polymer compound such as tetrafluorobenzobarrelene (TFB), polyvinylcarbazole (PVK), or poly-TPD, or an inorganic compound such as nickel oxide is used. Then, in this HTL layer formation process, the hole transport layer 24b having a film thickness of, for example, from 20 nm to 50 nm is formed by baking, at a predetermined temperature, the solution for hole transport layer formation that has been dropped onto the hole injection layer 24a.

Note that, when the light-emitting elements Xr, Xg, and Xb are OLEDs, the hole transport material (functional material) of the solution for hole transport layer formation may be, in addition to the materials described above, benzene, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, and derivatives thereof, and chain-type conjugated organic polymers such as polysilane compounds, vinylcarbazole compounds, thiophene compounds, and aniline compounds, for example. Further, as the solvent of the solution for hole transport layer formation in the case of OLEDs, the same solvents as those in the case of QLEDs described above can be used.

Next, the first holding layer (one holding layer) 24c is formed by a dripping technique such as an ink-jet method (step S6). Then, the light-emitting layer 24d composed of the quantum dot light-emitting layer is formed by a dripping technique such as an ink-jet method (step S7). Subsequently, the second holding layer (other holding layer) 24e is formed by a dripping technique such as an ink-jet method (step S8). The one holding layer formation process, the light-emitting layer formation process, and the other holding layer formation process are performed continuously until each intermediate layer is formed, and subsequently the process of forming the light-emitting layer 24d and the pair of holding layers 24c and 24e that sandwich the light-emitting layer 24d is performed for each of the light-emitting elements Xr, Xg, Xb. Note that, in the following description, a case in which the red light-emitting element Xr, the green light-emitting element Xg, and the blue light-emitting element Xb are sequentially formed in this order is illustrated as an example.

Specifically, as illustrated in step S21 in FIG. 5, after the HTL layer formation process (first charge transport layer formation process) is performed, a first solution dripping process in which a first solution including a first photosensitive material and first conductive nanoparticles is dripped onto the first charge transport layer described above is performed.

A resin component of the first photosensitive material (negative resist material) is selected from the group consisting of, for example, an acrylic resin, an epoxy resin, a phenolic resin, a fluorine resin, a siloxane compound including a photopolymerizable group, a polysilane, and OTPD. Furthermore, a high-polarity solvent such as PGMEA, for example, is used as the solvent of the first solution (solution for one holding layer formation), and this first solution includes, for example, a photoinitiator (photo-radical polymerization initiator represented by acetophenone and acyloxime types used for acrylic oligomers or monomers such as special acrylates, a sulfonium salt-based photoinitiator used for monomers such as alicyclic epoxies, an iodonium salt-based photoinitiator, a photo-cationic polymerization initiator such as a non-ionic photoinitiator, or a photoanionic polymerization initiator used for epoxy monomers, for example) at about 1 to 10%, and an additive such as a coupling material for improving adhesion, for example.

The first conductive nanoparticles include, for example, metal nanoparticles. The metal nanoparticles desirably have transparency. A metal constituting the metal nanoparticles may be either a pure metal or an alloy. The metal includes, for example, at least one type selected from the group consisting of Ag, Au, Cu, Al, Fe, and Ti. The first conductive nanoparticles are dispersed in the first solution.

Next, as illustrated in step S22 in FIG. 5, a first intermediate layer formation process of drying the solvent in the first solution that has been dripped and thus forming the first intermediate layer of the one holding layer on the first charge transport layer is performed. Specifically, in this first intermediate layer formation process, the first solution on the hole transport layer 24b is baked at a low temperature of about from 50 to 130° C. or vacuum dried, for example, and the solvent of the first solution is evaporated. Then, as illustrated in FIG. 6(a), a first intermediate layer 24c1 of the first holding layer (one holding layer) 24c is formed on the hole transport layer 24b. This first intermediate layer 24c1 is formed at a film thickness of about from several nm to several 10 nm, for example.

Then, as illustrated in step S23 in FIG. 5, a second solution dripping process of dripping a second solution including predetermined quantum dots to be included in the red light-emitting layer 24dr onto the first intermediate layer 24c1 is performed.

As the quantum dots, quantum dots of C, Si, Ge, Sn, P, Se, Te, Cd, Zn, Mg, S, In, O, or the like are used, for example. Further, as a solvent of the second solution described above (solution for light-emitting layer formation), a solvent having insolubility with respect to the first intermediate layer 24c1 serving as the underlayer, such as a non-polar solvent, such as octane or hexane, for example, is used.

Note that, when the light-emitting elements Xr, Xg, and Xb are OLEDs, the light-emitting layer material (functional material) used in the solution for light-emitting layer formation may be, in addition to the quantum dots mentioned above, for example, an organic light-emitting material such anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, derivatives of these, tri(dibenzoylmethyl)phenanthroline europium complex, and ditoluylvinylbiphenyl. Further, as the solvent of the solution for light-emitting layer formation in the case of OLEDs, the same solvents as those in the case of QLEDs described above can be used.

Next, as illustrated in step S24 in FIG. 5, a second intermediate layer formation process of drying the solvent in the second solution that has been dripped and thus forming the second intermediate layer of the light-emitting layer 24dr on the first intermediate layer 24c1 is performed. Specifically, in this second intermediate layer formation process, the second solution on the first intermediate layer 24c1 is baked at a low temperature of about from 50 to 130° C. or vacuum dried, for example, and the solvent of the second solution is evaporated. As illustrated in FIG. 6(b), a second intermediate layer 24dr1 of the light-emitting layer 24dr is formed on the first intermediate layer 24c1. This second intermediate layer 24dr1 is formed at a film thickness of about from 10 nm to 50 nm, for example.

Then, as illustrated in step S25 in FIG. 5, a third solution dripping process of dripping a third solution including a second photosensitive material and second conductive nanoparticles onto the second intermediate layer 24dr1 is performed.

A resin component of the second photosensitive material (negative resist material) is selected from the group consisting of, for example, an acrylic resin, an epoxy resin, a phenolic resin, a fluorine resin, a siloxane compound including a photopolymerizable group, a polysilane, and OTPD. Furthermore, a high-polarity solvent such as PGMEA, for example, is used as the solvent of the third solution (solution for the other holding layer formation), and this third solution includes, for example, a photoinitiator (photo-radical polymerization initiator represented by acetophenone and acyloxime types used for acrylic oligomers or monomers such as special acrylates, a sulfonium salt-based photoinitiator used for monomers such as alicyclic epoxies, an iodonium salt-based 18 photoinitiator, a photo-cationic polymerization initiator such as a non-ionic photoinitiator, or a photoanionic polymerization initiator used for epoxy monomers, for example) at about 1 to 10%, and an additive such as a coupling material for improving adhesion, for example. Note that the same material may be used for the first photosensitive material and the second photosensitive material (that is, the first holding layer 24c and the second holding layer 24e may be configured using the same photosensitive material). In this case, the display device 2 of simple manufacture can be easily configured at low cost.

The second conductive nanoparticles include, for example, metal nanoparticles. The metal nanoparticles desirably have transparency. A metal constituting the metal nanoparticles may be either a pure metal or an alloy. The metal includes, for example, at least one type selected from the group consisting of Ag, Au, Cu, Al, Fe, and Ti. The second conductive nanoparticles are dispersed in the third solution.

Next, as illustrated in step S26 in FIG. 5, a third intermediate layer formation process of drying the solvent in the third solution that has been dripped and thus forming a third intermediate layer of the other holding layer on the second intermediate layer 24dr1 is performed. Specifically, in this third intermediate layer formation process, the third solution on the second intermediate layer 24dr1 is baked at a low temperature of about from 50 to 120° C. or vacuum dried, for example, and the solvent of the third solution is evaporated. Then, as illustrated in FIG. 6(c), a third intermediate layer 24e1 of the second holding layer (other holding layer) 24e is formed on the second intermediate layer 24dr1. This third intermediate layer 24e1 is formed at a film thickness of about from several nm to 50 nm, for example.

Then, as illustrated in step S27 of FIG. 5, a patterning process of patterning the first intermediate layer 24c1, the second intermediate layer 24dr1, and the third intermediate layer 24e1 collectively into each desired shape by sequentially performing an exposure process using a predetermined irradiation light and a development process using a predetermined developing solution on the first intermediate layer 24c1, the second intermediate layer 24dr1, and the third intermediate layer 24e1 is performed. That is, as illustrated in FIG. 6(d), a negative resist mask MN for forming the red light-emitting element Xr is placed above the third intermediate layer 24e1, and the third intermediate layer 24e1 side is irradiated with ultraviolet light (UV light) L of the i line, the g line, the h line, or the like from an opening provided in the negative resist mask MN. This completes the exposure process, and thus the portion irradiated with the ultraviolet light is insoluble due to a cross-linking reaction, a polymerization reaction, a condensation reaction, or the like. Subsequently, by rinsing with a developing solution such as an alkaline developing solution such as tetramethylammonium hydroxide (TMAH) or potassium hydroxide (KOH) or an organic solvent such as PGMEA, acetone, or ethanol, each portion of the first intermediate layer 24c1, the second intermediate layer 24dr1, and the third intermediate layer 24e1 irradiated with the ultraviolet light remains as a permanent film, and each portion not irradiated with the ultraviolet light flows down with the developing solution, as illustrated in FIG. 6(e).

Next, as illustrated in step S28 in FIG. 5, a formation process of curing the first intermediate layer 24c1, the second intermediate layer 24dr1, and the third intermediate layer 24e1 thus patterned, thereby forming, on the first charge transport layer (hole transport layer 24b), the light-emitting layer 24dr and the pair of holding layers 24c, 24e sandwiching the light-emitting layer 24dr is performed. In this formation process, the first intermediate layer 24c1, the second intermediate layer 24dr1, and the third intermediate layer 24e1 thus patterned are baked at, for example, about from 80 to 150° C., thereby forming the light-emitting layer 24dr of the light-emitting element Xr and the pair of holding layers (that is, first holding layer 24c and second holding layer 24e) sandwiching the light-emitting layer 24dr on the hole transport layer 24b, as illustrated in FIG. 6(f).

Then, the first solution dripping process, the first intermediate layer formation process, the second solution dripping process, the second intermediate layer formation process, the third solution dripping process, the third intermediate layer formation process, the patterning process, and the formation process are repeated sequentially. As a result, as illustrated in FIG. 6(g), the light-emitting layer 24dg and the pair of holding layers (that is, first holding layer 24c and second holding layer 24e) sandwiching the light-emitting layer 24dg of the green light-emitting element Xg are formed, and furthermore the light-emitting layer 24db and the pair of holding layers (that is, first holding layer 24c and second holding layer 24e) sandwiching the light-emitting layer 24db of the blue light-emitting element Xb are formed. As a result, in the present embodiment, the dripping technique and the photolithography method are combined to form a pixel pattern corresponding to the three colors RGB, and the separate-patterning of RGB is completed. Note that, even in a case in which the light-emitting elements Xr, Xg, and Xb are OLEDs, each of the pair of holding layers is similarly formed using a material similar to that when the light-emitting elements Xr, Xg, and Xb are QLEDs.

Next, as illustrated in FIG. 4 and FIG. 5, the electron transport layer (ETL) 24f serving as a second charge transport layer, for example, is formed by a dripping technique such as an ink-jet method or a spin-coating method (step S9). Specifically, in this ETL layer formation process, 2-propanol, ethanol, toluene, chlorobenzene, tetrahydrofuran, or 1,4 dioxane, for example, is used as a solvent included in a solution for electron transport layer formation. Further, as a solute, that is, electron transport material (functional material), included in the solution for electron transport layer formation, nanoparticles of zinc oxide (ZnO) or magnesium-doped zinc oxide (MgZnO) or structural particles (gel) by a sol-gel method are used, for example. Then, in this ETL layer formation process, the electron transport layer 24f having a film thickness of, for example, from 20 nm to 50 nm is formed by baking, at a predetermined temperature, the solution for electron transport layer formation that has been dripped onto the second holding layer 24e.

Subsequently, a thin metal film such as aluminum or silver is formed on the electron transport layer 24f as a second electrode (cathode electrode 25) using, for example, vapor deposition or a sputtering method (step S10). As a result, as illustrated in FIG. 6(h), the display device 2 including the light-emitting elements Xr, Xg, Xb of RGB is manufactured.

In the display device 2 of the present embodiment configured as described above, the function layer 24 includes the light-emitting layer 24d, and the first holding layer 24c and the second holding layer 24e (pair of holding layers) sandwiching the light-emitting layer 24d and each including a photosensitive material. Thus, in the display device 2 of the present embodiment, even when the light-emitting layer 24d is formed by using a dripping technique, the film thickness of the light-emitting layer 24d can be easily controlled, and the light-emitting layer 24d provided with an appropriate film thickness can be easily formed. That is, in the display device 2 of the present embodiment, as illustrated in FIG. 6, after the solution for light-emitting layer formation is dripped onto the entire surface of the first holding layer 24c, which is the underlayer, the second holding layer 24e is formed on the second intermediate layer of the light-emitting layer 24d, and subsequently the light-emitting layer 24d having a desired film thickness is easily patterned into a desired shape by photolithography. As a result, in the display device 2 of the present embodiment, unlike the known example described above, deterioration of the light emission performance of the display device 2 can be prevented. Furthermore, in the display device 2 of the present embodiment, by sandwiching the light-emitting layer 24d with the pair of holding layers (first holding layer 24c and second holding layer 24e), each including a photosensitive material, light-emitting materials of different luminescent colors can be formed with high definition in accordance with the position of the subpixel SP having the corresponding luminescent color.

Note that it is also conceivable to add a photosensitive material such as described above to the solution for light-emitting layer formation to form a light-emitting layer without forming the pair of holding layers. However, when such a comparative example is configured, a combination ratio of the photosensitive material and the light-emitting layer material (quantum dots, for example) has a trade-off relationship, and a light-emitting layer provided with the appropriate film thickness cannot be easily formed. That is, when an addition rate of the photosensitive material is increased, a luminous efficiency of the light-emitting layer decreases, deteriorating the light emission performance of the display device. On the other hand, when the addition rate of the light-emitting layer material is increased, the patterning performance in photolithography deteriorates, and thus a light-emitting layer having a desired shape and film thickness cannot be formed and, in turn, a display device cannot be formed.

In contrast, in the present embodiment, the light-emitting layer 24d is sandwiched between the first holding layer 24c and the second holding layer 24e, each including a photosensitive material, and thus the light-emitting layer 24d having a desired shape and film thickness can be easily formed, and the display device 2 having excellent light emission performance can be easily manufactured. Further, because the light-emitting layer 24d is thus sandwiched, the light-emitting layer 24d can be protected by the first holding layer 24c and the second holding layer 24e from oxygen and moisture, making it possible to easily configure the display device 2 having excellent reliability and a long service life.

Further, in the present embodiment, by changing each film thickness and each material of the first holding layer 24c and the second holding layer 24e, the carrier balance of electrons and holes can easily be optimized and, moreover, easily improve the luminous efficiency of the light-emitting layer 24d.

Further, in the present embodiment, the quantum dot light-emitting layer is interposed between the pair of holding layers described above, and thus a quantum dot color filter, for example, can be easily configured by forming this three-layer structure into a film.

Further, in the present embodiment, in a case in which a photosensitive material having an antioxidant effect, such as a phenolic resin, is used in the first holding layer 24c and the second holding layer 24e, oxidation in the light-emitting layer 24d can be further suppressed, and the display device 2 including the light-emitting element X having a long service life can be more easily configured.

In the present embodiment, the first conductive nanoparticles are uniformly dispersed in a first photosensitive resin in the first holding layer 24c. Further, the second conductive nanoparticles are uniformly dispersed in a second photosensitive resin in the second holding layer 24e. The photosensitive resin often has a resistivity of $1\times10^{13}$ Ωcm or more. For example, a polyimide resin-based photosensitive resin has a resistivity of $1\times10^{17}$ Ωcm or more. A phenol resin-based photosensitive resin has a resistivity of $1\times10^{16}$ Ωcm or more. An epoxy resin-based photosensitive resin has a resistivity of $1\times10^{16}$ Ωcm or more. An acrylic photosensitive resin has a resistivity of $1\times10^{13}$ Ωcm or more. On the other hand, a conductive nanoparticle-dispersed photosensitive resin in which conductive nanoparticles are uniformly dispersed in a photosensitive resin has a resistivity significantly less than $1\times10^{13}$ Ωcm. For example, a metal nanoparticle-dispersed photosensitive resin in which metal nanoparticles are uniformly dispersed in a photosensitive resin has a resistivity of about $2.0\times10^{-3}$ Ωcm. Thus, the resistivity of the first holding layer 24c is significantly low because the first photosensitive resin is uniformly dispersed in the first photosensitive resin. Further, the resistivity of the second holding layer 24e is significantly low because the second photosensitive resin is uniformly dispersed in the second photosensitive resin.

The resistivity of the conductive nanoparticle-dispersed photosensitive resin, which is significantly low as described above, is significantly less than the resistivity of the material constituting the light-emitting layer 24d. For example, the resistivity of the metal nanoparticle-dispersed photosensitive resin is significantly less than $1\times10^{5}$ Ωcm that is the resistivity of tris (8-hydroxyquinolinato) aluminum constituting the EL layer, $3.25\times10^{5}$ Ωcm that is the resistivity of CdSe constituting the quantum dot layer, and $3\times10^{-2}$ to $2\times10^{-1}$ Ωcm that is the resistivity of InP constituting the quantum dot layer. Thus, the resistivity of each of the first holding layer 24c and the second holding layer 24e is less than the resistivity of the light-emitting layer 24d. In this way, even when the light-emitting elements Xr, Xg, and Xb emit light for a long time, the first photosensitive material and the second photosensitive material can be suppressed from being charged up. As a result, a voltage to be applied to the light-emitting elements Xr, Xg, and Xb in order to cause the same current to flow can be suppressed from increasing.

The resistivity of the conductive nanoparticle-dispersed photosensitive resin, which is significantly low as described above, is significantly less than the resistivity of the material constituting the hole injection layer 24a, the hole transport layer 24b, and the electron transport layer 24f. For example, the resistivity of the metal nanoparticle-dispersed photosensitive resin is less than $7\times10^{3}$ Ωcm that is the resistivity of PEDOT:PSS constituting the hole injection layer 24a, $1.1\times10^{4}$ Ωcm that is the resistivity of spiro-OMeTAD constituting the hole transport layer 24b, $1.1\times10^{4}$ Ωcm that is the resistivity of PVK constituting the hole transport layer 24b, and $1\times10^{3}$ to $1\times10^{7}$ Ωcm that is the resistivity of ZnO constituting the electron transport layer 24f. Thus, the resistivity of each of the first holding layer 24c and the second holding layer 24e is less than the resistivity of the hole injection layer 24a, the hole transport layer 24b, and the electron transport layer 24f.

In the present embodiment, the first photosensitive material and the second photosensitive material may be the same type of photosensitive material. In other words, the same type of photosensitive material may be used in the first holding layer 24c and the second holding layer 24e. Further, the first conductive nanoparticles and the second conductive nanoparticles may be the same type of conductive nanoparticle. In other words, the same type of conductive nanoparticle may be used in the first holding layer 24c and the second holding layer 24e.

Second Embodiment

Figure 7:
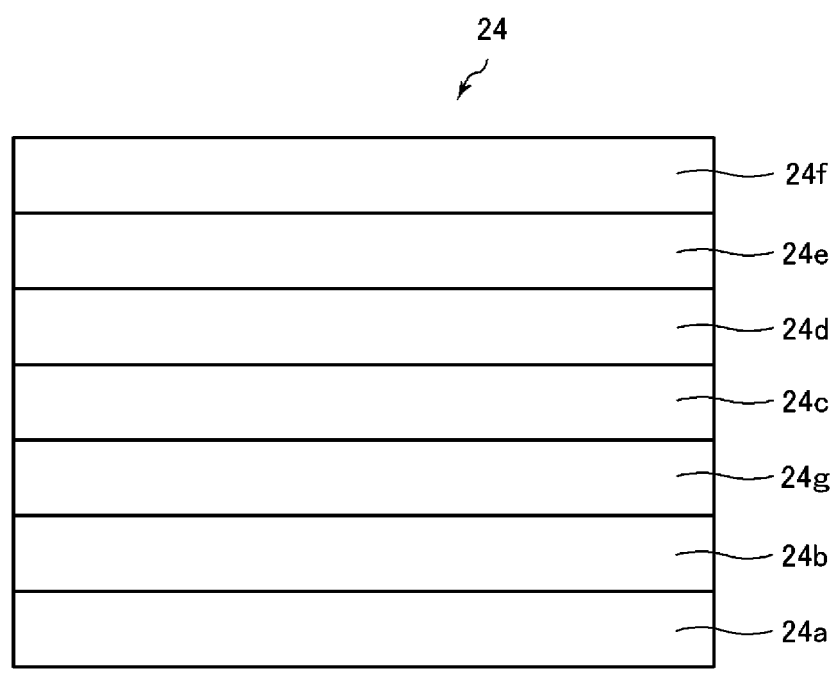
FIG. 7 is a cross-sectional view illustrating a specific configuration of a function layer of a display device according to a second embodiment of the disclosure.

FIG. 7 is a cross-sectional view illustrating a specific configuration of a function layer of a display device according to a second embodiment of the disclosure. In the drawing, a main difference between the present embodiment and the first embodiment described above is that a first mixing holding layer is provided between the one holding layer and the hole transport layer formed of a photosensitive material and conductive nanoparticles. Note that elements common to those in the first embodiment are denoted by the same reference signs, and duplicate description thereof will be omitted.

In the display device 2 of the present embodiment, as illustrated in FIG. 7, the function layer 24 includes the hole injection layer 24a, the hole transport layer 24b, a first underlayer 24g, the first holding layer 24c, the light-emitting layer 24d, the second holding layer 24e, and the electron transport layer 24f.

The first underlayer 24g is provided between the hole transport layer 24b and the first holding layer (one holding layer) 24c, and functions as a first mixing prevention layer that prevents each functional material of the hole transport layer 24b and the first holding layer 24c from mixing together. That is, the first underlayer 24g prevents the mixing of the hole transport material in the hole transport layer 24b and the photosensitive material in the first holding layer 24c and thus the occurrence of a mixed layer. In particular, when the hole transport material and the photosensitive material are both organic materials, for example, the mixed layer described above can readily occur, but with the first underlayer 24g being interposed, the occurrence of such a mixed layer can be reliably prevented.

Figure 8:
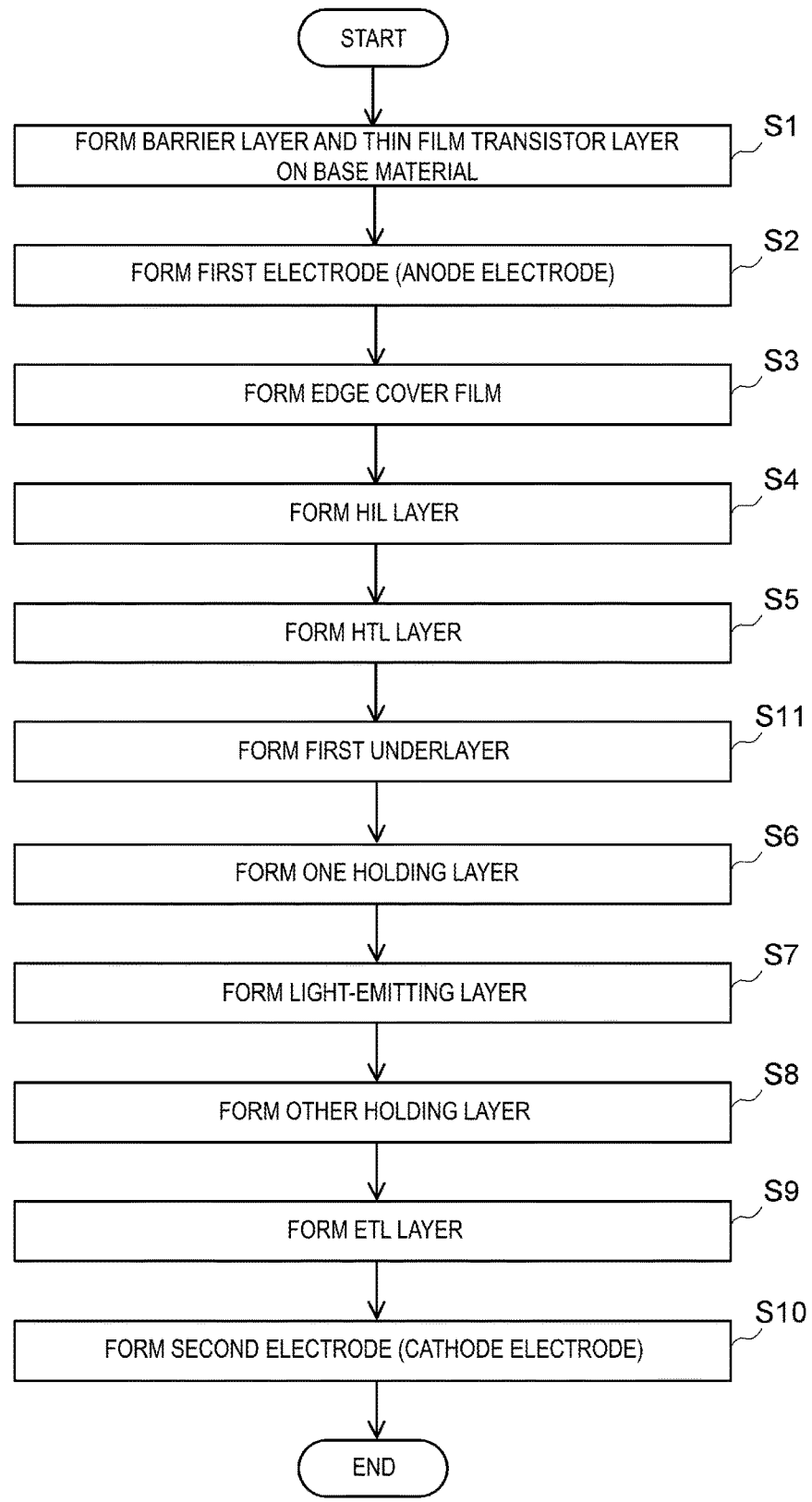
FIG. 8 is a flowchart illustrating a method for manufacturing the display device illustrated in FIG. 7.

Next, a method for manufacturing the display device 2 of the present embodiment will be specifically described with reference to FIG. 8 as well. FIG. 8 is a flowchart illustrating the method for manufacturing the display device illustrated in FIG. 7.

As illustrated in step S11 in FIG. 8, in the present embodiment, after the hole transport layer formation process, a first underlayer formation process of forming the first underlayer 24g on the hole transport layer 24b is performed by a dripping technique such as, for example, an ink-jet method. Specifically, in the first underlayer formation process, a solute of the solution for first underlayer formation, that is, an underlayer material (functional material), is selected from the group consisting of hexamenyldisilazane (HMDS), siloxane compounds including a photopolymerizable group, polysilane, and OTPD, for example. Further, as solvents, a low-polarity solvent such as hexane or ether or a high-polarity solvent such as pyridine or dimethylformaldehyde (DMF) is used as the solvent of hexamenyldisilazane (HMDS), a high-polarity solvent such as PGMEA is used as the siloxane compound or polysilane, and a low-polarity solvent such as toluene is used as OTPD. Then, in this first underlayer formation process, the first underlayer 24g having a film thickness of, for example, from several nm to several 10 nm is formed by baking, at a predetermined temperature, the solution for first underlayer formation that has been dripped onto the hole transport layer 24b.

Note that, when a siloxane compound including a photopolymerizable group, polysilane, or OTPD is used as the underlayer material of the first underlayer 24g, for example, the first underlayer 24g and the first holding layer 24c can be integrally configured. Further, when OTPD, for example, is used as the underlayer material for the first underlayer 24g, the first underlayer 24g, the first holding layer 24c, and the hole transport layer 24b can be integrally configured.

With the above configuration, the present embodiment can achieve actions and effects similar to those of the first embodiment. Further, in the present embodiment, the first underlayer (first mixing prevention layer) 24g is provided, making it possible to prevent the occurrence of a mixed layer of the hole transport material in the hole transport layer 24b and the photosensitive material in the first holding layer 24c, and prevent deterioration of the patterning performance with respect to the first holding layer 24c. As a result, in the present embodiment, the light-emitting layer 24d having a desired shape and film thickness can be easily formed, and the display device 2 having excellent light emission performance can be easily manufactured.

Third Embodiment

Figure 9:
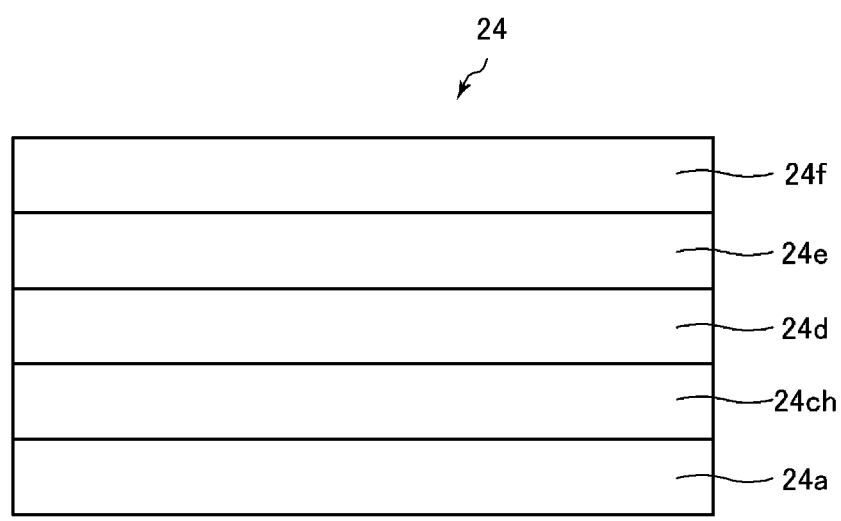
FIG. 9 is a cross-sectional view illustrating a specific configuration of a function layer of a display device according to a third embodiment of the disclosure.

FIG. 9 is a cross-sectional view illustrating a specific configuration of a function layer of a display device according to a third embodiment of the disclosure. In the drawing, a main difference between the present embodiment and the first embodiment described above is integration of the one holding layer and the hole transport layer. Note that elements common to those in the first embodiment are denoted by the same reference signs, and duplicate description thereof will be omitted.

In the display device 2 of the present embodiment, as illustrated in FIG. 9, the function layer 24 includes the hole injection layer 24a, a first holding layer 24ch, the light-emitting layer 24d, the second holding layer 24e, and the electron transport layer 24f. The first holding layer 24ch has a function of the hole transport layer, and constitutes the one holding layer that also serves as the hole transport layer.

Figure 10:
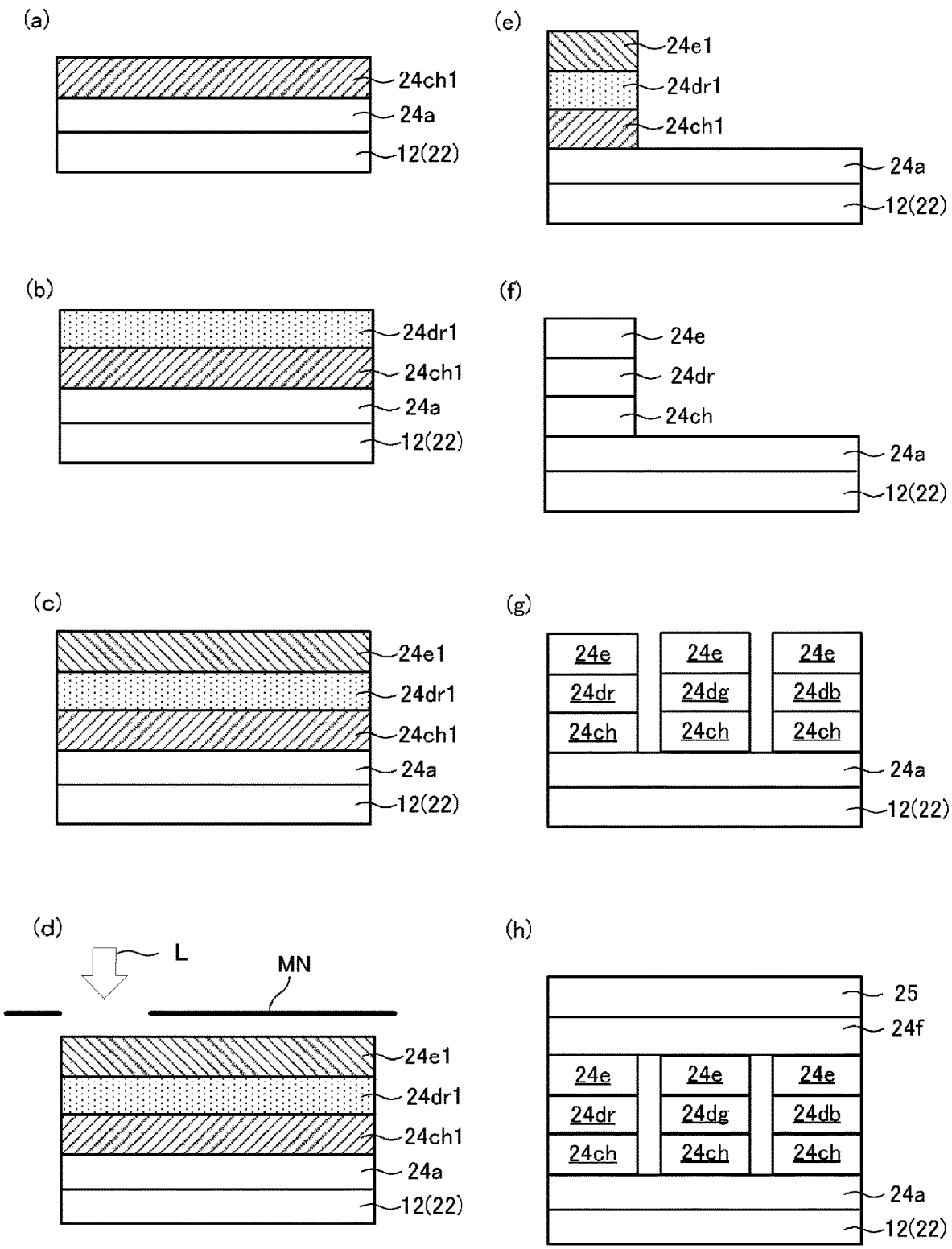
FIG. 10 is a diagram explaining a specific manufacturing process of a configuration of main portions of the display device illustrated in FIG. 9.

Next, a method for manufacturing the display device 2 of the present embodiment will be specifically described with reference to FIG. 10 as well. FIG. 10 is a diagram explaining a specific manufacturing process of a configuration of the main portions of the display device illustrated in FIG. 9. Note that, in FIG. 10, for the sake of simplicity in the drawings, illustration of the first electrode 22 and the edge cover film 23 for each subpixel SP is omitted.

As illustrated in FIG. 10(a), in the present embodiment, a first intermediate layer 24ch1 of the first holding layer (one holding layer) 24ch is formed on the hole injection layer 24a. This first intermediate layer 24ch1 is formed at a film thickness of about several nm to several 10 nm, for example. Specifically, after the HIL layer formation process (step S4) is performed, a solution dripping process of dripping a solution for first intermediate layer formation including a functional material having a photosensitive function and a hole transport function onto the hole injection layer 24a is performed.

For example, OTPD is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for first intermediate layer formation in which these functional materials serve as the solute, the same solvent as in the first solution described above can be used, and the same photoinitiator and/or additive as in the first solution may be included.

Then, following the solution dripping process described above, the solution for first intermediate layer formation on the hole injection layer 24a is, for example, baked at a low temperature of about from 50 to 120° C. or vacuum dried, thereby evaporating the solvent of the solution for first intermediate layer formation to form the first intermediate layer 24ch1 on the hole injection layer 24a.

Subsequently, as illustrated in FIG. 10(b) to FIG. 10(h), the second intermediate layer 24dr1 of the light-emitting layer 24dr and the third intermediate layer 24e1 of the second holding layer (other holding layer, formed of a photosensitive material and conductive nanoparticles) 24e are sequentially layered as in the first embodiment, and subsequently the patterning process and the formation process are performed, thereby forming the light-emitting layer 24dr and the pair of holding layers 24ch and 24e sandwiching the light-emitting layer 24dr in the light-emitting element Xr. Next, a similar process is performed for the light-emitting element Xg and the light-emitting element Xb, thereby providing the light-emitting layer 24dg and the pair of holding layers 24ch and 24e sandwiching the light-emitting layer 24dg in the light-emitting element Xg, and the light-emitting layer 24db and the pair of holding layers 24ch and 24e sandwiching the light-emitting layer 24db in the light-emitting element Xb, and subsequently providing the electron transport layer 24f and the second electrode (cathode electrode) 25.

With the above configuration, the present embodiment can achieve actions and effects similar to those of the first embodiment. Further, in the present embodiment, the first holding layer 24ch, which also serves as the hole transport layer, is provided, thereby simplifying the manufacturing process while reducing the number of components of the display device 2.

Fourth Embodiment

Figure 11:
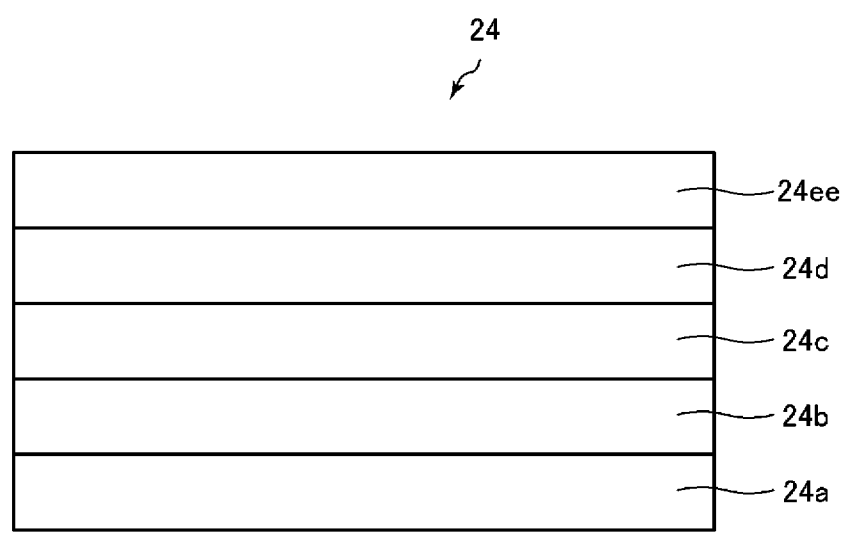
FIG. 11 is a cross-sectional view illustrating a specific configuration of a function layer of a display device according to a fourth embodiment of the disclosure.

FIG. 11 is a cross-sectional view illustrating a specific configuration of a function layer of a display device according to a fourth embodiment of the disclosure. In the drawing, a main difference between the present embodiment and the first embodiment described above is integration of the other holding layer and the electron transport layer. Note that elements common to those in the first embodiment are denoted by the same reference signs, and duplicate description thereof will be omitted.

In the display device 2 of the present embodiment, as illustrated in FIG. 11, the function layer 24 includes the hole injection layer 24*a*, the hole transport layer 24*b*, the first holding layer 24*c* formed of a photosensitive material and conductive nanoparticles, the light-emitting layer 24*d*, and a second holding layer 24*ee*. The second holding layer 24*ee* has a function of the electron transport layer, and constitutes the other holding layer that also serves as the electron transport layer.

Figure 12:
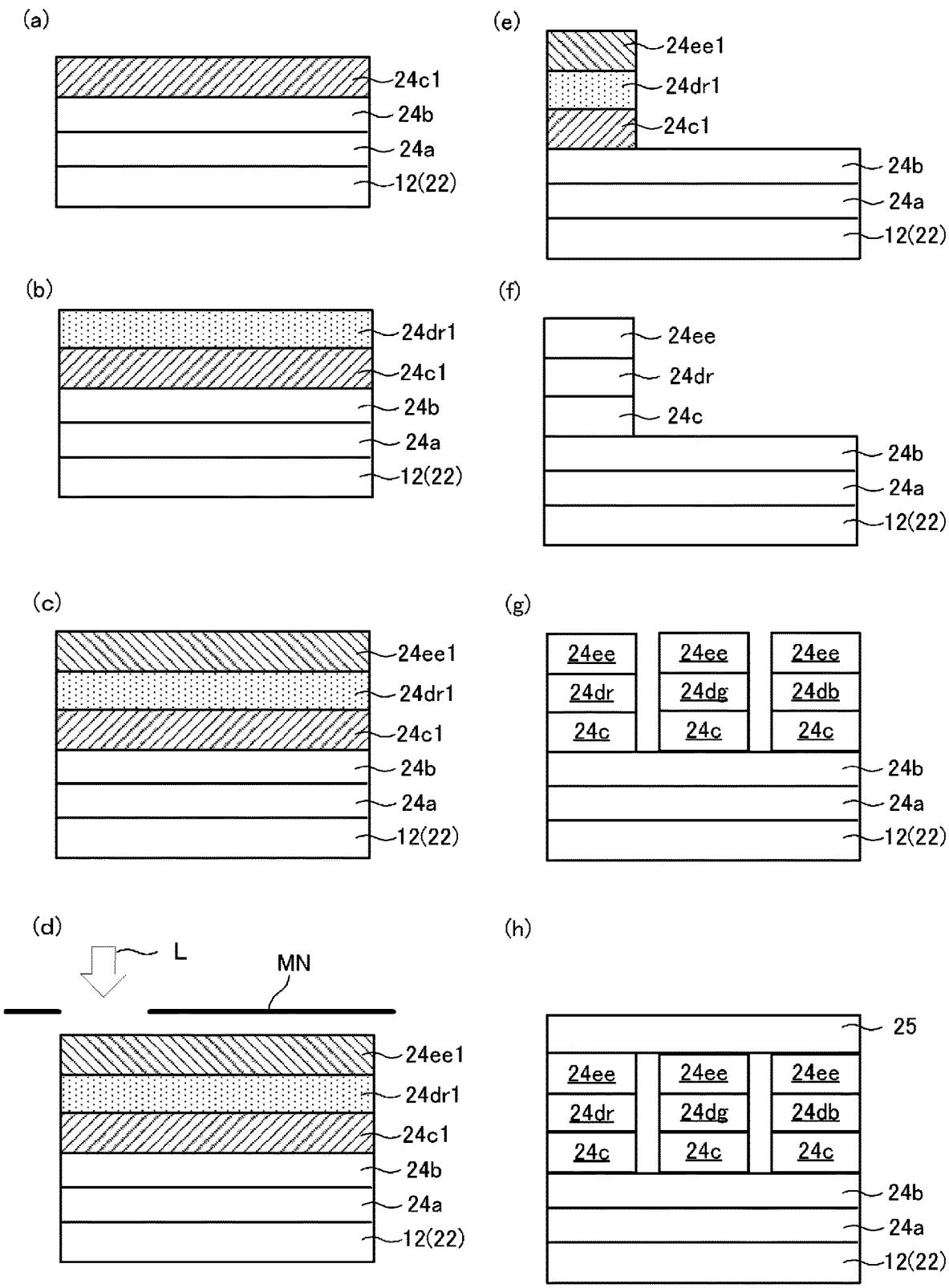
FIG. 12 is a diagram explaining a specific manufacturing process of a configuration of main portions of the display device illustrated in FIG. 11.

Next, a method for manufacturing the display device 2 of the present embodiment will be specifically described with reference to FIG. 12 as well. FIG. 12 is a diagram explaining a specific manufacturing process of a configuration of the main portions of the display device illustrated in FIG. 11. Note that, in FIG. 12, for the sake of simplicity in the drawings, illustration of the first electrode 22 and the edge cover film 23 for each subpixel SP is omitted.

As illustrated in FIG. 12(*c*), in the present embodiment, a third intermediate layer 24*ee*1 of the second holding layer (other holding layer) 24*ee* is formed on the second intermediate layer 24*dr*1 of the light-emitting layer 24*dr*. This third intermediate layer 24*ee*1 is formed at a film thickness of about from several nm to several 10 nm, for example. Specifically, after the second intermediate layer formation process (step S24) is performed, a solution dripping process of dripping a solution for third intermediate layer formation including a functional material having a photosensitive function and an electron transport function onto the second intermediate layer 24*dr*1 is performed. Note that FIG. 12(*a*) and FIG. 12(*b*) are the same processes as those in FIG. 6(*a*) and FIG. 6(*b*) in the first embodiment, respectively.

As the functional material having a photosensitive function and an electron transport function, a combined material obtained by combining the second photosensitive material described above and an electron transport material such as nanoparticles of zinc oxide (ZnO) or magnesium-doped zinc oxide (MgZnO) or structural particles by a sol-gel method is used, for example. Further, in the solution for third intermediate layer formation in which these functional materials are the solute, the same solvent as in the third solution described above can be used, and the same photoinitiator and/or additive as in the third solution may be included.

Then, following the solution dripping process described above, the solution for third intermediate layer formation on the second intermediate layer 24*dr*1 is, for example, baked at a low temperature of about from 50 to 80° C. or vacuum dried, thereby evaporating the solvent of the solution for third intermediate layer formation to form the third intermediate layer 24*ee*1 on the second intermediate layer 24*dr*1.

Subsequently, as illustrated in FIG. 12(*d*) to FIG. 12(*h*), the patterning process and the formation process are performed as in the case of the first embodiment, thereby forming the light-emitting layer 24*dr* and the pair of holding layers 24*c* and 24*ee* sandwiching the light-emitting layer 24*dr* in the light-emitting element Xr. Next, a similar process is performed for the light-emitting element Xg and the light-emitting element Xb, thereby providing the light-emitting layer 24*dg* and the pair of holding layers 24*c* and 24*ee* sandwiching the light-emitting layer 24*dg* in the light-emitting element Xg, and the light-emitting layer 24*db* and the pair of holding layers 24*c* and 24*ee* sandwiching the light-emitting layer 24*db* in the light-emitting element Xb, and subsequently providing the second electrode (cathode electrode) 25.

With the above configuration, the present embodiment can achieve actions and effects similar to those of the first embodiment. Further, in the present embodiment, the second holding layer 24*ee*, which also serves as the electron transport layer, is provided, thereby simplifying the manufacturing process while reducing the number of components of the display device 2.

Fifth Embodiment

Figure 13:
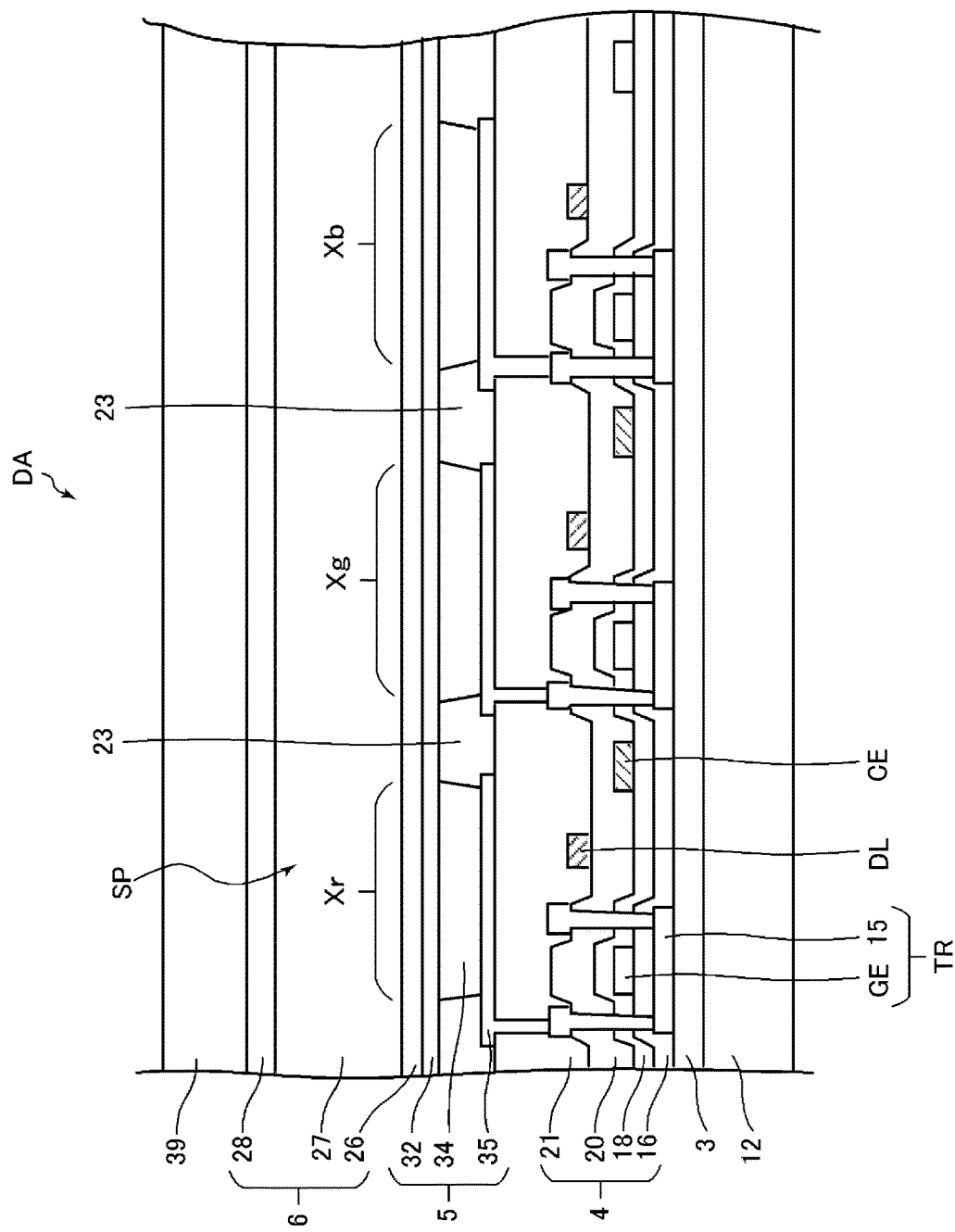
FIG. 13 is a cross-sectional view illustrating a configuration of main portions of a display device according to a fifth embodiment of the disclosure.
Figure 14:
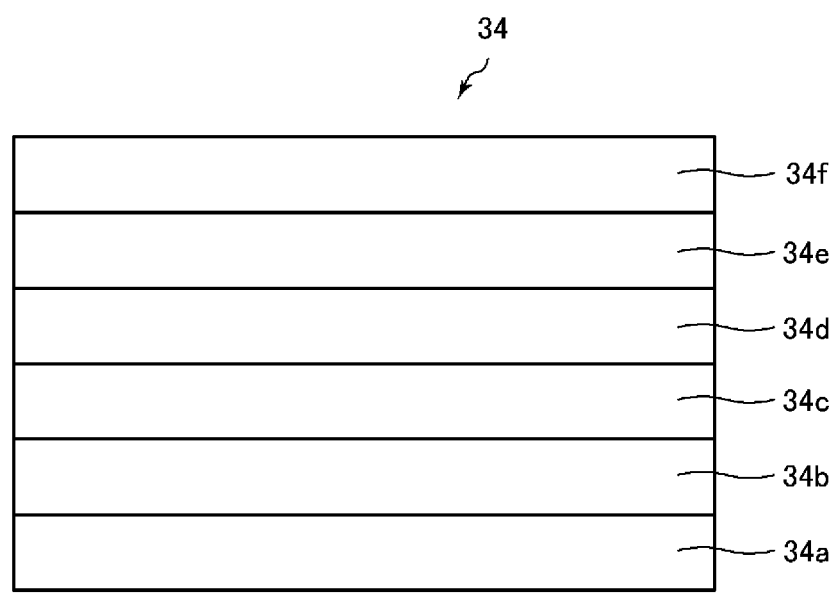
FIG. 14 is a cross-sectional view illustrating a specific configuration of a function layer illustrated in FIG. 13.

FIG. 13 is a cross-sectional view illustrating a configuration of main portions of a display device according to a fifth embodiment of the disclosure. FIG. 14 is a cross-sectional view illustrating a specific configuration of a function layer illustrated in FIG. 13. In the drawings, a main difference between the present embodiment and the first embodiment described above is that the structure is inverted with a first electrode 35 serving as the cathode electrode, a function layer 34, and a second electrode 32 serving as the anode electrode provided in this order from the thin film transistor layer 4 side. Note that elements common to those in the first embodiment are denoted by the same reference signs, and duplicate description thereof will be omitted. Furthermore, each layer constituting the function layer 34 is mainly described in terms of differences from the corresponding layer of the same name in the function layer 24, and duplicate description of common elements will be omitted.

In the display device 2 of the present embodiment, as illustrated in FIG. 13, a first electrode (cathode electrode) 35, a function layer 34, and a second electrode (anode electrode) 32 are sequentially provided on the thin film transistor layer 4 in the light-emitting elements Xr, Xg, and Xb. Further, the function layer 34, as illustrated in FIG. 14, is formed by layering an electron transport layer 34*a*, a first holding layer 34*b*, a light-emitting layer 34*c*, a second holding layer 34*d*, a hole transport layer 34*e*, and a hole injection layer 34*f* in this order from the lower layer side. Further, the first holding layer 34*b* and the second holding layer 34*d* constitute a pair of holding layers sandwiching the light-emitting layer 34*c*, and respectively constitute the other holding layer and the one holding layer.

Figure 15:
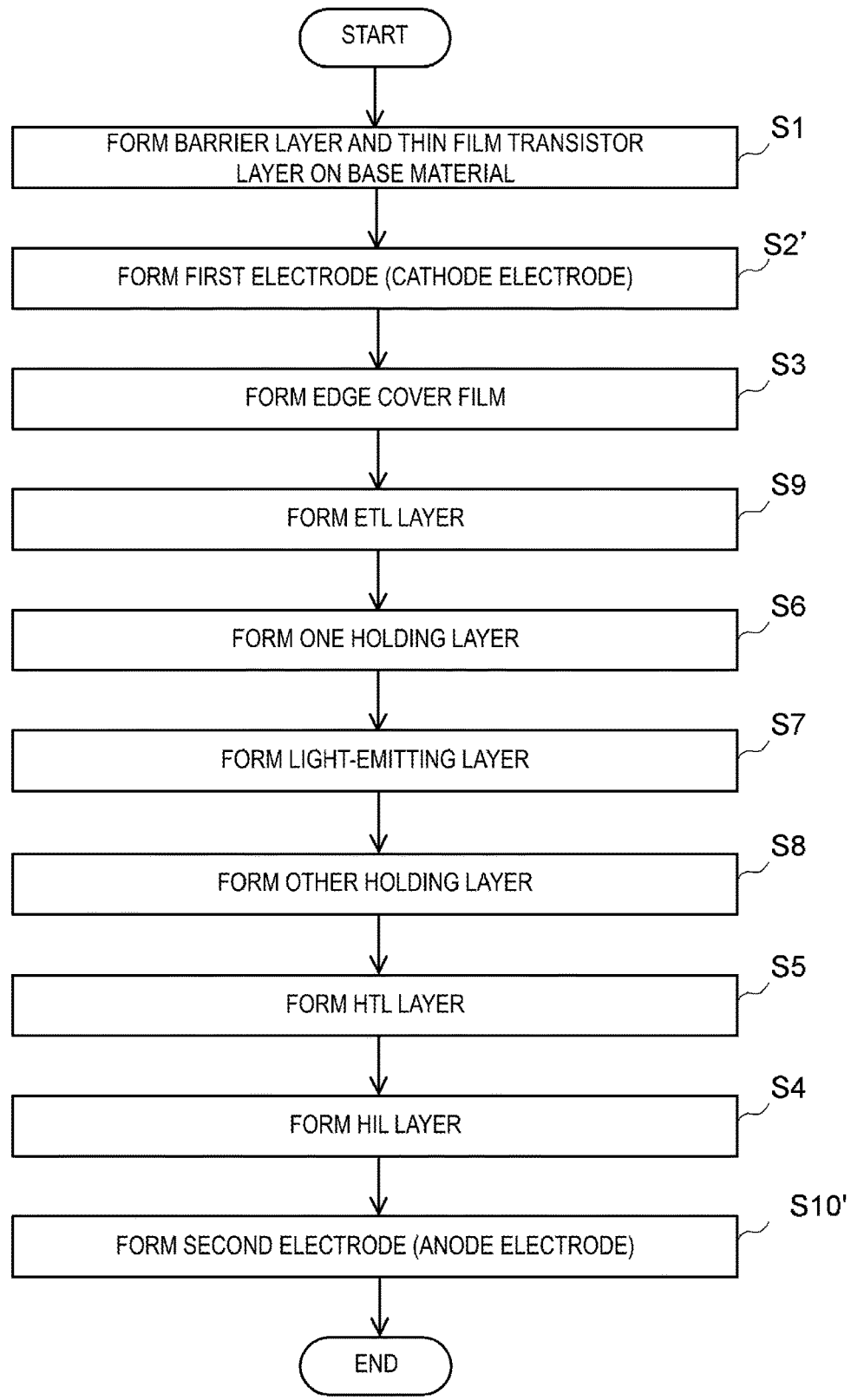
FIG. 15 is a flowchart illustrating a method for manufacturing the display device illustrated in FIG. 13.
Figure 16:
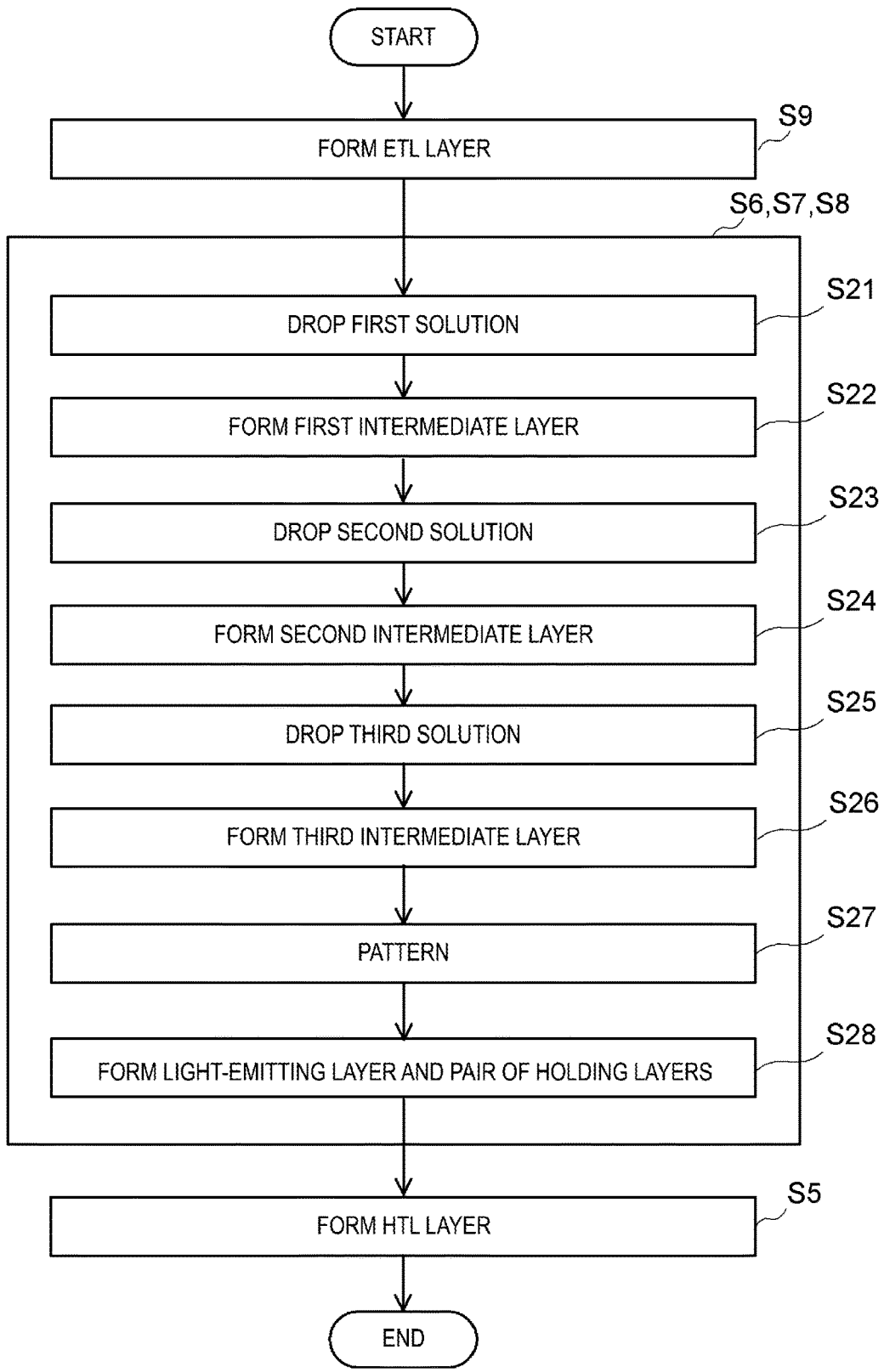
FIG. 16 is a flowchart illustrating a specific method for manufacturing a configuration of the main portions of the display device illustrated in FIG. 13.
Figure 17:
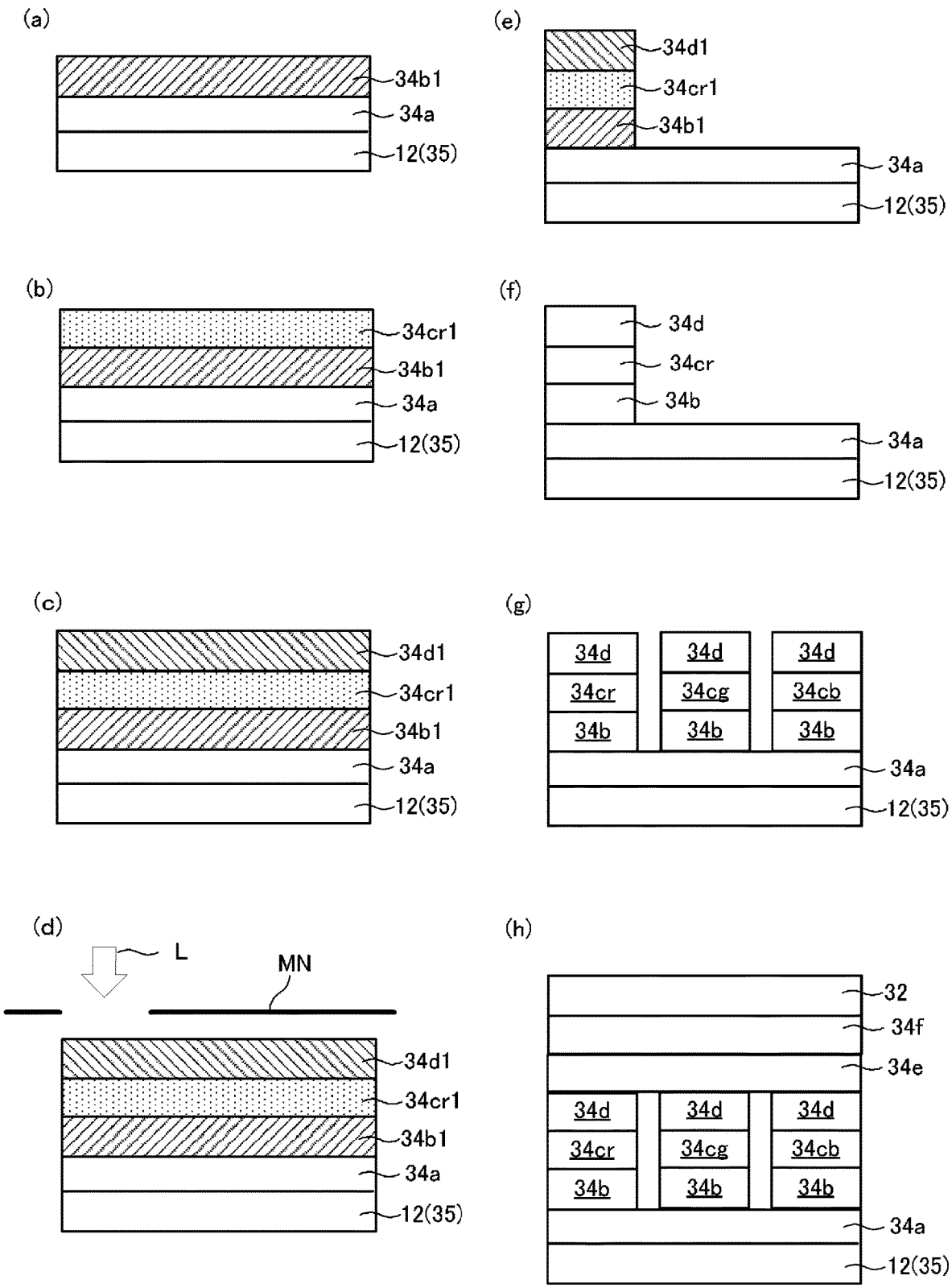
FIG. 17 is a diagram explaining a specific manufacturing process of a configuration of the main portions of the display device illustrated in FIG. 13.

Next, a method for manufacturing the display device 2 of the present embodiment will be specifically described with reference to FIGS. 15 to 17 as well. FIG. 15 is a flowchart illustrating a method for manufacturing the display device illustrated in FIG. 13. FIG. 16 is a flowchart illustrating a specific method for manufacturing a configuration of the main portions of the display device illustrated in FIG. 13. FIG. 17 is a diagram explaining a specific manufacturing process of a configuration of the main portions of the display device illustrated in FIG. 13. Note that, in FIG. 17, for the sake of simplicity in the drawings, illustration of the first electrode 35 and the edge cover film 23 for each subpixel SP is omitted.

As illustrated in FIG. 15, in the method for manufacturing the display device 2 of the present embodiment, after formation of the barrier layer 3 and the thin film transistor layer 4 on the base material 12 in step S1, the first electrode (cathode electrode) 35 is formed on the flattening film 21 using vapor deposition or a sputtering method and a photolithography method (step S2'). Then, after the edge cover film 23 in step S3 is formed, the electron transport layer (ETL) 34*a* serving as the first charge transport layer is formed (step S9).

Next, the first holding layer (other holding layer) 34*b* is formed (step S6), the light-emitting layer 34*c* composed of the quantum dot light-emitting layer is formed (step S7), and the second holding layer (one holding layer) 34*d* is formed (step S8). As in the first embodiment, the other holding layer formation process, the light-emitting layer formation process, and the one holding layer formation process are performed continuously until each intermediate layer is formed, and subsequently the process of forming the light-emitting layer 34*c* and the pair of holding layers 34*b* and 34*d* sandwiching the light-emitting layer 34*c* is performed for each of the light-emitting elements Xr, Xg, Xb.

Specifically, as illustrated in step S21 in FIG. 16, after the ETL layer formation process (first charge transport layer formation process) is performed, a first solution dripping process in which a first solution including a first photosensitive material and first conductive nanoparticles is dripped onto the first charge transport layer described above is performed. Then, as illustrated in step S22 in FIG. 16, a first intermediate layer formation process of drying the solvent in the first solution that has been dripped and thus forming the first intermediate layer of the other holding layer on the first charge transport layer is performed. Specifically, in this first intermediate layer formation process, the first solution on the electron transport layer 34*a* is baked at a low temperature of about from 50 to 130° C. or vacuum dried, for example, and the solvent of the first solution is evaporated. Then, as illustrated in FIG. 17(*a*), a first intermediate layer 34*b*1 of the first holding layer (other holding layer) 34*b* is formed on the electron transport layer 34*a*. This first intermediate layer 34*b*1 is formed at a film thickness of about from several nm to several 10 nm, for example.

Then, as illustrated in step S23 in FIG. 16, a second solution dripping process of dripping a second solution including predetermined quantum dots to be included in a red light-emitting layer 34*cr* onto the first intermediate layer 34*b*1 is performed. Then, as illustrated in step S24 in FIG. 16, a second intermediate layer formation process of drying the solvent in the second solution that has been dripped and thus forming the second intermediate layer of the light-emitting layer 34*cr* on the first intermediate layer 34*b*1 is performed. Specifically, in this second intermediate layer formation process, the second solution on the first intermediate layer 34*b*1 is baked at a low temperature of about from 50 to 130° C. or vacuum dried, for example, and the solvent of the second solution is evaporated. Then, as illustrated in FIG. 17(*b*), a second intermediate layer 34*cr*1 of the light-emitting layer 34*cr* is formed on the first intermediate layer 34*b*1. This second intermediate layer 34*cr*1 is formed at a film thickness of about from 10 nm to 40 nm, for example.

Next, as illustrated in step S25 in FIG. 16, a third solution dripping process of dripping a third solution including a second photosensitive material and second conductive nanoparticles onto the second intermediate layer 34*cr*1 is performed. Then, as illustrated in step S26 in FIG. 16, a third intermediate layer formation process of drying the solvent in the third solution that has been dripped and thus forming a third intermediate layer of the one holding layer on the second intermediate layer 34*cr*1 is performed. Specifically, in this third intermediate layer formation process, the third solution on the second intermediate layer 34*cr*1 is baked at a low temperature of about from 50 to 130° C. or vacuum dried, for example, and the solvent of the third solution is evaporated. Then, as illustrated in FIG. 17(*c*), a third intermediate layer 34*d*1 of the second holding layer (one holding layer) 34*d* is formed on the second intermediate layer 34*cr*1. This third intermediate layer 34*d*1 is formed at a film thickness of about from several nm to several 10 nm, for example.

Then, as illustrated in step S27 in FIG. 16, a patterning process of patterning the first intermediate layer 34*b*1, the second intermediate layer 34*cr*1, and the third intermediate layer 34*d*1 collectively into each desired shape by sequentially performing an exposure process using a predetermined irradiation light and a development process using a predetermined developing solution on the first intermediate layer 34*b*1, the second intermediate layer 34*cr*1, and the third intermediate layer 34*d*1 is performed. That is, as illustrated in FIG. 17(*d*), the negative resist mask MN for forming the red light-emitting element Xr is placed above the third intermediate layer 34*d*1, and the third intermediate layer 34*d*1 side is irradiated with the ultraviolet light (UV light) L of the i line, the g line, the h line, or the like from an opening provided in the negative resist mask MN. This completes the exposure process, and thus the portion irradiated with the ultraviolet light is insoluble due to a cross-linking reaction, a polymerization reaction, a condensation reaction, or the like. Subsequently, by rinsing with an alkaline developing solution such as TMAH or KOH or a developing solution such as an organic solvent such as PGMEA or ethanol, each portion of the first intermediate layer 34*b*1, the second intermediate layer 34*cr*1, and the third intermediate layer 34*d*1 irradiated with the ultraviolet light remains as a permanent film, and each portion not irradiated with the ultraviolet light flows down with the developing solution, as illustrated in FIG. 17(*e*).

Next, as illustrated in step S28 in FIG. 16, a formation process of curing the first intermediate layer 34*b*1, the second intermediate layer 34*cr*1, and the third intermediate layer 34*d*1 thus patterned, thereby forming, on the first charge transport layer (electron transport layer 34*a*), the light-emitting layer 34*cr* and the pair of holding layers 34*b*, 34*d* sandwiching the light-emitting layer 34*cr* is performed. In this formation process, the first intermediate layer 34*b*1, the second intermediate layer 34*cr*1, and the third intermediate layer 34*d*1 thus patterned are baked at, for example, about from 100 to 140° C., thereby forming the light-emitting layer 34*cr* and the pair of holding layers (that is, first holding layer 34*b* and second holding layer 34*d*) sandwiching the light-emitting layer 34*cr* in the light-emitting element Xr on the electron transport layer 34*a*, as illustrated in FIG. 17(*f*).

Then, the first solution dripping process, the first intermediate layer formation process, the second solution dripping process, the second intermediate layer formation process, the third solution dripping process, the third intermediate layer formation process, the patterning process, and the formation process are repeated sequentially. As a result, as illustrated in FIG. 17(*g*), a light-emitting layer 34*cg* and the pair of holding layers (that is, first holding layer 34*b* and second holding layer 34*d*) sandwiching the light-emitting layer 34*cg* of the green light-emitting element Xg are formed, and furthermore a light-emitting layer 34*cb* and the pair of holding layers (that is, first holding layer 34*b* and second holding layer 34*d*) sandwiching the light-emitting layer 34*cb* of the blue light-emitting element Xb are formed. As a result, in the present embodiment, the dripping technique and the photolithography method are combined to form a pixel pattern corresponding to the three colors RGB, and the separate-patterning of RGB is completed.

Next, as illustrated in FIG. 15 and FIG. 16, the hole transport layer (HTL) 34*e* serving as the second charge transport layer, for example, is formed by a dripping technique such as an ink-jet method or a spin-coating method (step S5). Then, the hole injection layer (HIL) 34*f* is formed on this hole transport layer 34*e* (step S4). Subsequently, the second electrode (anode electrode) 32 is formed on the hole injection layer 34f using, for example, a sputtering method and a photolithography method (step S10'). As a result, as illustrated in FIG. 17(h), the display device 2 including the light-emitting elements Xr, Xg, and Xb of RGB is manufactured.

With the above configuration, the present embodiment can achieve actions and effects similar to those of the first embodiment.

Sixth Embodiment

Figure 18:
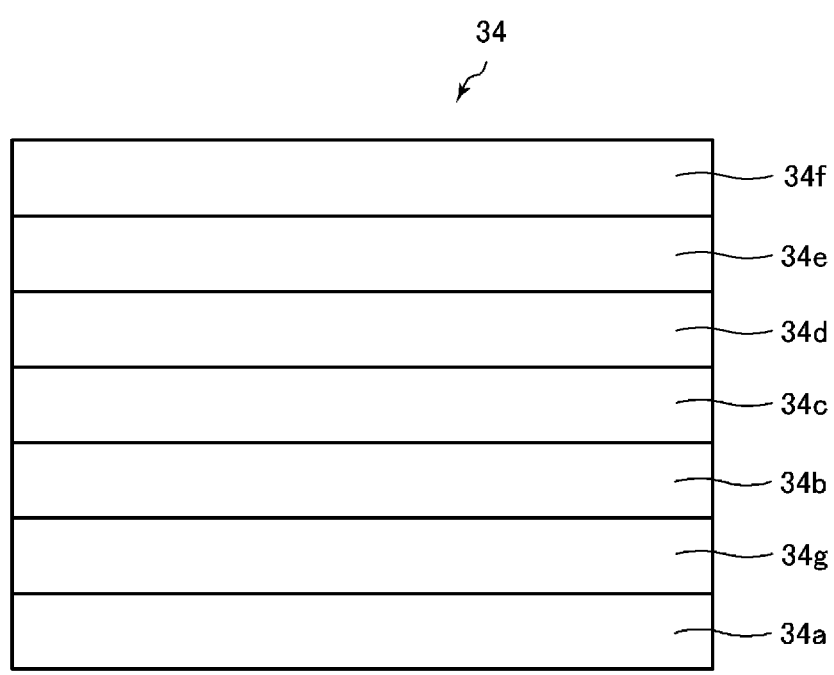
FIG. 18 is a cross-sectional view illustrating a specific configuration of a function layer of a display device according to a sixteenth embodiment of the disclosure.

FIG. 18 is a cross-sectional view illustrating a specific configuration of a function layer of a display device according to a sixteenth embodiment of the disclosure. In the drawing, a main difference between the present embodiment and the fifth embodiment described above is that a second mixing holding layer is provided between the other holding layer and the electron transport layer. Note that elements common to those in the fifth embodiment are denoted by the same reference signs, and duplicate description thereof will be omitted.

In the display device 2 of the present embodiment, as illustrated in FIG. 18, the function layer 34 includes the electron transport layer 34a, a second underlayer 34 g, the first holding layer 34b, the light-emitting layer 34c, the second holding layer 34d formed of a photosensitive material and conductive nanoparticles, the hole transport layer 34e, and the hole injection layer 34f.

The second underlayer 34g is provided between the electron transport layer 34a and the first holding layer (one holding layer) 34b, and functions as a second mixing prevention layer that prevents each functional material of the electron transport layer 34a and the first holding layer 34b from mixing together. That is, the second underlayer 34g prevents the mixing of the electron transport material in the electron transport layer 34a and the photosensitive material in the first holding layer 34b and thus the occurrence of a mixed layer. In particular, when the electron transport material and the photosensitive material are both organic materials, for example, the mixed layer described above can readily occur, but with the second underlayer 34g being interposed, the occurrence of such a mixed layer can be reliably prevented.

Figure 19:
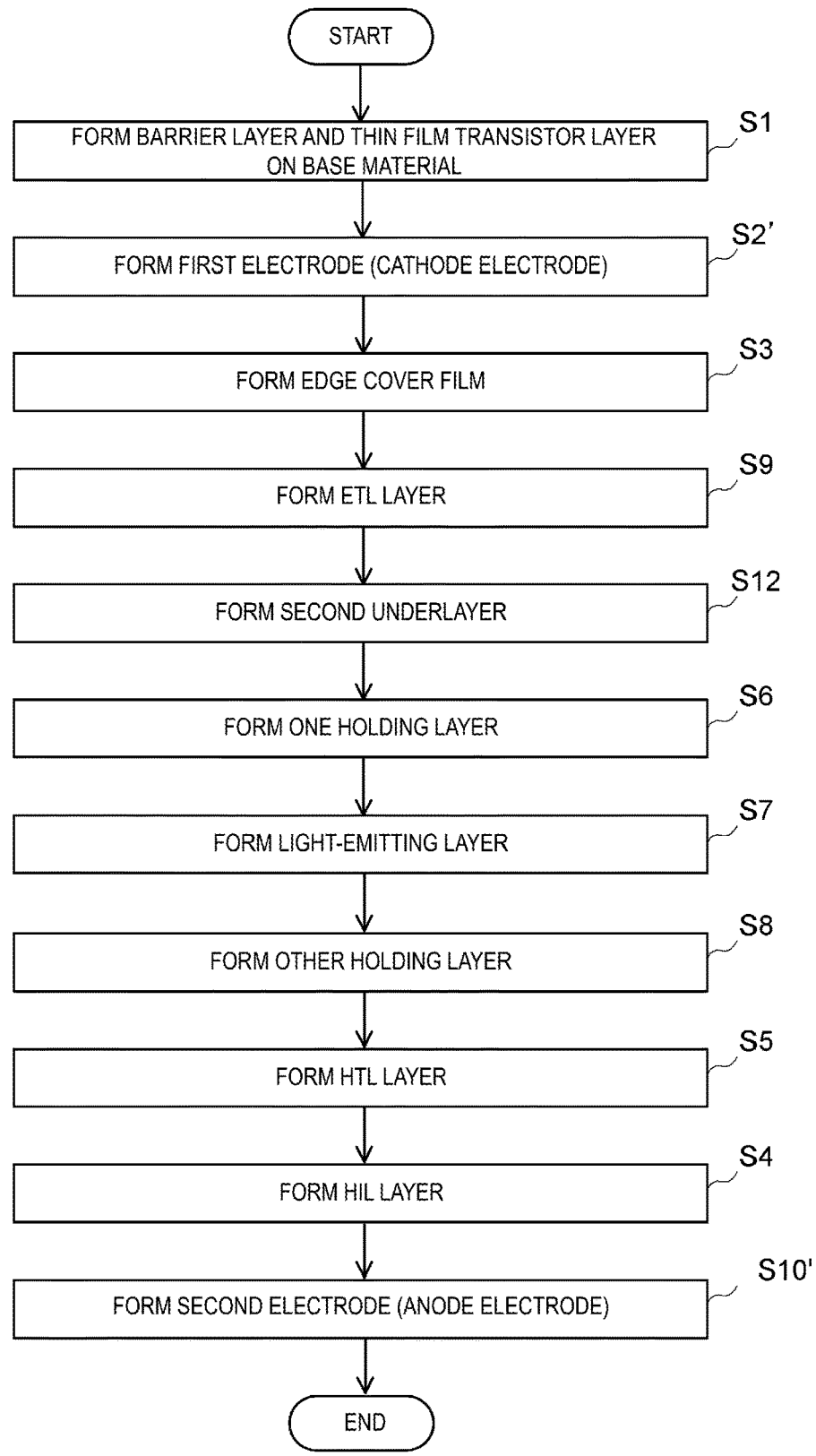
FIG. 19 is a flowchart illustrating a method for manufacturing the display device illustrated in FIG. 18.

Next, a method for manufacturing the display device 2 of the present embodiment will be specifically described with reference to FIG. 19 as well. FIG. 19 is a flowchart illustrating a method for manufacturing the display device illustrated in FIG. 18.

As illustrated in step S12 in FIG. 19, in the present embodiment, after the electron transport layer formation process, a second underlayer formation process of forming the second underlayer 34g on the electron transport layer 34a is performed by a dripping technique such as, for example, an ink-jet method. Specifically, in the second underlayer formation process, for example, a high-polarity solvent such as ethanol or 2-methoxyethanol, for example, is used as the solvent included in the solution for second underlayer formation, and the solute, that is, underlayer material (functional material) of this solution for second underlayer formation is selected from the group consisting of, for example, nanoparticles of zinc oxide (ZnO) or magnesium-doped zinc oxide (MgZnO) or structural particles by a sol-gel method. Then, in this second underlayer formation process, the second underlayer 34g having a film thickness of, for example, from several nm to several 10 nm is formed by baking, at a predetermined temperature, the solution for second underlayer formation that has been dripped onto the electron transport layer 34a.

Note that, when nanoparticles of zinc oxide (ZnO) or magnesium-doped zinc oxide (MgZnO) or structural particles by a sol-gel method are used as the underlayer material of the second underlayer 34g, for example, the second underlayer 34g and the first holding layer 34b can be integrally configured, or the second underlayer 34g, the first holding layer 34b, and the electron transport layer 34a can be integrally configured.

With the above configuration, the present embodiment can achieve actions and effects similar to those of the first embodiment. Further, in the present embodiment, the second underlayer (second mixing prevention layer) 34g is provided, making it possible to prevent the occurrence of a mixed layer of the electron transport material in the electron transport layer 34a and the photosensitive material in the first holding layer 34b, and prevent deterioration of the patterning performance with respect to the first holding layer 34b. As a result, in the present embodiment, the light-emitting layer 34c having a desired shape and film thickness can be easily formed, and the display device 2 having excellent light emission performance can be easily manufactured.

Seventh Embodiment

Figure 20:
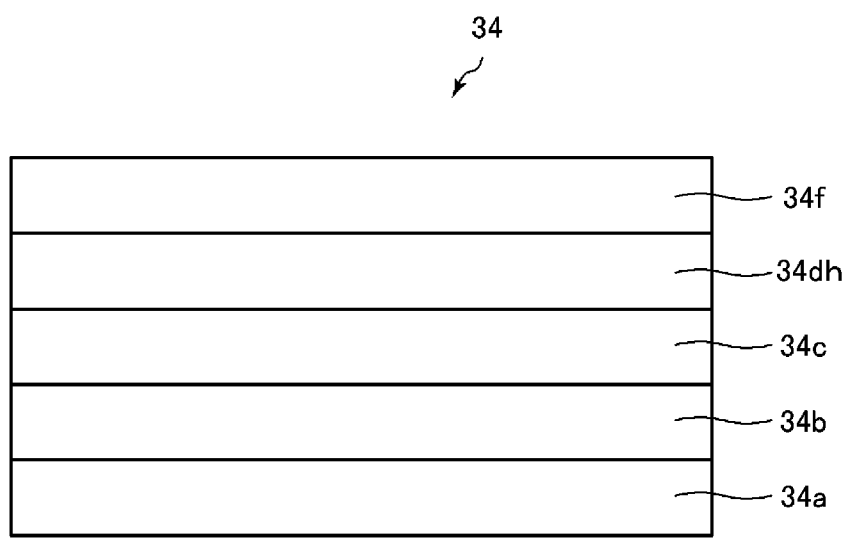
FIG. 20 is a cross-sectional view illustrating a specific configuration of a function layer of a display device according to a seventh embodiment of the disclosure.

FIG. 20 is a cross-sectional view illustrating a specific configuration of a function layer of a display device according to a seventh embodiment of the disclosure. In the drawing, a main difference between the present embodiment and the fifth embodiment described above is integration of the one holding layer and the hole transport layer. Note that elements common to those in the fifth embodiment are denoted by the same reference signs, and duplicate description thereof will be omitted.

In the display device 2 of the present embodiment, as illustrated in FIG. 20, the function layer 34 includes the electron transport layer 34a, the first holding layer 34b formed of a photosensitive material and conductive nanoparticles, the light-emitting layer 34c, a second holding layer 34dh, and the hole injection layer 34f. The second holding layer 34dh has a function of the hole transport layer, and constitutes the one holding layer that also serves as the hole transport layer.

Figure 21:
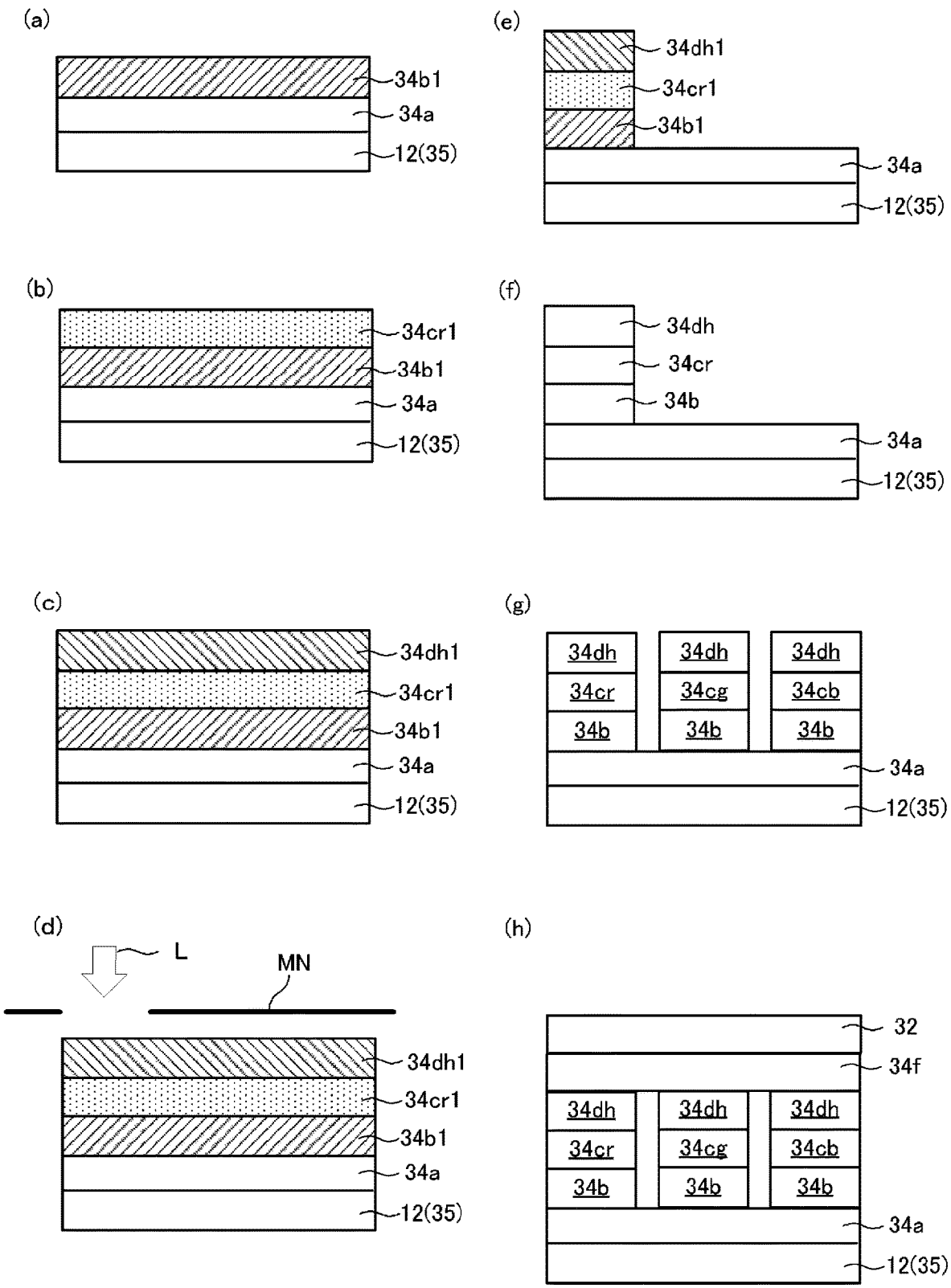
FIG. 21 is a diagram explaining a specific manufacturing process of a configuration of main portions of the display device illustrated in FIG. 20.

Next, a method for manufacturing the display device 2 of the present embodiment will be specifically described with reference to FIG. 21 as well. FIG. 21 is a diagram explaining a specific manufacturing process of a configuration of main portions of the display device illustrated in FIG. 20. Note that, in FIG. 21, for the sake of simplicity in the drawings, illustration of the first electrode 35 and the edge cover film 23 for each subpixel SP is omitted.

As illustrated in FIG. 21(c), in the present embodiment, a third intermediate layer 34dh1 of the second holding layer (one holding layer) 34dh is formed on the second intermediate layer 34cr1 of the light-emitting layer 34cr. This third intermediate layer 34dh1 is formed at a film thickness of about from several nm to several 10 nm, for example. Specifically, after the second intermediate layer formation process (step S24) is performed, a solution dripping process of dripping a solution for third intermediate layer formation including a functional material having a photosensitive function and a hole transport function onto the second intermediate layer 34cr1 is performed. Note that FIG. 21(a) and FIG. 21(b) are the same processes as those in FIG. 17(a) and FIG. 17(b) in the fifth embodiment, respectively.

For example, OTPD is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for third intermediate layer formation in which these functional materials are the solute, the same solvent as in the third solution described above can be used, and the same photoinitiator and/or additive as in the third solution may be included.

Then, following the solution dripping process described above, the solution for third intermediate layer formation on the second intermediate layer 34cr1 is, for example, baked at a low temperature of about from 50 to 130° C. or vacuum dried, thereby evaporating the solvent of the solution for third intermediate layer formation to form the third intermediate layer 34dh1 on the second intermediate layer 34cr1.

Subsequently, as illustrated in FIG. 21(d) to FIG. 21(h), the patterning process and the formation process are performed as in the case of the fifth embodiment, thereby forming the light-emitting layer 34cr and the pair of holding layers 34b and 34dh sandwiching the light-emitting layer 34cr in the light-emitting element Xr. Next, a similar process is performed for the light-emitting element Xg and the light-emitting element Xb, thereby providing the light-emitting layer 34cg and the pair of holding layers 34b and 34dh sandwiching the light-emitting layer 34cg in the light-emitting element Xg, and the light-emitting layer 34cb and the pair of holding layers 34b and 34dh sandwiching the light-emitting layer 34cb in the light-emitting element Xb, and subsequently providing the hole injection layer 34f the second electrode (anode electrode) 32.

With the above configuration, the present embodiment can achieve actions and effects similar to those of the fifth embodiment. Further, in the present embodiment, the second holding layer 34dh, which also serves as the hole transport layer, is provided, thereby simplifying the manufacturing process while reducing the number of components of the display device 2.

Eighth Embodiment

Figure 22:
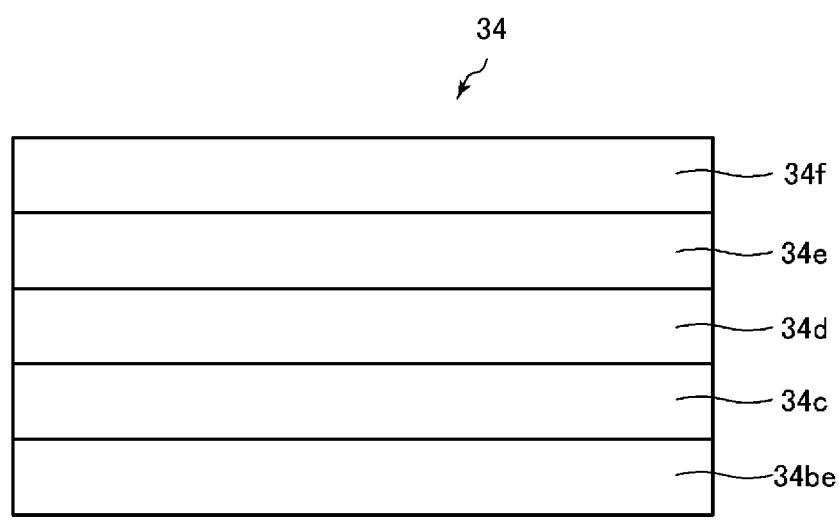
FIG. 22 is a cross-sectional view illustrating a specific configuration of a function layer of a display device according to an eighth embodiment of the disclosure.

FIG. 22 is a cross-sectional view illustrating a specific configuration of a function layer of a display device according to an eighth embodiment of the disclosure. In the drawing, a main difference between the present embodiment and the fifth embodiment described above is integration of the other holding layer and the electron transport layer. Note that elements common to those in the fifth embodiment are denoted by the same reference signs, and duplicate description thereof will be omitted.

In the display device 2 of the present embodiment, as illustrated in FIG. 22, the function layer 34 includes a first holding layer 34be, the light-emitting layer 34c, the second holding layer 34d formed of a photosensitive material and conductive nanoparticles, the hole transport layer 34e, and the hole injection layer 34f. The first holding layer 34be has a function of the electron transport layer, and constitutes the other holding layer that also serves as the electron transport layer.

Figure 23:
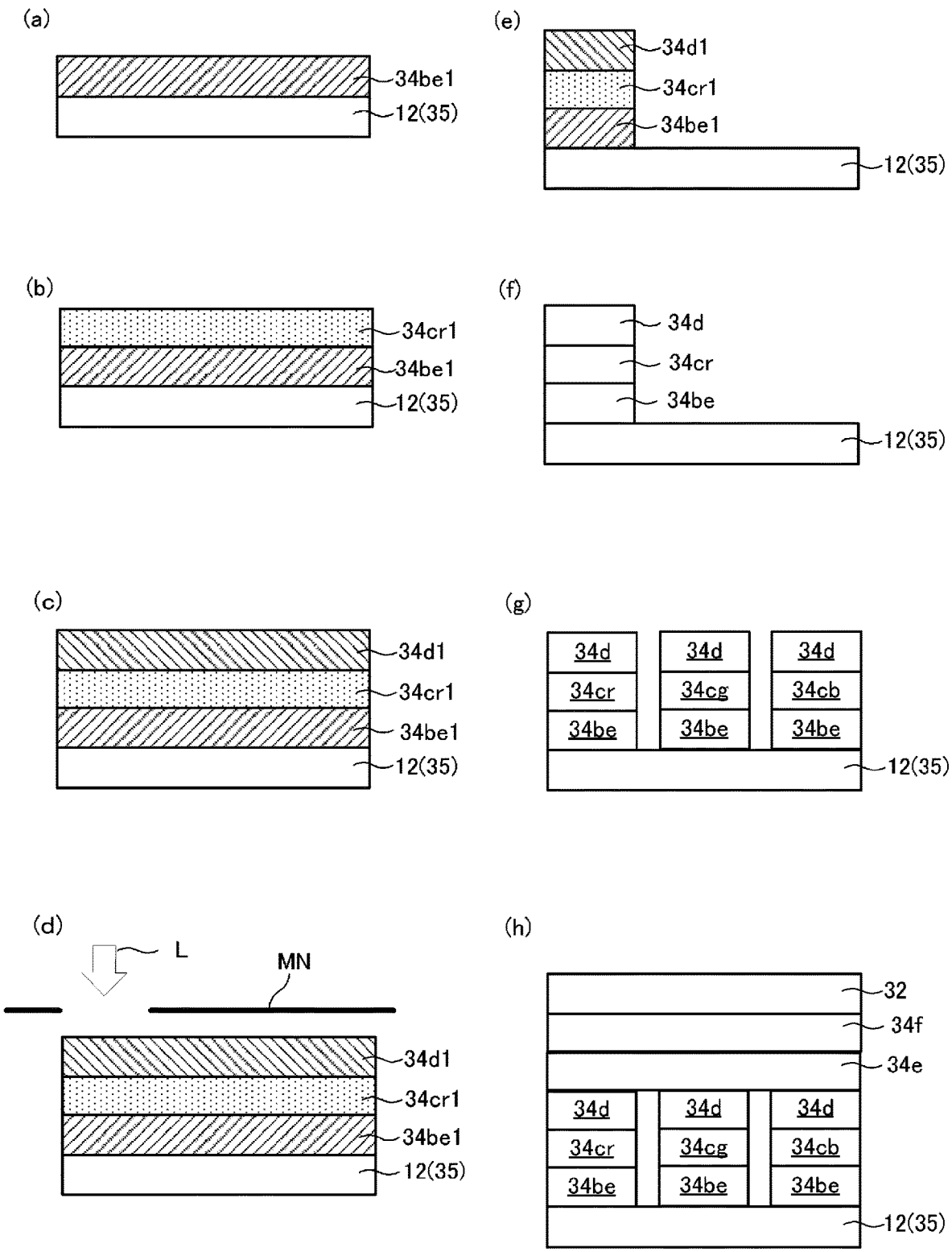
FIG. 23 is a diagram explaining a specific manufacturing process of a configuration of main portions of the display device illustrated in FIG. 22.

Next, a method for manufacturing the display device 2 of the present embodiment will be specifically described with reference to FIG. 23 as well. FIG. 23 is a diagram explaining a specific manufacturing process of a configuration of the main portions of the display device illustrated in FIG. 22. Note that, in FIG. 23, for the sake of simplicity in the drawings, illustration of the first electrode 35 and the edge cover film 23 for each subpixel SP is omitted.

As illustrated in FIG. 23(a), in the present embodiment, the first intermediate layer 34be1 of the first holding layer (other holding layer) 34be is formed on the first electrode (cathode electrode) 35. This first intermediate layer 34be1 is formed at a film thickness of about from several nm to several 10 nm, for example. Specifically, after the first electrode (cathode electrode) formation process (step S2') is performed, a solution dripping process of dripping a solution for first intermediate layer formation including a functional material having a photosensitive function and an electron transport function onto the first electrode (cathode electrode) 35 is performed.

As the functional material having a photosensitive function and an electron transport function, a combined material obtained by combining the first photosensitive material described above and an electron transport material such as nanoparticles of zinc oxide (ZnO) or magnesium-doped zinc oxide (MgZnO) or structural particles by a sol-gel method is used, for example. Further, in the solution for first intermediate layer formation in which these functional materials serve as the solute, the same solvent as in the first solution described above can be used, and the same photoinitiator and/or additive as in the first solution may be included.

Then, following the solution dripping process described above, the solution for first intermediate layer formation on the first electrode (cathode electrode) 35 is, for example, baked at a low temperature of about from 50 to 130° C. or vacuum dried, thereby evaporating the solvent of the solution for first intermediate layer formation to form the first intermediate layer 34be1 on the first electrode (cathode electrode) 35.

Then, as illustrated in FIG. 23(b) and FIG. 23(c), as in FIG. 17(b) and FIG. 17(c) of the fifth embodiment, respectively, the second intermediate layer 34cr1 and the third intermediate layer 34d1 are sequentially formed on the first intermediate layer 34be1.

Subsequently, as illustrated in FIG. 23(d) to FIG. 23(h), the patterning process and the formation process are performed as in the case of the fifth embodiment, thereby forming the light-emitting layer 34cr and the pair of holding layers 34be and 34d sandwiching the light-emitting layer 34cr in the light-emitting element Xr. Next, a similar process is performed for the light-emitting element Xg and the light-emitting element Xb, thereby providing the light-emitting layer 34cg and the pair of holding layers 34be and 34d sandwiching the light-emitting layer 34cg in the light-emitting element Xg, and the light-emitting layer 34cb and the pair of holding layers 34be and 34d sandwiching the light-emitting layer 34cb in the light-emitting element Xb, and subsequently providing the second electrode (anode electrode) 32.

With the above configuration, the present embodiment can achieve actions and effects similar to those of the fifth embodiment. Further, in the present embodiment, the first holding layer 34be, which also serves as the electron transport layer, is provided, thereby simplifying the manufacturing process while reducing the number of components of the display device 2.

Ninth Embodiment

Figure 24:
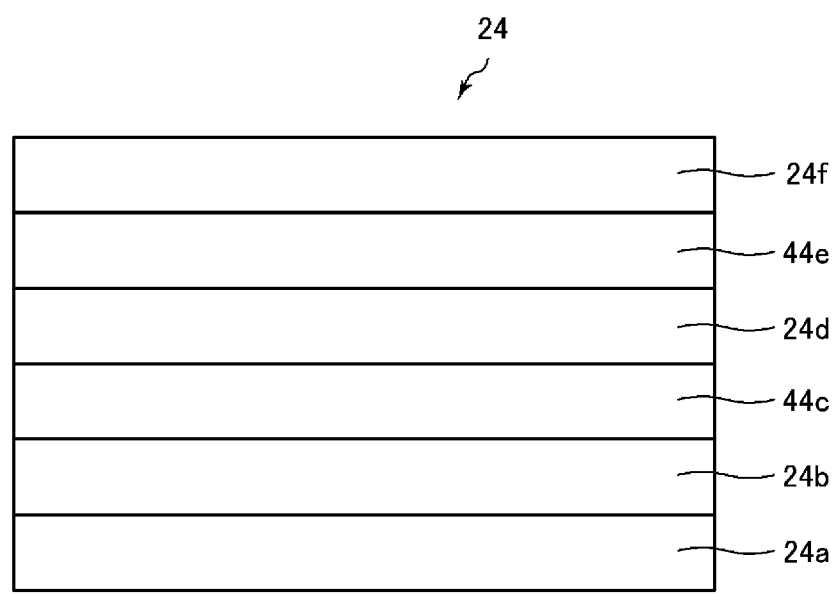
FIG. 24 is a cross-sectional view illustrating a specific configuration of a function layer of a display device according to a ninth embodiment of the disclosure.

FIG. 24 is a cross-sectional view illustrating a specific configuration of a function layer of a display device according to a ninth embodiment of the disclosure. In the drawings, a main difference between the present embodiment and the first embodiment described above is that a positive resist material is used in place of the negative resist material as the photosensitive material in each of the pair of holding layers. Note that elements common to those in the first embodiment are denoted by the same reference signs, and duplicate description thereof will be omitted.

In the display device 2 of the present embodiment, as illustrated in FIG. 24, the function layer 24 includes the hole injection layer 24a, the hole transport layer 24b, a first holding layer 44c, the light-emitting layer 24d, a second holding layer 44e, and the electron transport layer 24f.

The first holding layer 44c and the second holding layer 44e include a positive resist material as the photosensitive material (details described below). Further, in the present embodiment, the hole transport layer 24b is provided between the first holding layer 44c as one holding layer and the first electrode 22 as the anode electrode. Furthermore, in the present embodiment, the electron transport layer 24f is provided between the second holding layer 44e as the other holding layer and the second electrode 25 as the cathode electrode.

Figure 25:
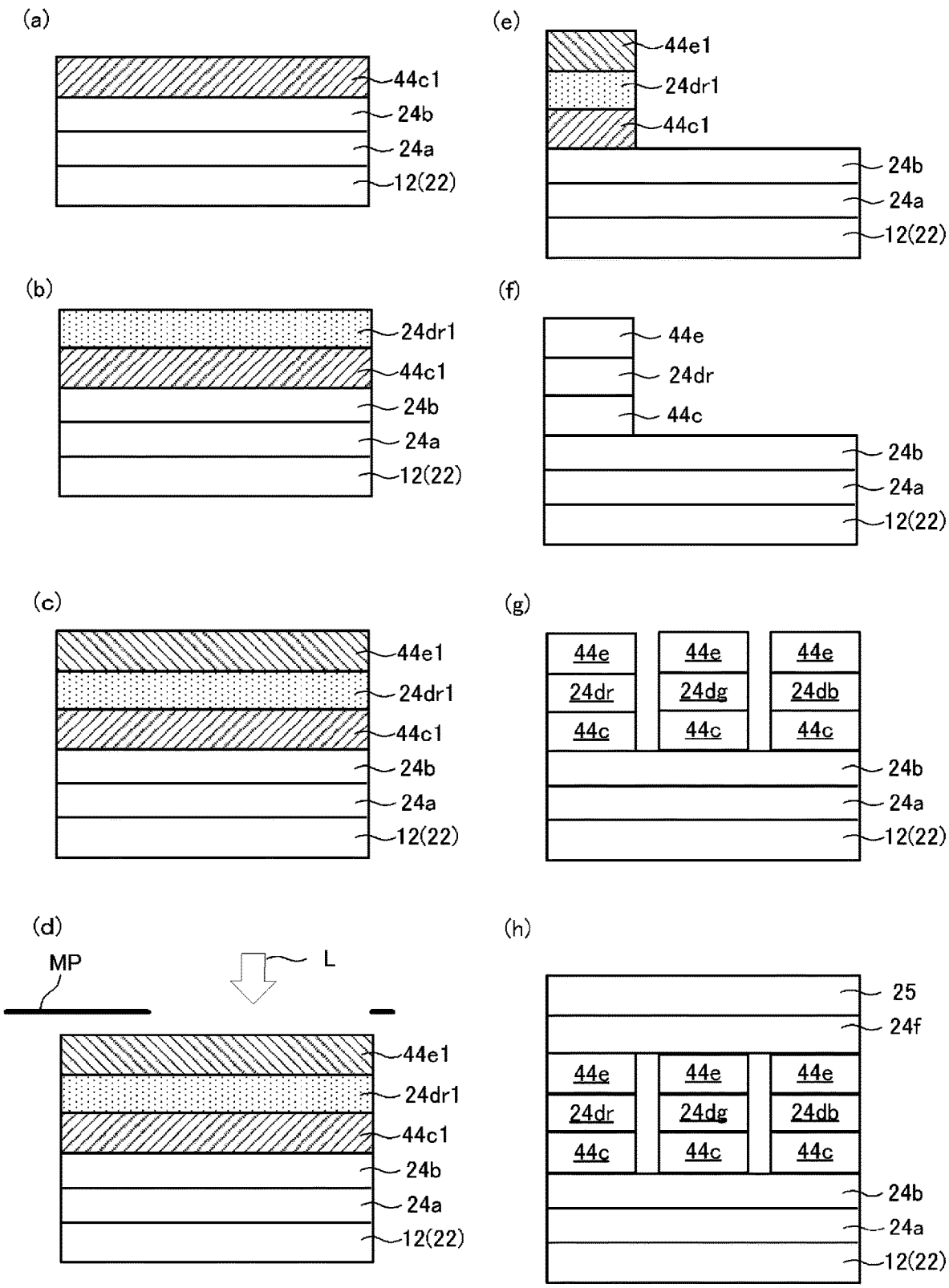
FIG. 25 is a diagram explaining a specific manufacturing process of a configuration of main portions of the display device illustrated in FIG. 24.

Next, a method for manufacturing the display device 2 of the present embodiment will be specifically described with reference to FIG. 25 as well. FIG. 25 is a diagram explaining a specific manufacturing process of a configuration of the main portions of the display device illustrated in FIG. 24. Note that, in FIG. 25, for the sake of simplicity in the drawings, illustration of the first electrode 22 and the edge cover film 23 for each subpixel SP is omitted.

In the method for manufacturing the display device 2 of the present embodiment, as illustrated in steps S1 to S5 in FIG. 4, the barrier layer 3, the thin film transistor layer 4, the first electrode (anode electrode) 22, the edge cover film 23, the hole injection layer (HIL) 24a, and the hole transport layer (HTL) 24b as the first charge transport layer are sequentially formed on the base material 12.

Next, the first holding layer (one holding layer) 24c is formed by a dripping technique such as an ink-jet method (step S6' of FIG. 27 described below). Then, the light-emitting layer 24d composed of the quantum dot light-emitting layer is formed by a dripping technique such as an ink-jet method (step S7 in FIG. 4). Subsequently, the second holding layer (other holding layer) 24e is formed by a dripping technique such as an ink-jet method (step S8' in FIG. 27 described below). The one holding layer formation process, the light-emitting layer formation process, and the other holding layer formation process are performed continuously until each intermediate layer is formed, and subsequently the process of forming the light-emitting layer 24d and the pair of holding layers 24c and 24e that sandwich the light-emitting layer 24d is performed for each of the light-emitting elements Xr, Xg, Xb. Note that, in the following description, a case in which the red light-emitting element Xr, the green light-emitting element Xg, and the blue light-emitting element Xb are sequentially formed in this order is illustrated as an example.

Specifically, as illustrated in step S21 in FIG. 5, after the HTL layer formation process (first charge transport layer formation process) is performed, a first solution dripping process in which the first solution including the first photosensitive material and the first conductive nanoparticles is dripped onto the first charge transport layer is performed.

The resin component of the first photosensitive material (positive resist material) described above is selected from the group consisting of, for example, a novolac resin, a polyhydroxystyrene resin, an acrylic resin, a polyimide resin, an epoxy resin, a phenolic resin, a fluorine resin, a siloxane compound including a photopolymerizable group, and polysilane. Further, a high-polarity solvent such as PGMEA, for example, is used as the solvent of the first solution (solution for one holding layer formation), and this first solution includes a photoinitiator (naphthoquinone photoacid generator, for example) at about 1 to 10%, for example, and an additive such as a coupling material for improving adhesion, for example.

The first conductive nanoparticles include, for example, metal nanoparticles. The metal nanoparticles desirably have transparency. A metal constituting the metal nanoparticles may be either a pure metal or an alloy. The metal includes, for example, at least one type selected from the group consisting of Ag, Au, Cu, Al, Fe, and Ti. The first conductive nanoparticles are dispersed in the first solution.

Next, as illustrated in step S22 in FIG. 5, a first intermediate layer formation process of drying the solvent in the first solution that has been dripped and thus forming the first intermediate layer of the one holding layer on the first charge transport layer is performed. Specifically, in this first intermediate layer formation process, the first solution on the hole transport layer 24b is baked at a low temperature of about from 50 to 80° C. or by being vacuum dried, for example, and the solvent of the first solution is evaporated. Then, as illustrated in FIG. 25(a), a first intermediate layer 44c1 of the first holding layer (one holding layer) 44c is formed on the hole transport layer 24b. This first intermediate layer 44c1 is formed at a film thickness of about from several nm to 10 nm, for example.

Then, as illustrated in step S23 in FIG. 5, a second solution dripping process of dripping a second solution including predetermined quantum dots to be included in the red light-emitting layer 24dr onto the first intermediate layer 44c1 is performed. Note that the quantum dots and the second solution used are similar to those of the first embodiment, and thus duplicate descriptions thereof will be omitted.

Next, as illustrated in step S24 in FIG. 5, a second intermediate layer formation process of drying the solvent in the second solution that has been dripped and thus forming the second intermediate layer of the light-emitting layer 24dr on the first intermediate layer 44c1 is performed. Specifically, in this second intermediate layer formation process, the second solution on the first intermediate layer 44c1 is baked at a low temperature of about from 50 to 80° C. or vacuum dried, for example, and the solvent of the second solution is evaporated. Then, as illustrated in FIG. 25(b), the second intermediate layer 24dr1 of the light-emitting layer 24dr is formed on the first intermediate layer 44c1. This second intermediate layer 24dr1 is formed at a film thickness of about from 10 nm to 40 nm, for example.

Then, as illustrated in step S25 in FIG. 5, a third solution dripping process of dripping a third solution including a second photosensitive material and second conductive nanoparticles onto the second intermediate layer 24dr1 is performed.

The resin component of the second photosensitive material (positive resist material) is, for example, selected from the group consisting of a novolac resin, a polyhydroxystyrene resin, an acrylic resin, a polyimide resin, an epoxy resin, a phenolic resin, a fluorine resin, a siloxane compound including a photopolymerizable group, and polysilane. Further, a high-polarity solvent such as PGMEA, for example, is used as the solvent of the third solution (solution for other holding layer formation), and this third solution includes a photoinitiator (naphthoquinone photoacid generator, for example) at about 1 to 10%, for example, and an additive such as a coupling material for improving adhesion, for example. Note that the same material may be used for the first photosensitive material and the second photosensitive material (that is, the first holding layer 44c and the second holding layer 44e may be configured using the same photosensitive material). In this case, the display device 2 of simple manufacture can be easily configured at low cost.

The second conductive nanoparticles include, for example, metal nanoparticles. The metal nanoparticles desirably have transparency. A metal constituting the metal nanoparticles may be either a pure metal or an alloy. The metal includes, for example, at least one type selected from the group consisting of Ag, Au, Cu, Al, Fe, and Ti. The second conductive nanoparticles are dispersed in the third solution.

Next, as illustrated in step S26 in FIG. 5, a third intermediate layer formation process of drying the solvent in the third solution that has been dripped and thus forming a third intermediate layer of the other holding layer on the second intermediate layer 24dr1 is performed. Specifically, in this third intermediate layer formation process, the third solution on the second intermediate layer 24dr1 is baked at a low temperature of about from 50 to 80° C. or vacuum dried, for example, and the solvent of the third solution is evaporated. Then, as illustrated in FIG. 25(c), a third intermediate layer 44e1 of the second holding layer (other holding layer) 44e is formed on the second intermediate layer 24dr1. This third intermediate layer 44e1 is formed at a film thickness of about from several nm to 10 nm, for example.

Then, as illustrated in step S27 of FIG. 5, a patterning process of patterning the first intermediate layer 44c1, the second intermediate layer 24dr1, and the third intermediate layer 44e1 collectively into each desired shape by sequentially performing an exposure process using a predetermined irradiation light and a development process using a predetermined developing solution on the first intermediate layer 44c1, the second intermediate layer 24dr1, and the third intermediate layer 44e1 is performed. That is, as illustrated in FIG. 25(d), the positive resist mask MP for forming the red light-emitting element Xr is placed above the third intermediate layer 44e1, and the third intermediate layer 44e1 side is irradiated with the ultraviolet light (UV light) L of the i line, the g line, the h line, or the like from an opening provided in the positive resist mask MP. This completes the exposure process, and thus the portion irradiated with the ultraviolet light is insoluble due to a cross-linking reaction, a polymerization reaction, a condensation reaction, or the like. Subsequently, by rinsing with an alkaline developing solution such as TMAH or KOH or a developing solution such as an organic solvent such as PGMEA or ethanol, each portion of the first intermediate layer 44c1, the second intermediate layer 24dr1, and the third intermediate layer 44e1 irradiated with the ultraviolet light remains as a permanent film, and each portion not irradiated with the ultraviolet light flows down with the developing solution, as illustrated in FIG. 25(e).

Next, as illustrated in step S28 in FIG. 5, a formation process of curing the first intermediate layer 44c1, the second intermediate layer 24dr1, and the third intermediate layer 44e1 thus patterned, thereby forming, on the first charge transport layer (hole transport layer 24b), the light-emitting layer 24dr and the pair of holding layers 44c, 44e sandwiching the light-emitting layer 24dr is performed. In this formation process, the first intermediate layer 44c1, the second intermediate layer 24dr1, and the third intermediate layer 44e1 thus patterned are baked at, for example, about from 100 to 140° C., thereby forming the light-emitting layer 24dr and the pair of holding layers (that is, first holding layer 44c and second holding layer 44e) sandwiching the light-emitting layer 24dr in the light-emitting element Xr on the hole transport layer 24b, as illustrated in FIG. 25(f).

Then, the first solution dripping process, the first intermediate layer formation process, the second solution dripping process, the second intermediate layer formation process, the third solution dripping process, the third intermediate layer formation process, the patterning process, and the formation process are repeated sequentially. As a result, as illustrated in FIG. 25(g), the light-emitting layer 24dg and the pair of holding layers (that is, first holding layer 44c and second holding layer 44e) sandwiching the light-emitting layer 24dg in the green light-emitting element Xg are formed, and furthermore the light-emitting layer 24db and the pair of holding layers (that is, first holding layer 44c and second holding layer 44e) sandwiching the light-emitting layer 24db in the blue light-emitting element Xb are formed. As a result, in the present embodiment, the dripping technique and the photolithography method are combined to form a pixel pattern corresponding to the three colors RGB, and the separate-patterning of RGB is completed.

Subsequently, in the display device 2 of the present embodiment, the electron transport layer (ETL) 24f as the second charge transport layer and the second electrode (cathode electrode 25) are sequentially layered as in the first embodiment and, as illustrated in FIG. 25(h), the display device 2 including the light-emitting elements Xr, Xg, Xb of RGB is manufactured.

With the above configuration, the present embodiment can achieve actions and effects similar to those of the first embodiment.

Tenth Embodiment

Figure 26:
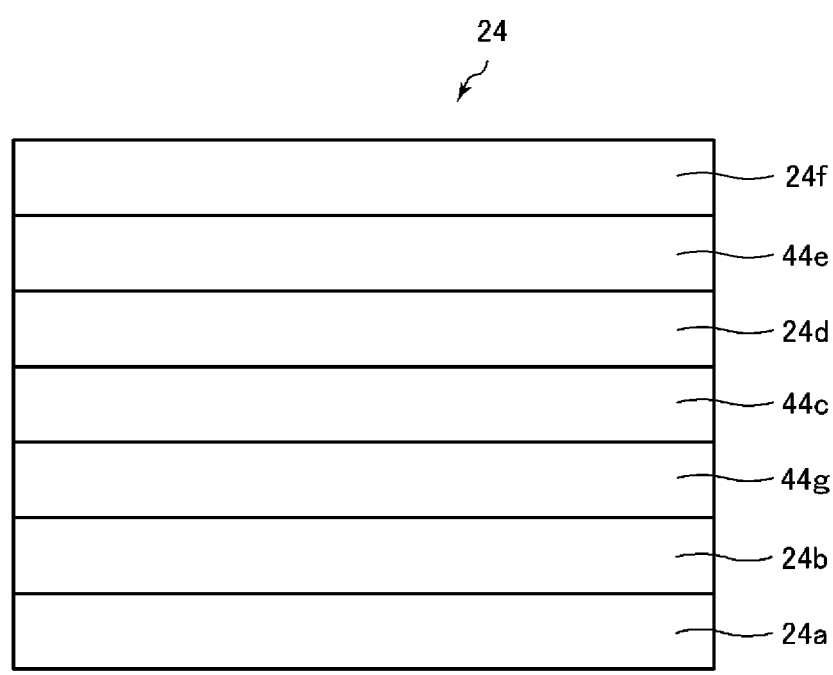
FIG. 26 is a cross-sectional view illustrating a specific configuration of a function layer of a display device according to a tenth embodiment of the disclosure.

FIG. 26 is a cross-sectional view illustrating a specific configuration of a function layer of a display device according to a tenth embodiment of the disclosure. In the drawing, a main difference between the present embodiment and the ninth embodiment described above is that a first mixing holding layer is provided between the one holding layer and the hole transport layer. Note that elements common to those in the ninth embodiment are denoted by the same reference signs, and duplicate description thereof will be omitted.

In the display device 2 of the present embodiment, as illustrated in FIG. 26, the function layer 24 includes the hole injection layer 24a, the hole transport layer 24b, a first underlayer 44g, the first holding layer 44c formed of a photosensitive material and conductive nanoparticles, the light-emitting layer 24d, the second holding layer 44e formed of a photosensitive material and conductive nanoparticles, and the electron transport layer 24f.

The first underlayer 44g is provided between the hole transport layer 24b and the first holding layer (one holding layer) 44c, and functions as a first mixing prevention layer that prevents each functional material of the hole transport layer 24b and the first holding layer 44c from mixing together. That is, the first underlayer 44g prevents the mixing of the hole transport material in the hole transport layer 24b and the photosensitive material in the first holding layer 44c and thus the occurrence of a mixed layer. In particular, when the hole transport material and the photosensitive material are both organic materials, for example, the mixed layer described above can readily occur, but with the first underlayer 44g being interposed, the occurrence of such a mixed layer can be reliably prevented.

Next, a method for manufacturing the display device 2 of the present embodiment will be specifically described with reference to FIG. 27 as well. FIG. 27 is a flowchart illustrating a method for manufacturing the display device illustrated in FIG. 26.

Figure 27:
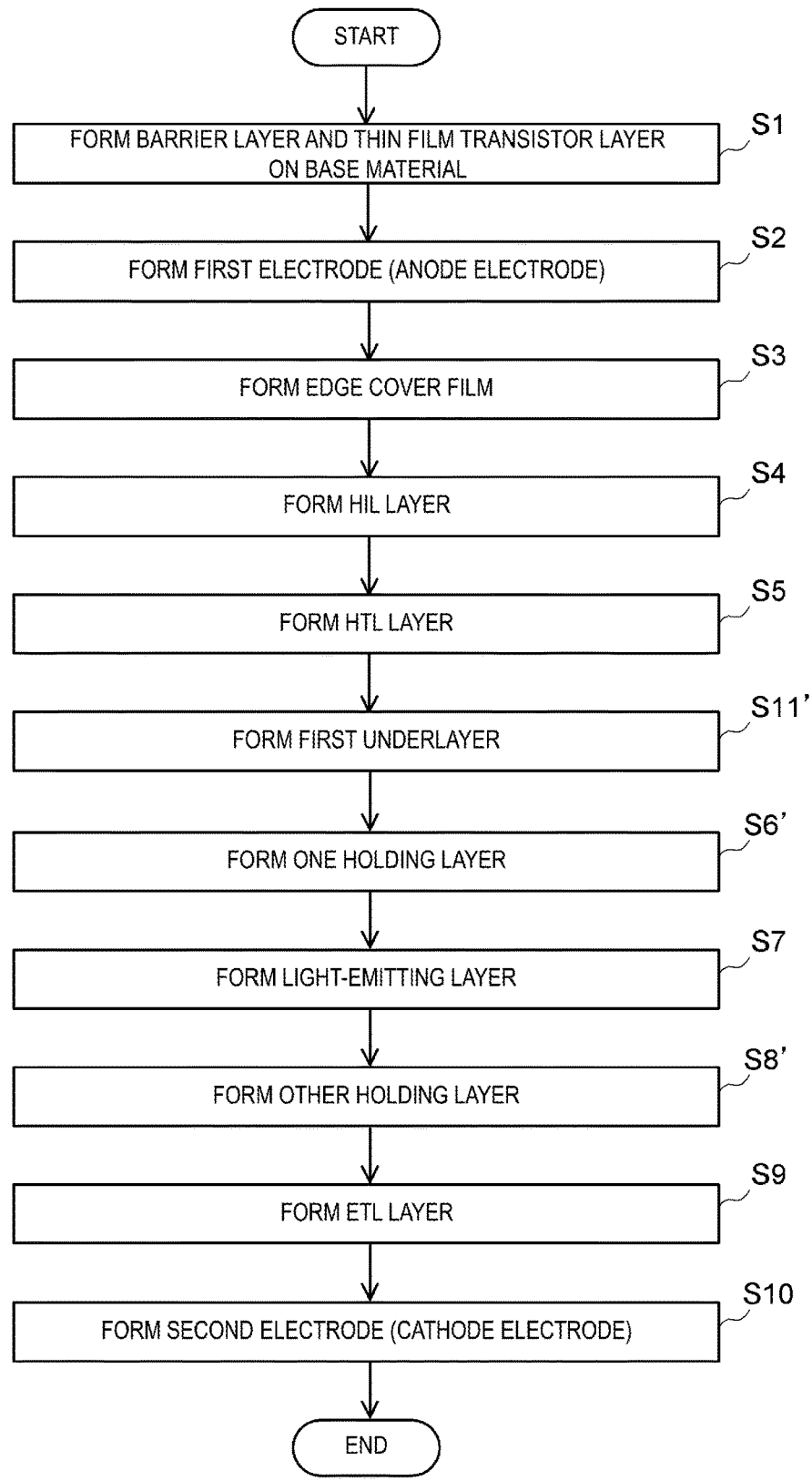
FIG. 27 is a flowchart illustrating a method for manufacturing the display device illustrated in FIG. 26.

As illustrated in step S11' in FIG. 27, in the present embodiment, after the hole transport layer formation process, a first underlayer formation process of forming the first underlayer 44g on the hole transport layer 24b is performed by a dripping technique such as, for example, an ink-jet method. Specifically, in the first underlayer formation process, for example, the solute included in the solution for first underlayer formation, that is, the underlayer material (functional material), is selected from the group consisting of hexamenyldisilazane (HMDS), siloxane compounds including a photopolymerizable group, polysilane, and OTPD, for example. Further, as the solvents, a low-polarity solvent such as hexane or ether or a high-polarity solvent such as pyridine or dimethylformaldehyde (DMF) is used as the solvent of hexamenyldisilazane (HMDS), a high-polarity solvent such as PGMEA is used as the siloxane compound or polysilane, and a low-polarity solvent such as toluene is used as OTPD. Then, in this first underlayer formation process, the first underlayer 44g having a film thickness of, for example, from several nm to several 10 nm is formed by baking, at a predetermined temperature, the solution for first underlayer formation that has been dripped onto the hole transport layer 24b.

Note that when, for example, polysilane is used as the underlayer material of the first underlayer 44g, the first underlayer 44g and the first holding layer 44c can be integrally configured, and the first underlayer 44g, the first holding layer 44c, and the hole transport layer 24b can be integrally configured.

With the above configuration, the present embodiment can achieve actions and effects similar to those of the ninth embodiment. Further, in the present embodiment, the first underlayer (first mixing prevention layer) 44g is provided, making it possible to prevent the occurrence of a mixed layer of the hole transport material in the hole transport layer 24b and the photosensitive material in the first holding layer 44c, and prevent deterioration of the patterning performance with respect to the first holding layer 44c. As a result, in the present embodiment, the light-emitting layer 24d having a desired shape and film thickness can be easily formed, and the display device 2 having excellent light emission performance can be easily manufactured.

Eleventh Embodiment

Figure 28:
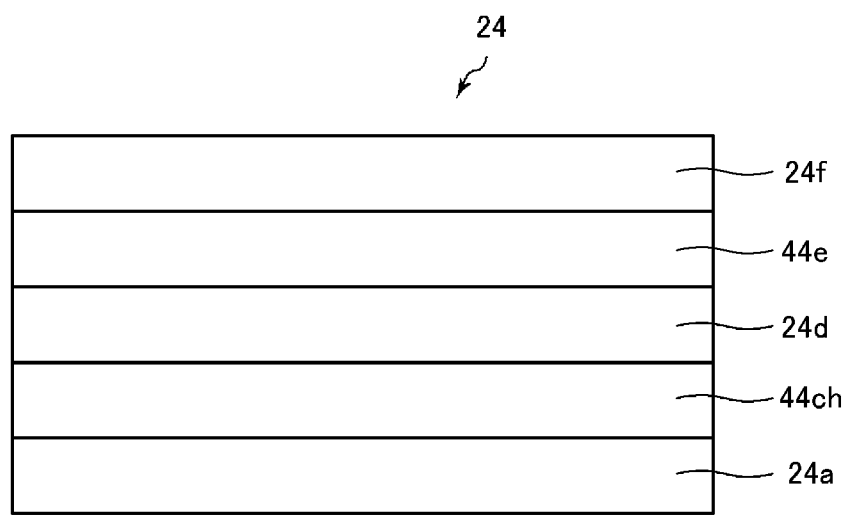
FIG. 28 is a cross-sectional view illustrating a specific configuration of a function layer of a display device according to an eleventh embodiment of the disclosure.

FIG. 28 is a cross-sectional view illustrating a specific configuration of a function layer of a display device according to an eleventh embodiment of the disclosure. In the drawing, a main difference between the present embodiment and the ninth embodiment described above is integration of the one holding layer and the hole transport layer. Note that elements common to those in the ninth embodiment are denoted by the same reference signs, and duplicate description thereof will be omitted.

In the display device 2 of the present embodiment, as illustrated in FIG. 28, the function layer 24 includes the hole injection layer 24a, a first holding layer 44ch, the light-emitting layer 24d, the second holding layer 44e formed of a photosensitive material and conductive nanoparticles, and the electron transport layer 24f. The first holding layer 44ch has a function of the hole transport layer, and constitutes the one holding layer that also serves as the hole transport layer.

Figure 29:
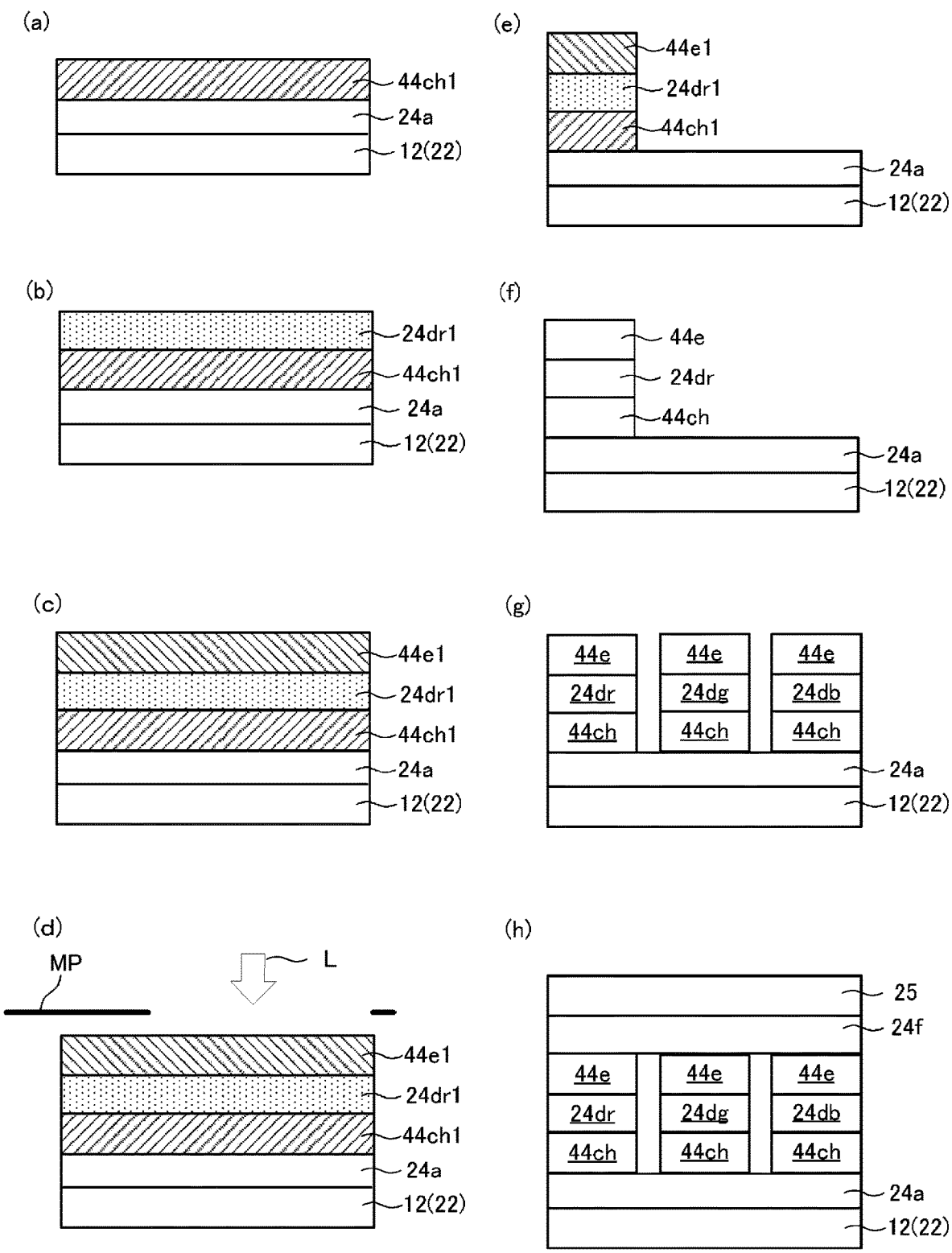
FIG. 29 is a diagram explaining a specific manufacturing process of a configuration of main portions of the display device illustrated in FIG. 28.

Next, a method for manufacturing the display device 2 of the present embodiment will be specifically described with reference to FIG. 29 as well. FIG. 29 is a diagram explaining a specific manufacturing process of a configuration of the main portions of the display device illustrated in FIG. 28. Note that, in FIG. 29, for the sake of simplicity in the drawings, illustration of the first electrode 22 and the edge cover film 23 for each subpixel SP is omitted.

As illustrated in FIG. 29(a), in the present embodiment, the first intermediate layer 44ch1 of the first holding layer (one holding layer) 44ch is formed on the hole injection layer 24a. This first intermediate layer 44ch1 is formed at a film thickness of about several nm to 10 nm, for example. Specifically, after the HIL layer formation process (step S4) is performed, a solution dripping process of dripping a solution for first intermediate layer formation including a functional material having a photosensitive function and a hole transport function onto the hole injection layer 24a is performed.

For example, polysilane is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for first intermediate layer formation in which these functional materials serve as the solute, the same solvent as in the first solution described above can be used, and the same photoinitiator and/or additive as in the first solution may be included.

Then, following the solution dripping process described above, the solution for first intermediate layer formation on the hole injection layer 24a is, for example, baked at a low temperature of about from 50 to 130° C. or vacuum dried, thereby evaporating the solvent of the solution for first intermediate layer formation to form the first intermediate layer 44ch1 on the hole injection layer 24a.

Subsequently, as illustrated in FIG. 29(b) to FIG. 29(h), the second intermediate layer 24dr1 of the light-emitting layer 24dr and the third intermediate layer 44e1 of the second holding layer (other holding layer) 44e are sequentially layered as in the ninth embodiment, and subsequently the patterning process and the formation process are performed, thereby forming the light-emitting layer 24dr and the pair of holding layers 44ch and 44e sandwiching the light-emitting layer 24dr in the light-emitting element Xr. Next, a similar process is performed for the light-emitting element Xg and the light-emitting element Xb, thereby providing the light-emitting layer 24dg and the pair of holding layers 44ch and 44e sandwiching the light-emitting layer 24dg in the light-emitting element Xg, and the light-emitting layer 24db and the pair of holding layers 44ch and 44e sandwiching the light-emitting layer 24db in the light-emitting element Xb, and subsequently providing the electron transport layer 24f and the second electrode (cathode electrode) 25.

With the above configuration, the present embodiment can achieve actions and effects similar to those of the first embodiment. Further, in the present embodiment, the first holding layer 44ch, which also serves as the hole transport layer, is provided, thereby simplifying the manufacturing process while reducing the number of components of the display device 2.

Twelfth Embodiment

Figure 30:
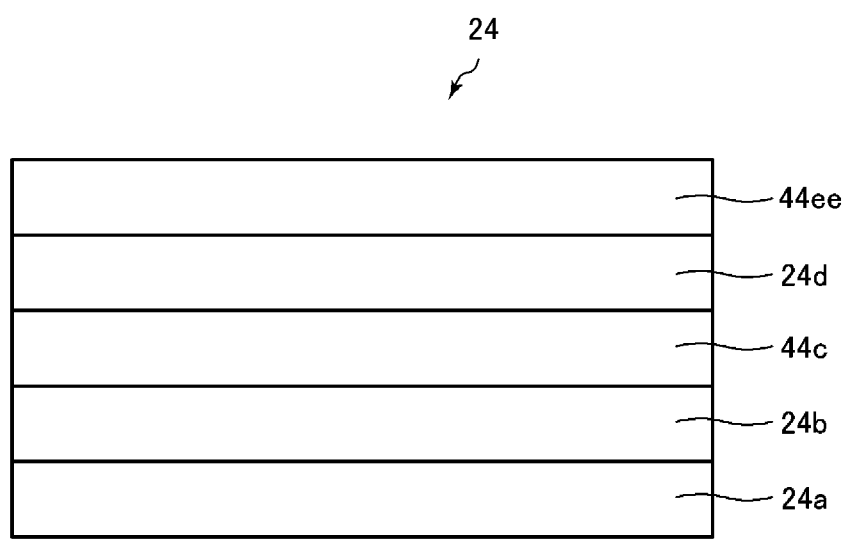
FIG. 30 is a cross-sectional view illustrating a specific configuration of a function layer of a display device according to a twelfth embodiment of the disclosure.

FIG. 30 is a cross-sectional view illustrating a specific configuration of a function layer of a display device according to a twelfth embodiment of the disclosure. In the drawing, a main difference between the present embodiment and the ninth embodiment described above is integration of the other holding layer and the electron transport layer. Note that elements common to those in the ninth embodiment are denoted by the same reference signs, and duplicate description thereof will be omitted.

In the display device 2 of the present embodiment, as illustrated in FIG. 30, the function layer 24 includes the hole injection layer 24a, the hole transport layer 24b, the first holding layer 44c formed of a photosensitive material and conductive nanoparticles, the light-emitting layer 24d, and the second holding layer 44ee. The second holding layer 44ee has a function of the electron transport layer, and constitutes the other holding layer that also serves as the electron transport layer.

Figure 31:
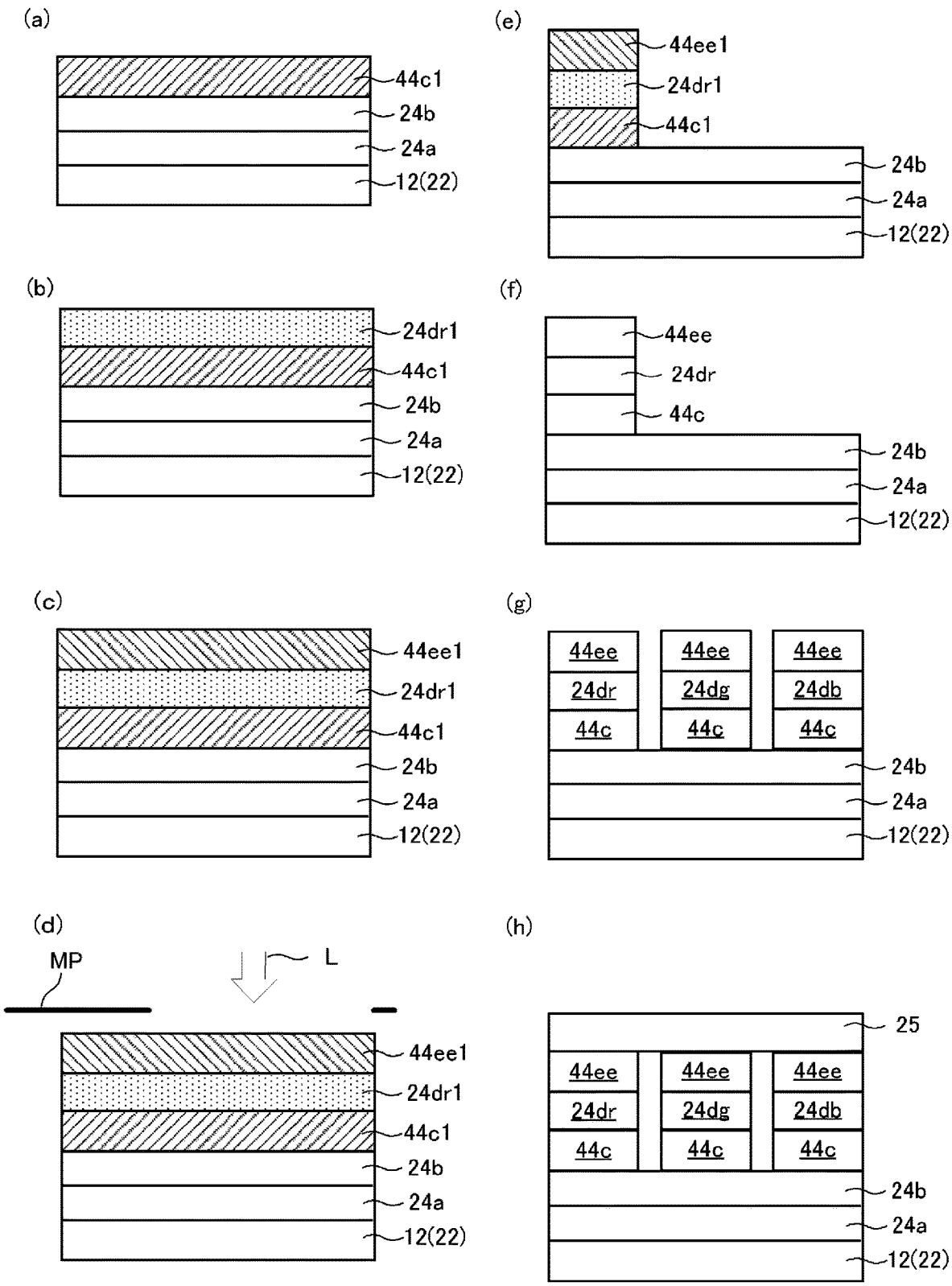
FIG. 31 is a diagram explaining a specific manufacturing process of a configuration of main portions of the display device illustrated in FIG. 30.

Next, a method for manufacturing the display device 2 of the present embodiment will be specifically described with reference to FIG. 31 as well. FIG. 31 is a diagram explaining a specific manufacturing process of a configuration of main portions of the display device illustrated in FIG. 30. Note that, in FIG. 31, for the sake of simplicity in the drawings, illustration of the first electrode 22 and the edge cover film 23 for each subpixel SP is omitted.

As illustrated in FIG. 31(c), in the present embodiment, a third intermediate layer 44ee1 of the second holding layer (other holding layer) 44ee is formed on the second intermediate layer 24dr1 of the light-emitting layer 24dr. This third intermediate layer 44ee1 is formed at a film thickness of about from several nm to 10 nm, for example. Specifically, after the second intermediate layer formation process (step S24) is performed, a solution dripping process of dripping a solution for third intermediate layer formation including a functional material having a photosensitive function and an electron transport function onto the second intermediate layer 24dr1 is performed. Note that FIG. 31(a) and FIG. 31(b) are the same processes as those in FIG. 25(a) and FIG. 25(b) in the ninth embodiment, respectively.

As the functional material having a photosensitive function and an electron transport function, a combined material obtained by combining the second photosensitive material described above and an electron transport material such as nanoparticles of zinc oxide (ZnO) or magnesium-doped zinc oxide (MgZnO) or a gel prepared by a sol-gel method is used, for example. Further, in the solution for third intermediate layer formation in which these functional materials are the solute, the same solvent as in the third solution described above can be used, and the same photoinitiator and/or additive as in the third solution may be included.

Then, following the solution dripping process described above, the solution for third intermediate layer formation on the second intermediate layer 24dr1 is, for example, baked at a low temperature of about from 50 to 130° C. or vacuum dried, thereby evaporating the solvent of the solution for third intermediate layer formation to form the third intermediate layer 44ee1 on the second intermediate layer 24dr1.

Subsequently, as illustrated in FIG. 31(d) to FIG. 31(h), the patterning process and the formation process are performed as in the case of the ninth embodiment, thereby forming the light-emitting layer 24dr and the pair of holding layers 44c and 44ee sandwiching the light-emitting layer 24dr in the light-emitting element Xr. Next, a similar process is performed for the light-emitting element Xg and the light-emitting element Xb, thereby providing the light-emitting layer 24dg and the pair of holding layers 44c and 44ee sandwiching the light-emitting layer 24dg in the light-emitting element Xg, and the light-emitting layer 24db and the pair of holding layers 44c and 44ee sandwiching the light-emitting layer 24db in the light-emitting element Xb, and subsequently providing the second electrode (cathode electrode) 25.

With the above configuration, the present embodiment can achieve actions and effects similar to those of the first embodiment. Further, in the present embodiment, the second holding layer 44ee, which also serves as the electron transport layer, is provided, thereby simplifying the manufacturing process while reducing the number of components of the display device 2.

Thirteenth Embodiment

Figure 32:
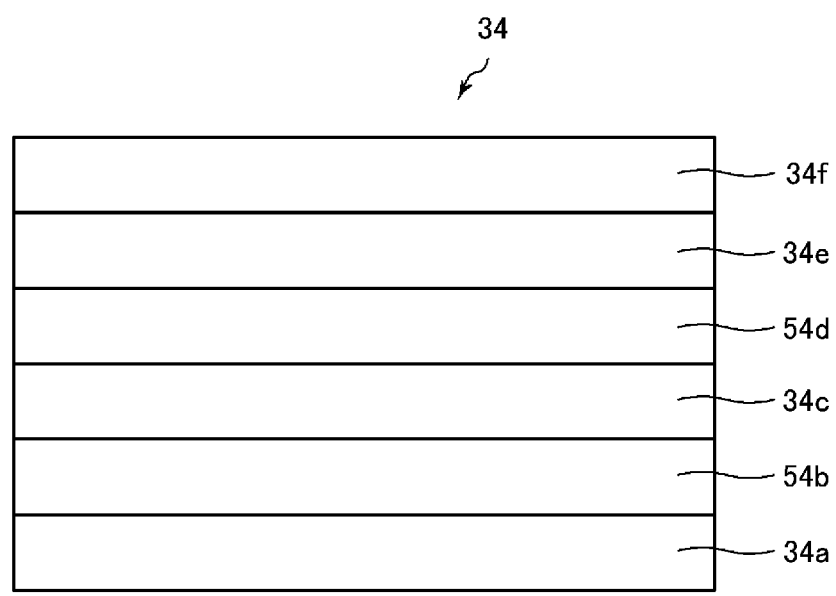
FIG. 32 is a cross-sectional view illustrating a specific configuration of a function layer of a display device according to a thirteenth embodiment of the disclosure.

FIG. 32 is a cross-sectional view illustrating a specific configuration of a function layer of a display device according to a thirteenth embodiment of the disclosure. In the drawings, a main difference between the present embodiment and the ninth embodiment described above is that the structure is inverted with the first electrode 35 serving as the cathode electrode, the function layer 34, and the second electrode 32 serving as the anode electrode provided in this order from the thin film transistor layer 4 side. Note that elements common to those in the ninth embodiment are denoted by the same reference signs, and duplicate description thereof will be omitted. Furthermore, each layer constituting the function layer 34 is mainly described in terms of differences from the corresponding layer of the same name in the function layer 24, and duplicate description of common elements will be omitted.

The function layer 34 of the display device 2 of the present embodiment, as illustrated in FIG. 32, is formed by layering the electron transport layer 34a, a first holding layer 54b formed of a photosensitive material and conductive nanoparticles, the light-emitting layer 34c, a second holding layer 54d formed of a photosensitive material and conductive nanoparticles, the hole transport layer 34e, and the hole injection layer 34f in this order from the lower layer side. Further, the first holding layer 54b and the second holding layer 54d constitute a pair of holding layers that sandwich the light-emitting layer 34c, and respectively constitute the other holding layer and the one holding layer.

Figure 33:
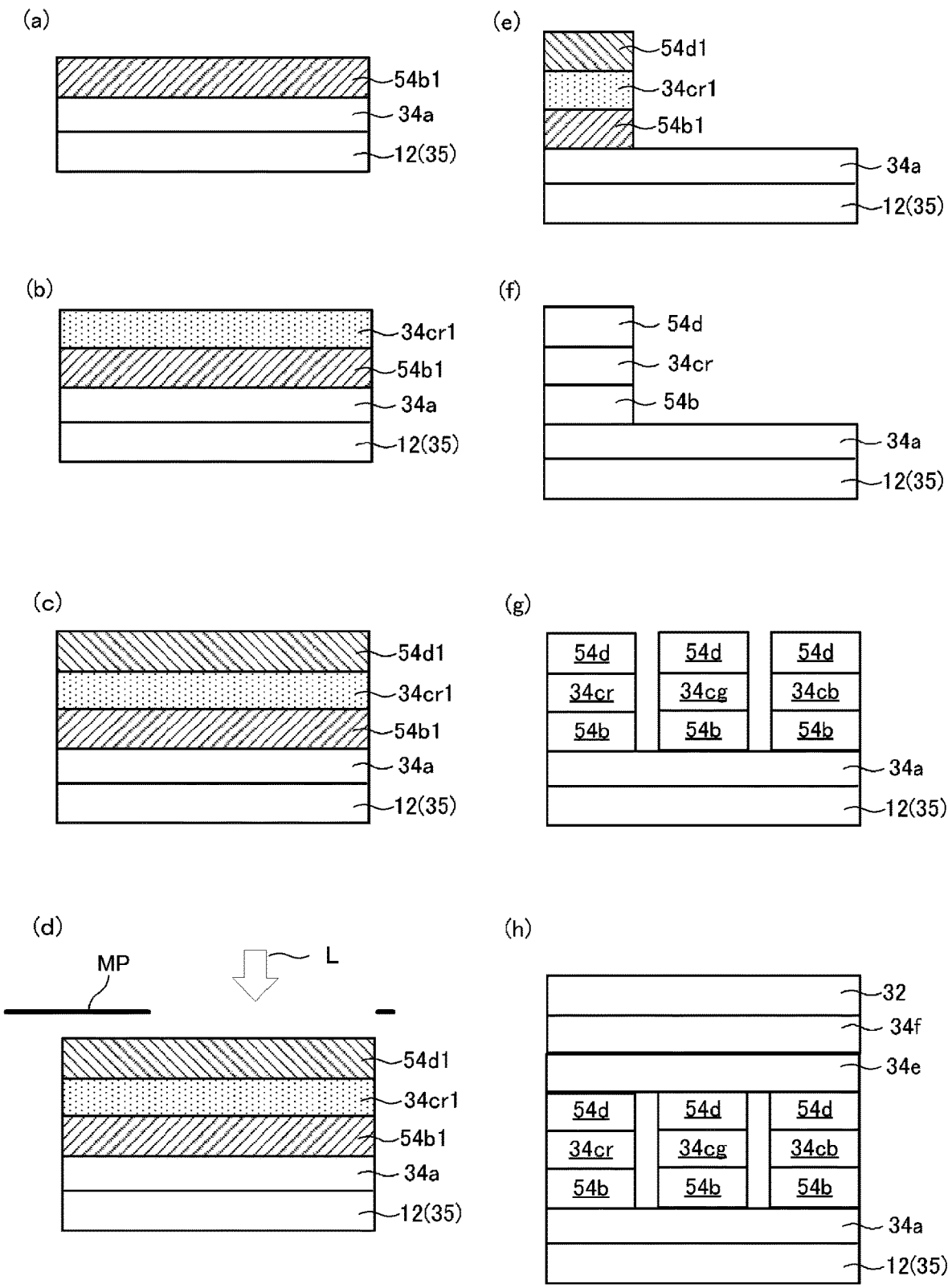
FIG. 33 is a diagram explaining a specific manufacturing process of a configuration of main portions of the display device illustrated in FIG. 32.

Next, a method for manufacturing the display device 2 of the present embodiment will be specifically described with reference to FIG. 33 as well. FIG. 33 is a diagram explaining a specific manufacturing process of a configuration of the main portions of the display device illustrated in FIG. 32. Note that, in FIG. 33, for the sake of simplicity in the drawings, illustration of the first electrode 35 and the edge cover film 23 for each subpixel SP is omitted.

In the method for manufacturing the display device 2 of the present embodiment, as illustrated in steps S1, S2', S3, and S9 in FIG. 15, the barrier layer 3, the thin film transistor layer 4, the first electrode (cathode electrode) 35, the edge cover film 23, and the electron transport layer (ETL) 34a serving as the first charge transport layer are sequentially formed on the base material 12.

Next, the first holding layer (one holding layer) 54b is formed by a dripping technique such as an ink-jet method (step S6' in FIG. 35 described below). Then, the light-emitting layer 34c composed of the quantum dot light-emitting layer is formed by a dripping technique such as an ink-jet method (step S7 in FIG. 15). Subsequently, the second holding layer (other holding layer) 54d is formed by a dripping technique such as an ink-jet method (step S8' in FIG. 35 described below). The one holding layer formation process, the light-emitting layer formation process, and the other holding layer formation process are performed continuously until each intermediate layer is formed, and subsequently the process of forming the light-emitting layer 34c and the pair of holding layers 54b and 54d sandwiching the light-emitting layer 34c is performed for each of the light-emitting elements Xr, Xg, Xb. Note that, in the following description, a case in which the red light-emitting element Xr, the green light-emitting element Xg, and the blue light-emitting element Xb are sequentially formed in this order is illustrated as an example.

Specifically, as illustrated in step S21 in FIG. 16, after the ETL layer formation process (first charge transport layer formation process) is performed, a first solution dripping process in which the first solution including the first photosensitive material and the first conductive nanoparticles is dripped onto the first charge transport layer is performed. Then, as illustrated in step S22 in FIG. 16, a first intermediate layer formation process of drying the solvent in the first solution that has been dripped and thus forming the first intermediate layer of the other holding layer on the first charge transport layer is performed. Specifically, in this first intermediate layer formation process, the first solution on the electron transport layer 34a is baked at a low temperature of about from 50 to 80° C. or vacuum dried, for example, and the solvent of the first solution is evaporated. Then, as illustrated in FIG. 33(a), a first intermediate layer 54b1 of the first holding layer (other holding layer) 54b is formed on the electron transport layer 34a. This first intermediate layer 54b1 is formed at a film thickness of about from several nm to several 10 nm, for example.

Then, as illustrated in step S23 in FIG. 16, a second solution dripping process of dripping a second solution including predetermined quantum dots to be included in the red light-emitting layer 34cr onto the first intermediate layer 54b1 is performed. Then, as illustrated in step S24 in FIG. 16, a second intermediate layer formation process of drying the solvent in the second solution that has been dripped and thus forming the second intermediate layer of the light-emitting layer 34cr on the first intermediate layer 54b1 is performed. Specifically, in this second intermediate layer formation process, the second solution on the first intermediate layer 54b1 is baked at a low temperature of about from 50 to 80° C. or vacuum dried, for example, and the solvent of the second solution is evaporated. Then, as illustrated in FIG. 33(b), the second intermediate layer 34cr1 of the light-emitting layer 34cr is formed on the first intermediate layer 54b1. This second intermediate layer 34cr1 is formed at a film thickness of about from 10 nm to 40 nm, for example.

Next, as illustrated in step S25 in FIG. 16, a third solution dripping process of dripping a third solution including a second photosensitive material and second conductive nanoparticles onto the second intermediate layer 34cr1 is performed. Then, as illustrated in step S26 in FIG. 16, a third intermediate layer formation process of drying the solvent in the third solution that has been dripped and thus forming a third intermediate layer of the one holding layer on the second intermediate layer 34cr1 is performed. Specifically, in this third intermediate layer formation process, the third solution on the second intermediate layer 34cr1 is baked at a low temperature of about from 50 to 80° C. or vacuum dried, for example, and the solvent of the third solution is evaporated. Then, as illustrated in FIG. 33(c), a third intermediate layer 54d1 of the second holding layer (one holding layer) 54d is formed on the second intermediate layer 34cr1.

This third intermediate layer 54d1 is formed at a film thickness of about from several nm to several 10 nm, for example.

Then, as illustrated in step S27 in FIG. 16, a patterning process of patterning the first intermediate layer 54b1, the second intermediate layer 34cr1, and the third intermediate layer 54d1 collectively into each desired shape by sequentially performing an exposure process using a predetermined irradiation light and a development process using a predetermined developing solution on the first intermediate layer 54b1, the second intermediate layer 34cr1, and the third intermediate layer 54d1 is performed. That is, as illustrated in FIG. 33(d), the negative resist mask MN for forming the red light-emitting element Xr is placed above the third intermediate layer 54d1, and the third intermediate layer 54d1 side is irradiated with the ultraviolet light (UV light) L of the i line, the g line, the h line, or the like from an opening provided in the negative resist mask MN. This completes the exposure process, and thus the portion irradiated with the ultraviolet light is insoluble due to a cross-linking reaction, a polymerization reaction, a condensation reaction, or the like. Subsequently, by rinsing with an alkaline developing solution such as TMAH or KOH or a developing solution such as an organic solvent such as PGMEA or ethanol, each portion of the first intermediate layer 54b1, the second intermediate layer 34cr1, and the third intermediate layer 54d1 irradiated with the ultraviolet light remains as a permanent film, and each portion not irradiated with the ultraviolet light flows down with the developing solution, as illustrated in FIG. 33(e).

Next, as illustrated in step S28 in FIG. 16, a formation process of curing the first intermediate layer 54b1, the second intermediate layer 34cr1, and the third intermediate layer 54d1 thus patterned, thereby forming, on the first charge transport layer (electron transport layer 34a), the light-emitting layer 34cr and the pair of holding layers 54b, 54d sandwiching the light-emitting layer 34cr is performed. In this formation process, the first intermediate layer 54b1, the second intermediate layer 34cr1, and the third intermediate layer 54d1 thus patterned are baked at, for example, about from 50 to 130° C., thereby forming the light-emitting layer 34cr and the pair of holding layers (that is, first holding layer 54b and second holding layer 54d) sandwiching the light-emitting layer 34cr in the light-emitting element Xr on the electron transport layer 34a, as illustrated in FIG. 33(f).

Then, the first solution dripping process, the first intermediate layer formation process, the second solution dripping process, the second intermediate layer formation process, the third solution dripping process, the third intermediate layer formation process, the patterning process, and the formation process are repeated sequentially. As a result, as illustrated in FIG. 33(g), the light-emitting layer 34cg and the pair of holding layers (that is, first holding layer 54b and second holding layer 54d) sandwiching the light-emitting layer 34cg in the green light-emitting element Xg are formed, and furthermore the light-emitting layer 34cb and the pair of holding layers (that is, first holding layer 54b and second holding layer 54d) sandwiching the light-emitting layer 34cb in the blue light-emitting element Xb are formed. As a result, in the present embodiment, the dripping technique and the photolithography method are combined to form a pixel pattern corresponding to the three colors RGB, and the separate-patterning of RGB is completed.

Next, as illustrated in FIG. 15 and FIG. 16, the hole transport layer (HTL) 34e serving as the second charge transport layer, for example, is formed by a dripping technique such as an ink-jet method or a spin-coating method (step S5). Then, the hole injection layer (HIL) 34f is formed on this hole transport layer 34e (step S4). Subsequently, the second electrode (anode electrode) 32 is formed on the hole injection layer 34f using, for example, a sputtering method and a photolithography method (step S10'). As a result, as illustrated in FIG. 33(h), the display device 2 including the light-emitting elements Xr, Xg, and Xb of RGB is manufactured.

With the above configuration, the present embodiment can achieve actions and effects similar to those of the ninth embodiment.

Fourteenth Embodiment

Figure 34:
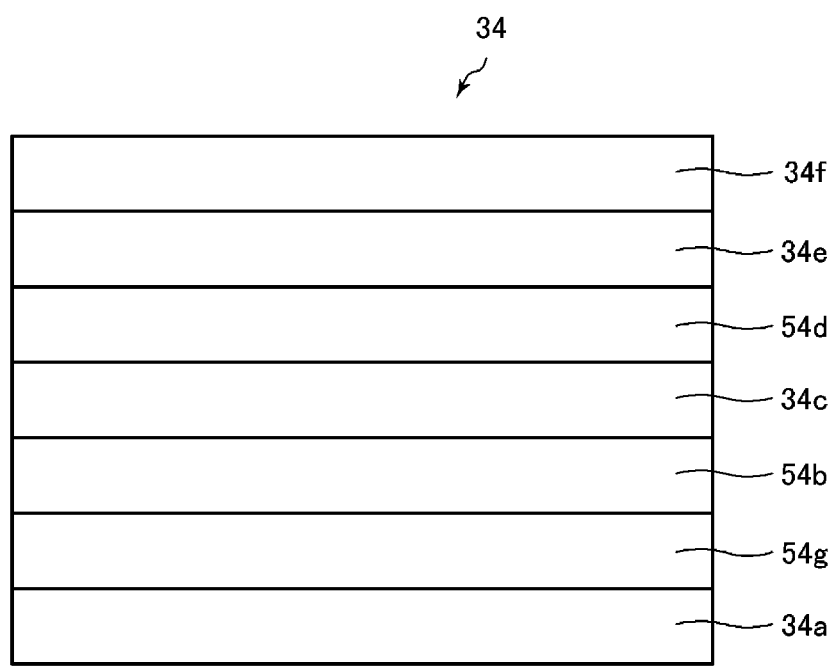
FIG. 34 is a cross-sectional view illustrating a specific configuration of a function layer of a display device according to a fourteenth embodiment of the disclosure.

FIG. 34 is a cross-sectional view illustrating a specific configuration of a function layer of a display device according to a fourteenth embodiment of the disclosure. In the drawing, a main difference between the present embodiment and the thirteenth embodiment described above is that a second mixing holding layer is provided between the other holding layer and the electron transport layer. Note that elements common to those in the thirteenth embodiment are denoted by the same reference signs, and duplicate description thereof will be omitted.

In the display device 2 of the present embodiment, as illustrated in FIG. 34, the function layer 34 includes the electron transport layer 34a, a second underlayer 54 g, the first holding layer 54b, the light-emitting layer 34c, the second holding layer 54d, the hole transport layer 34e, and the hole injection layer 34f.

The second underlayer 54g is provided between the electron transport layer 34a and the first holding layer (other holding layer) 54b, and functions as a second mixing prevention layer that prevents each functional material of the electron transport layer 34a and the first holding layer 54b from mixing together. That is, the second underlayer 54g prevents the mixing of the electron transport material in the electron transport layer 34a and the photosensitive material in the first holding layer 54b and thus the occurrence of a mixed layer. In particular, when the electron transport material and the photosensitive material are both organic materials, for example, the mixed layer described above can readily occur, but with the second underlayer 54g being interposed, the occurrence of such a mixed layer can be reliably prevented.

Next, a method for manufacturing the display device 2 of the present embodiment will be specifically described with reference to FIG. 35 as well. FIG. 35 is a flowchart illustrating a method for manufacturing the display device illustrated in FIG. 34.

Figure 35:
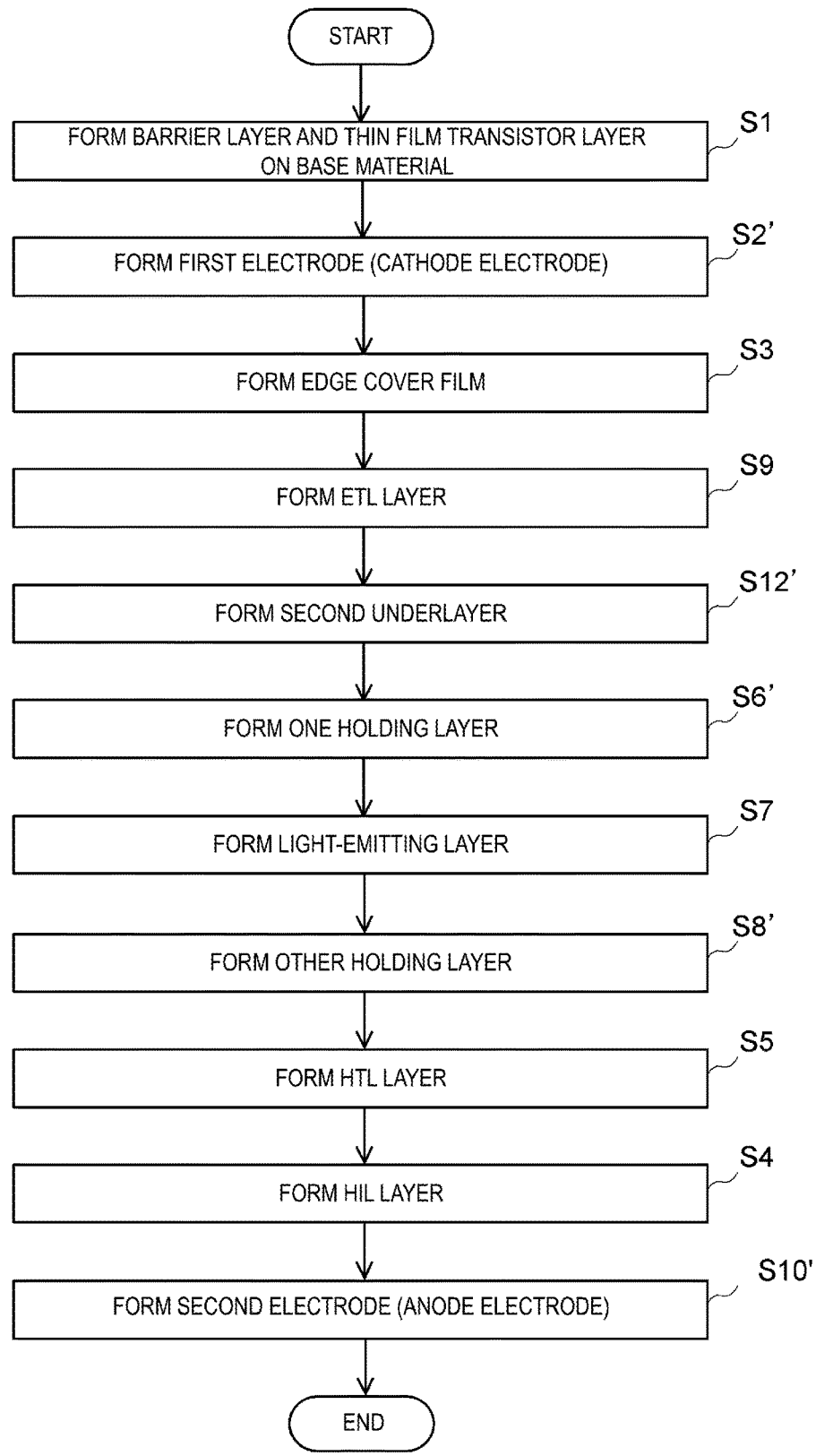
FIG. 35 is a flowchart illustrating a method for manufacturing the display device illustrated in FIG. 34.

As illustrated in step S12' in FIG. 35, in the present embodiment, after the electron transport layer formation process, a second underlayer formation process of forming the second underlayer 54g on the electron transport layer 34a is performed by a dripping technique such as, for example, an ink-jet method. Specifically, in the second underlayer formation process, for example, a high-polarity solvent such as PGMEA, for example, is used as a solvent included in the solution for second underlayer formation, and this solution for second underlayer formation includes a photoinitiator (naphthoquinone photoacid generator, for example) at about 1 to 10%, and an additive such as a coupling material for improving adhesion, for example. Further, a solute, that is, underlayer material (functional material), in the solution for second underlayer formation is selected from the group consisting of nanoparticles of zinc oxide (ZnO) or magnesium-doped zinc oxide (MgZnO) or structural particles by a sol-gel method, for example. Then, in this second underlayer formation process, the second underlayer 54g having a film thickness of, for example, from several nm to 10 nm is formed by baking, at a predetermined temperature, the solution for second underlayer formation that has been dripped onto the electron transport layer 34a.

Note that, when nanoparticles of zinc oxide (ZnO) or magnesium-doped zinc oxide (MgZnO) or structural particles by a sol-gel method, for example, are used as the underlayer material of the second underlayer 54g, the second underlayer 54g and the first holding layer 54b can be integrally configured, or the second underlayer 54g, the first holding layer 54b, and the electron transport layer 34a can be integrally configured.

With the above configuration, the present embodiment can achieve actions and effects similar to those of the thirteenth embodiment. Further, in the present embodiment, the second underlayer (second mixing prevention layer) 54g is provided, making it possible to prevent the occurrence of a mixed layer of the electron transport material in the electron transport layer 34a and the photosensitive material in the first holding layer 54b, and prevent deterioration of the patterning performance with respect to the first holding layer 54b. As a result, in the present embodiment, the light-emitting layer 34c having a desired shape and film thickness can be easily formed, and the display device 2 having excellent light emission performance can be easily manufactured.

Fifteenth Embodiment

Figure 36:
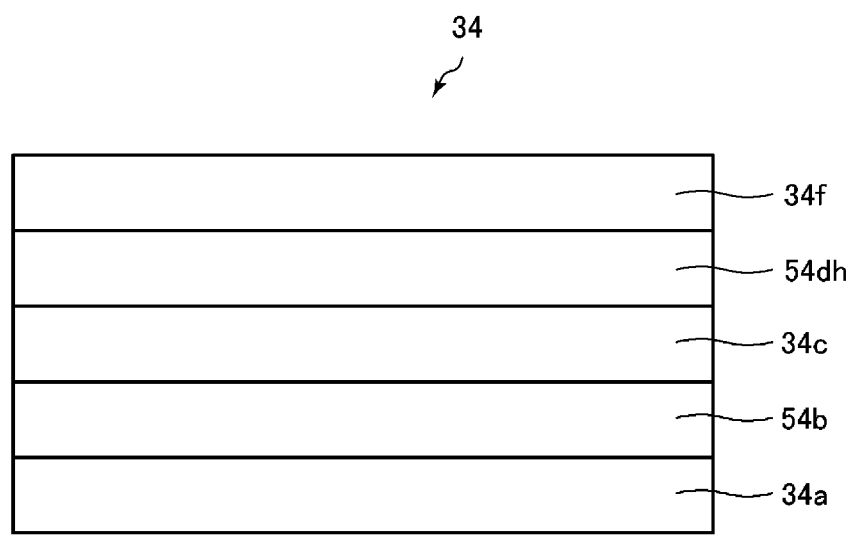
FIG. 36 is a cross-sectional view illustrating a specific configuration of a function layer of a display device according to a fifteenth embodiment of the disclosure.

FIG. 36 is a cross-sectional view illustrating a specific configuration of a function layer of a display device according to a fifteenth embodiment of the disclosure. In the drawing, a main difference between the present embodiment and the thirteenth embodiment described above is integration of the one holding layer and the hole transport layer. Note that elements common to those in the thirteenth embodiment are denoted by the same reference signs, and duplicate description thereof will be omitted.

In the display device 2 of the present embodiment, as illustrated in FIG. 36, the function layer 34 includes the electron transport layer 34a, the first holding layer 54b formed of a photosensitive material and conductive nanoparticles, the light-emitting layer 34c, a second holding layer 54dh, and the hole injection layer 34f. The second holding layer 54dh has a function of the hole transport layer, and constitutes the one holding layer that also serves as the hole transport layer.

Figure 37:
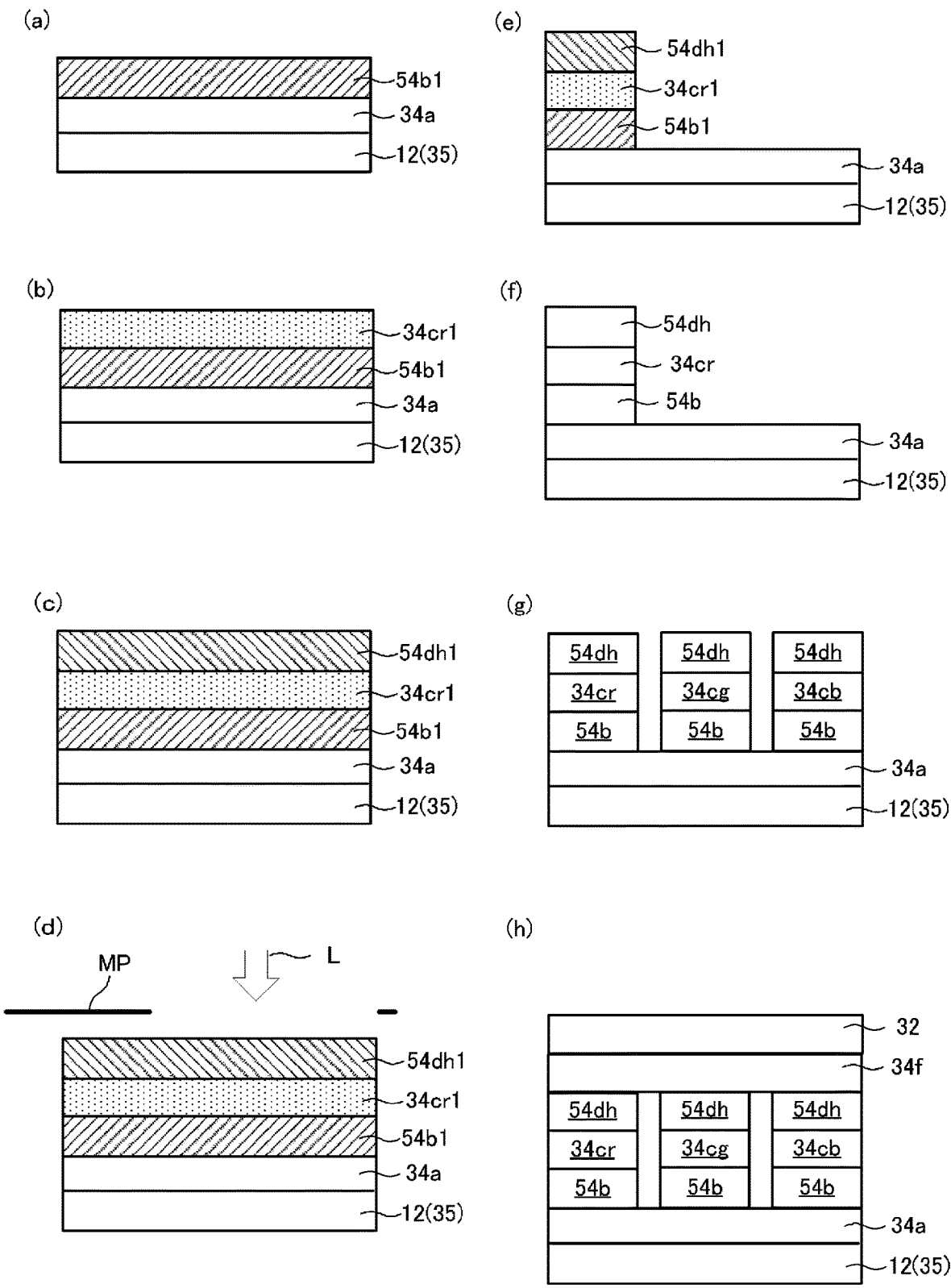
FIG. 37 is a diagram explaining a specific manufacturing process of a configuration of main portions of the display device illustrated in FIG. 36.

Next, a method for manufacturing the display device 2 of the present embodiment will be specifically described with reference to FIG. 37 as well. FIG. 37 is a diagram explaining a specific manufacturing process of a configuration of the main portions of the display device illustrated in FIG. 36. Note that, in FIG. 37, for the sake of simplicity in the drawings, illustration of the first electrode 35 and the edge cover film 23 for each subpixel SP is omitted.

As illustrated in FIG. 37(c), in the present embodiment, the third intermediate layer 34dh1 of the second holding layer (one holding layer) 54dh is formed on the second intermediate layer 34cr1 of the light-emitting layer 34cr. This third intermediate layer 34dh1 is formed at a film thickness of about from several nm to 10 nm, for example. Specifically, after the second intermediate layer formation process (step S24) is performed, a solution dripping process of dripping a solution for third intermediate layer formation including a functional material having a photosensitive function and a hole transport function onto the second intermediate layer 34cr1 is performed. Note that FIG. 37(a) and FIG. 37(b) are the same processes as those in FIG. 33(a) and FIG. 33(b) in the thirteenth embodiment, respectively.

For example, OTPD is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for third intermediate layer formation in which these functional materials are the solute, the same solvent as in the third solution described above can be used, and the same photoinitiator and/or additive as in the third solution may be included.

Then, following the solution dripping process described above, the solution for third intermediate layer formation on the second intermediate layer 34cr1 is, for example, baked at a low temperature of about from 50 to 80° C. or vacuum dried, thereby evaporating the solvent of the solution for third intermediate layer formation to form a third intermediate layer 54dh1 on the second intermediate layer 34cr1.

Subsequently, as illustrated in FIG. 37(d) to FIG. 37(h), the patterning process and the formation process are performed as in the case of the thirteenth embodiment, thereby forming the light-emitting layer 34cr and the pair of holding layers 54b and 54dh sandwiching the light-emitting layer 34cr in the light-emitting element Xr. Next, a similar process is performed for the light-emitting element Xg and the light-emitting element Xb, thereby providing the light-emitting layer 34cg and the pair of holding layers 54b and 54dh sandwiching the light-emitting layer 34cg in the light-emitting element Xg, and the light-emitting layer 34cb and the pair of holding layers 54b and 54dh sandwiching the light-emitting layer 34cb in the light-emitting element Xb, and subsequently providing the hole injection layer 34f and the second electrode (anode electrode) 32.

With the above configuration, the present embodiment can achieve actions and effects similar to those of the thirteenth embodiment. Further, in the present embodiment, the second holding layer 54dh, which also serves as the hole transport layer, is provided, thereby simplifying the manufacturing process while reducing the number of components of the display device 2.

Sixteenth Embodiment

Figure 38:
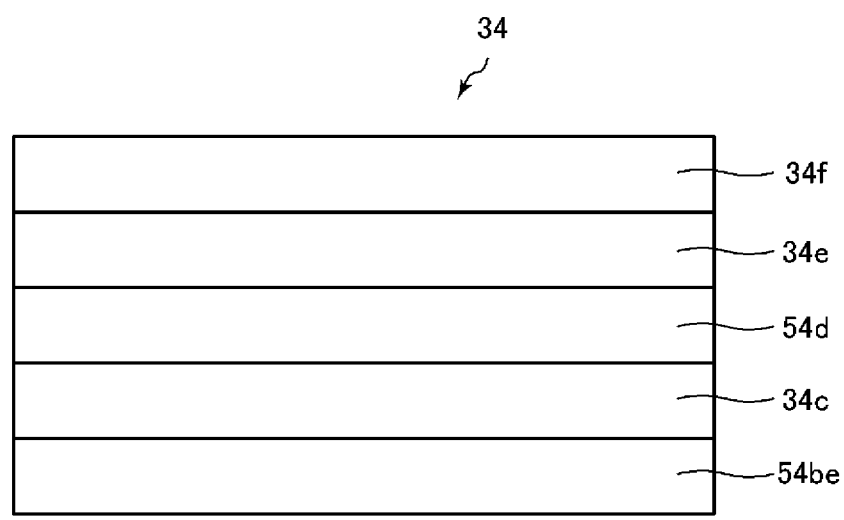
FIG. 38 is a cross-sectional view illustrating a specific configuration of a function layer of a display device according to a sixteenth embodiment of the disclosure.

FIG. 38 is a cross-sectional view illustrating a specific configuration of a function layer of a display device according to a sixteenth embodiment of the disclosure. In the drawing, a main difference between the present embodiment and the thirteenth embodiment described above is integration of the other holding layer and the electron transport layer. Note that elements common to those in the thirteenth embodiment are denoted by the same reference signs, and duplicate description thereof will be omitted.

In the display device 2 of the present embodiment, as illustrated in FIG. 38, the function layer 34 includes a first holding layer 54be, the light-emitting layer 34c, the second holding layer 54d formed of a photosensitive material and conductive nanoparticles, the hole transport layer 34e, and the hole injection layer 34f. The first holding layer 54be has a function of the electron transport layer, and constitutes the other holding layer that also serves as the electron transport layer.

Figure 39:
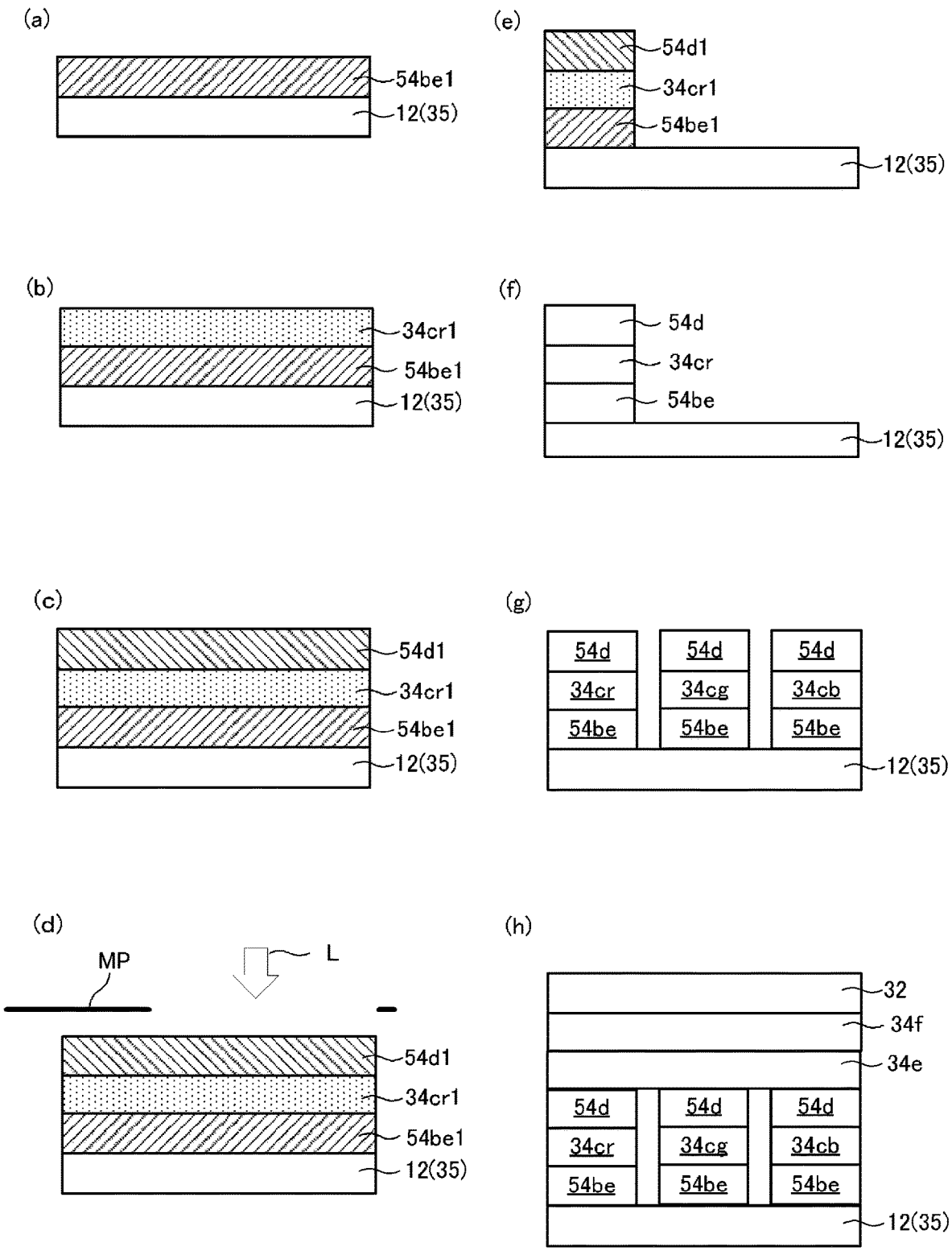
FIG. 39 is a diagram explaining a specific manufacturing process of a configuration of main portions of the display device illustrated in FIG. 38.

Next, a method for manufacturing the display device 2 of the present embodiment will be specifically described with reference to FIG. 39 as well. FIG. 39 is a diagram explaining a specific manufacturing process of a configuration of the main portions of the display device illustrated in FIG. 38. Note that, in FIG. 39, for the sake of simplicity in the drawings, illustration of the first electrode 35 and the edge cover film 23 for each subpixel SP is omitted.

As illustrated in FIG. 39(a), in the present embodiment, a first intermediate layer 54be1 of the first holding layer (other holding layer) 54be is formed on the first electrode (cathode electrode) 35. This first intermediate layer 54be1 is formed at a film thickness of about from several nm to 10 nm, for example. Specifically, after the first electrode (cathode electrode) formation process (step S2') is performed, a solution dripping process of dripping a solution for first intermediate layer formation including a functional material and first conductive nanoparticles having a photosensitive function and an electron transport function onto the first electrode (cathode electrode) 35 is performed.

As the functional material having a photosensitive function and an electron transport function, a combined material obtained by combining the first photosensitive material described above and an electron transport material such as nanoparticles of zinc oxide (ZnO) or magnesium-doped zinc oxide (MgZnO) or structural particles by a sol-gel method is used, for example. Further, in the solution for first intermediate layer formation in which these functional materials serve as the solute, the same solvent as in the first solution described above can be used, and the same photoinitiator and/or additive as in the first solution may be included.

The first conductive nanoparticles include, for example, metal nanoparticles. The metal nanoparticles desirably have transparency. A metal constituting the metal nanoparticles may be either a pure metal or an alloy. The metal includes, for example, at least one type selected from the group consisting of Ag, Au, Cu, Al, Fe, and Ti. The first conductive nanoparticles are dispersed in the solution for first intermediate layer formation.

Then, following the solution dripping process described above, the solution for first intermediate layer formation on the first electrode (cathode electrode) 35 is, for example, baked at a low temperature of about from 50 to 80° C. or vacuum dried, thereby evaporating the solvent of the solution for first intermediate layer formation to form the first intermediate layer 54be1 on the first electrode (cathode electrode) 35.

Then, as illustrated in FIG. 39(b) and FIG. 39(c), as in FIG. 33(b) and FIG. 33(c) of the thirteenth embodiment, respectively, the second intermediate layer 34cr1 and the third intermediate layer 54d1 are sequentially formed on the first intermediate layer 54be1.

Subsequently, as illustrated in FIG. 39(d) to FIG. 39(h), the patterning process and the formation process are performed as in the case of the thirteenth embodiment, thereby forming the light-emitting layer 34cr and the pair of holding layers 54be and 54d sandwiching the light-emitting layer 34cr in the light-emitting element Xr. Next, a similar process is performed for the light-emitting element Xg and the light-emitting element Xb, thereby providing the light-emitting layer 34cg and the pair of holding layers 54be and 54d sandwiching the light-emitting layer 34cg in the light-emitting element Xg, and the light-emitting layer 34cb and the pair of holding layers 54be and 54d sandwiching the light-emitting layer 34cb in the light-emitting element Xb, and subsequently providing the second electrode (anode electrode) 32.

With the above configuration, the present embodiment can achieve actions and effects similar to those of the thirteenth embodiment. Further, in the present embodiment, the first holding layer 54be, which also serves as the electron transport layer, is provided, thereby simplifying the manufacturing process while reducing the number of components of the display device 2.

Seventeenth Embodiment

Figure 40:
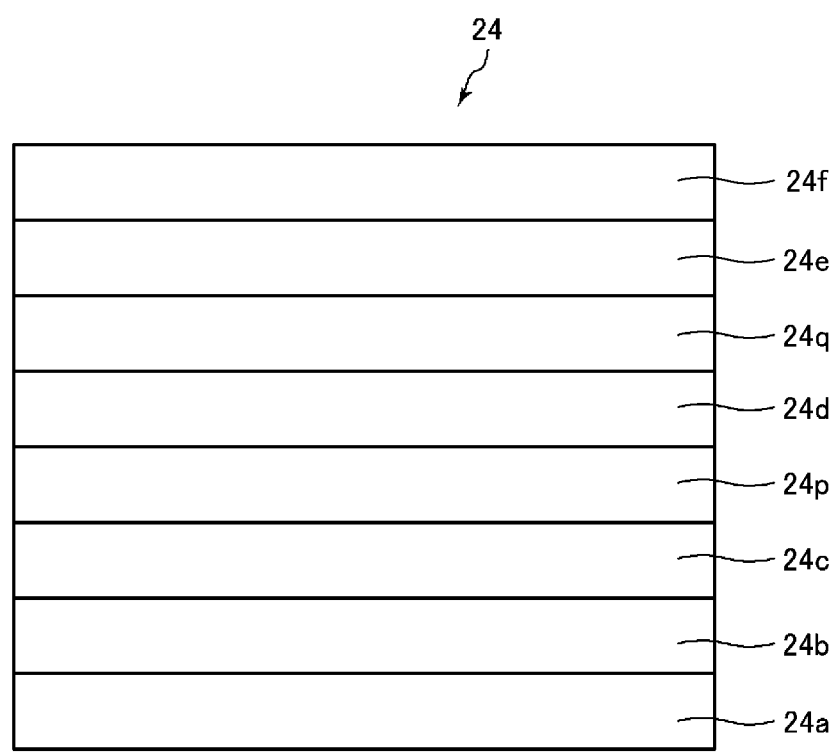
FIG. 40 is a cross-sectional view illustrating a specific configuration of a function layer of a display device according to a seventeenth embodiment of the disclosure.

FIG. 40 is a cross-sectional view illustrating a specific configuration of a function layer of a display device according to a seventeenth embodiment of the disclosure. In the drawing, a main difference between the present embodiment and the first embodiment described above is that a first high-resistivity layer is provided between the light-emitting layer and the one holding layer, and a second high-resistivity layer is provided between the light-emitting layer and the other holding layer. Note that elements common to those in the first embodiment are denoted by the same reference signs, and duplicate description thereof will be omitted.

In the display device 2 of the present embodiment, as illustrated in FIG. 40, the function layer 24 includes the hole injection layer 24a, the hole transport layer 24b, the first holding layer 24c, a first high-resistivity layer 24p, the light-emitting layer 24d, a second high-resistivity layer 24q, the second holding layer 24e, and the electron transport layer 24f.

The first high-resistivity layer 24p is provided between the light-emitting layer 24d and the first holding layer 24c. The second high-resistivity layer 24q is provided between the light-emitting layer 24d and the second holding layer 24e. Each of the first high-resistivity layer 24p and the second high-resistivity layer 24q has a resistivity higher than that of the light-emitting layer 24d. The first high-resistivity layer 24p and the second high-resistivity layer 24q suppress quenching in which electrons and holes are recombined before the light-emitting layer 24d emits light from occurring at an interface between the light-emitting layer 24d and another layer.

A photosensitive material is used for each of the first high-resistivity layer 24p and the second high-resistivity layer 24q. The first high-resistivity layer 24p and the second high-resistivity layer 24q include the negative resist material described above as a photosensitive material. In the present embodiment, the same type of photosensitive material is used for each of the first high-resistivity layer 24p and the second high-resistivity layer 24q. Further, in the first holding layer 24c and the second holding layer 24e, the same type of photosensitive material as the photosensitive material used in the first high-resistivity layer 24p and the second high-resistivity layer 24q is used.

Figure 41:
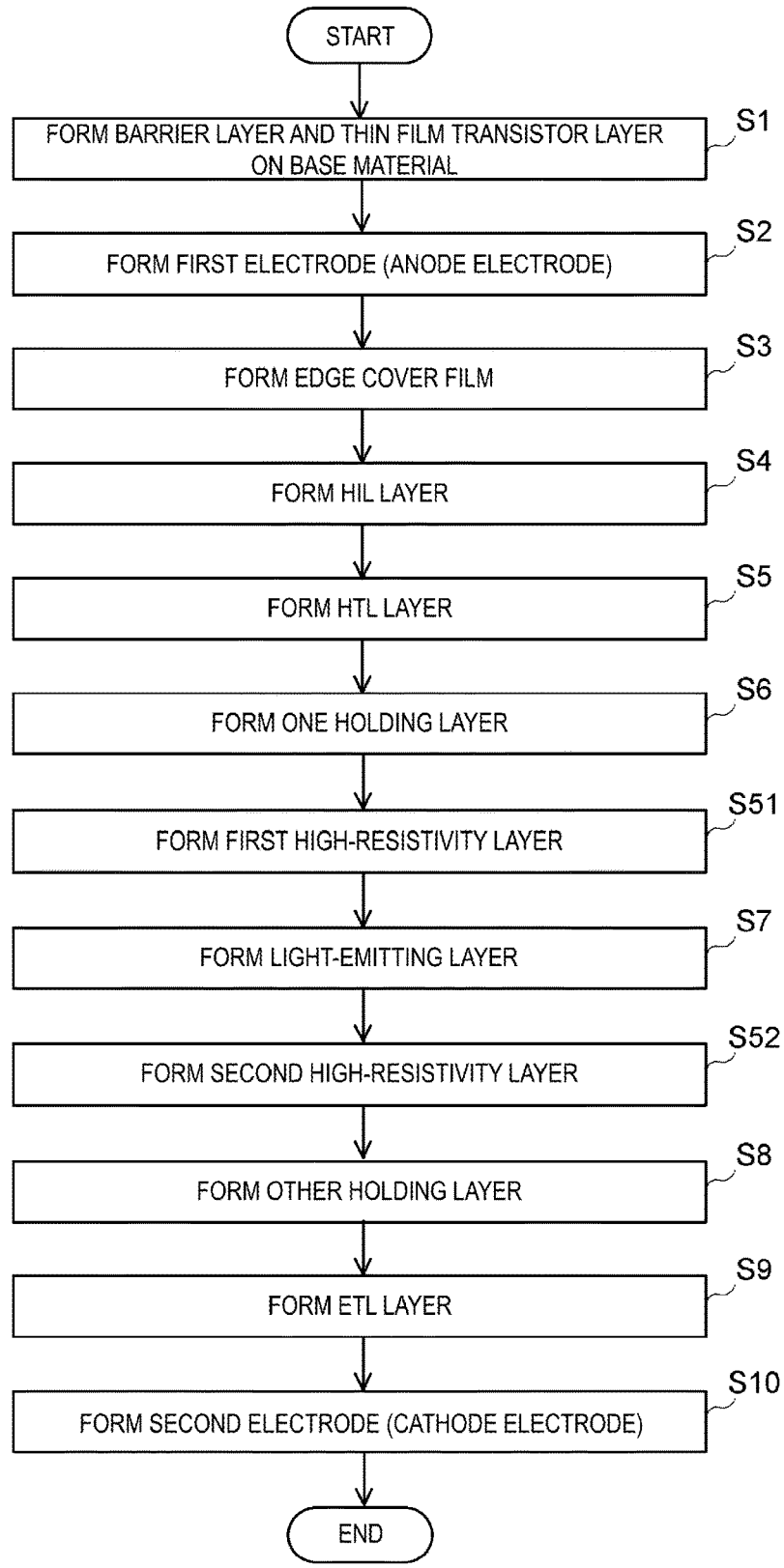
FIG. 41 is a flowchart illustrating a method for manufacturing the display device illustrated in FIG. 40.
Figure 42:
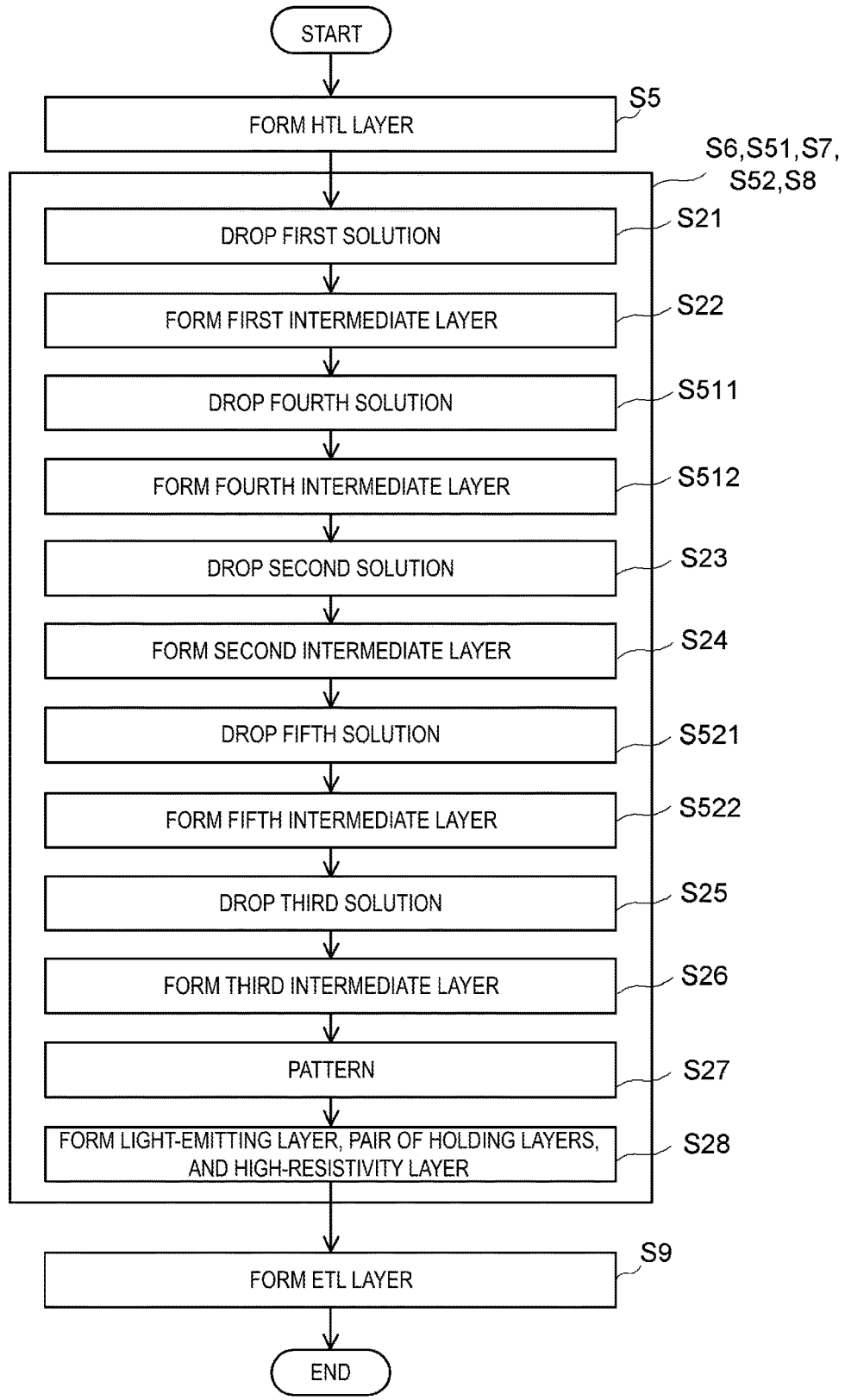
FIG. 42 is a flowchart illustrating a specific method for manufacturing a configuration of main portions of the display device illustrated in FIG. 40.

Next, a method for manufacturing the display device 2 of the present embodiment will be specifically described with reference to FIG. 41, FIG. 42, and FIG. 43A to FIG. 43J as well. FIG. 41 is a flowchart illustrating a method for manufacturing the display device illustrated in FIG. 40. FIG. 42 is a flowchart illustrating a specific method for manufacturing a configuration of main portions of the display device illustrated in FIG. 40. FIG. 43A to FIG. 43J are diagrams explaining a specific manufacturing process of a configuration of the main portions of the display device illustrated in FIG. 40. Note that, in FIG. 43A to FIG. 43J, for the sake of simplicity in the drawings, illustration of the first electrode 22 and the edge cover film 23 for each subpixel SP is omitted.

As illustrated in step S51 in FIG. 41, in the present embodiment, a first high-resistivity layer formation process of forming the first high-resistivity layer 24p on the first holding layer 24c is performed by a dripping technique such as, for example, an ink-jet method. As illustrated in step S52 in FIG. 41, in the present embodiment, a second high-resistivity layer formation process of forming the second high-resistivity layer 24q on the light-emitting layer 24d is performed by a dripping technique such as, for example, an ink-jet method. The one holding layer formation process, the first high-resistivity layer formation process, the light-emitting layer formation process, the second high-resistivity formation process, and the other holding layer formation process are performed continuously until each intermediate layer is formed, and subsequently the process of forming the light-emitting layer 24d, the pair of holding layers 24c and 24e that sandwich the light-emitting layer 24d, and the first high-resistivity layer 24p and the second high-resistivity layer 24q provided between the light-emitting layer 24d and the pair of holding layers 24c and 24e is performed for each of the light-emitting elements Xr, Xg, Xb.

Specifically, as illustrated in step S511 in FIG. 42, after the first intermediate layer formation process is performed, a fourth solution dripping process in which a fourth solution including the third photosensitive material is dripped onto the first intermediate layer 24c1 is performed.

A resin component of the third photosensitive material (negative resist material) is selected from the group consisting of, for example, an acrylic resin, an epoxy resin, a phenolic resin, a fluorine resin, a siloxane compound including a photopolymerizable group, a polysilane, and OTPD. Furthermore, a high-polarity solvent such as PGMEA, for example, is used as the solvent of the fourth solution (solution for first high-resistivity layer formation), and this fourth solution includes, for example, a photoinitiator (photo-radical polymerization initiator represented by acetophenone and acyloxime types used for acrylic oligomers or monomers such as special acrylates, a sulfonium salt-based photoinitiator used for monomers such as alicyclic epoxies, an iodonium salt-based photoinitiator, a photo-cationic polymerization initiator such as a non-ionic photoinitiator, or a photoanionic polymerization initiator used for epoxy monomers, for example) at about 1 to 10%, and an additive such as a coupling material for improving adhesion, for example.

Figure 43A:
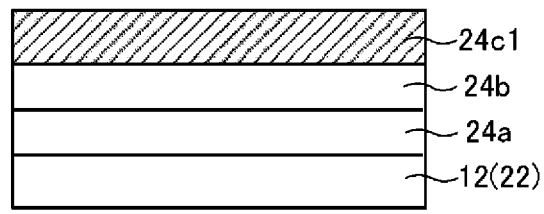
FIG. 43A is a diagram explaining a specific manufacturing process of a configuration of the main portions of the display device illustrated in FIG. 40.
Figure 43B:
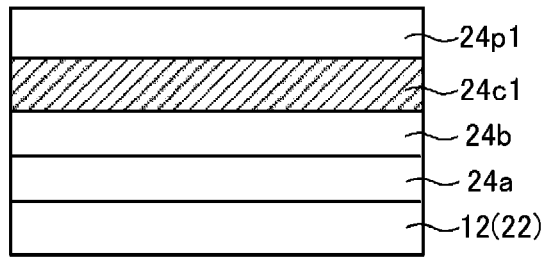
FIG. 43B is a diagram explaining a specific manufacturing process of a configuration of the main portions of the display device illustrated in FIG. 40.
Figure 43C:
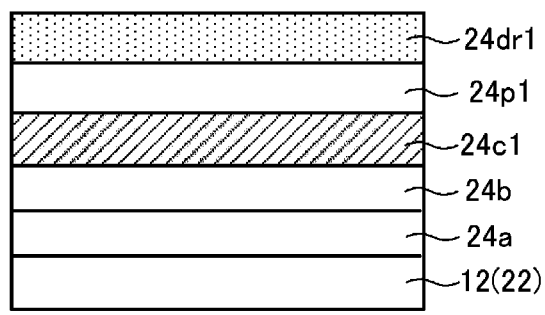
FIG. 43C is a diagram explaining a specific manufacturing process of a configuration of the main portions of the display device illustrated in FIG. 40.

Next, as illustrated in step S512 in FIG. 42, a fourth intermediate layer formation process of drying the solvent in the fourth solution that has been dripped and thus forming the fourth intermediate layer of the first high-resistivity layer on the first intermediate layer is performed. Specifically, in this fourth intermediate layer formation process, the fourth solution on the first intermediate layer 24c1 is baked at a low temperature of about from 50 to 130° C. or vacuum dried, for example, and the solvent of the fourth solution is evaporated. As illustrated in FIG. 43B, a fourth intermediate layer 24p1 of the first high-resistivity layer 24p is formed on the first intermediate layer 24c1.

As illustrated in step S521 in FIG. 42, after the second intermediate layer formation process is performed, a fifth solution dripping process in which a fifth solution including the fourth photosensitive material is dripped onto the second intermediate layer 24dr1 is performed.

A resin component of the fourth photosensitive material (negative resist material) is selected from the group consisting of, for example, an acrylic resin, an epoxy resin, a phenolic resin, a fluorine resin, a siloxane compound including a photopolymerizable group, a polysilane, and OTPD. Furthermore, a high-polarity solvent such as PGMEA, for example, is used as the solvent of the fifth solution (solution for second high-resistivity layer formation), and this fifth solution includes, for example, a photoinitiator (photoradical polymerization initiator represented by acetophenone and acyloxime types used for acrylic oligomers or monomers such as special acrylates, a sulfonium salt-based photoinitiator used for monomers such as alicyclic epoxies, an iodonium salt-based photoinitiator, a photo-cationic polymerization initiator such as a non-ionic photoinitiator, or a photoanionic polymerization initiator used for epoxy monomers, for example) at about 1 to 10%, and an additive such as a coupling material for improving adhesion, for example.

Figure 43D:
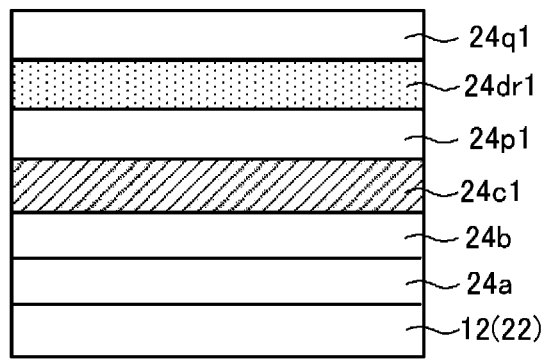
FIG. 43D is a diagram explaining a specific manufacturing process of a configuration of the main portions of the display device illustrated in FIG. 40.
Figure 43E:
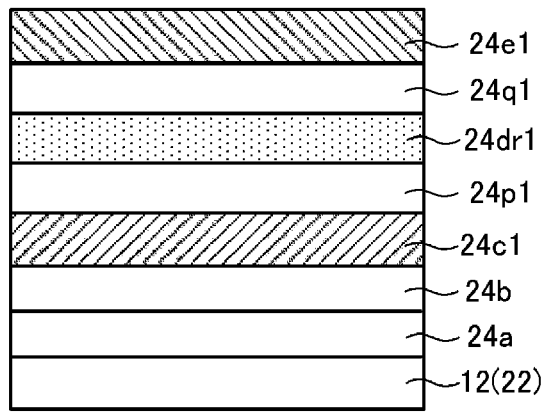
FIG. 43E is a diagram explaining a specific manufacturing process of a configuration of the main portions of the display device illustrated in FIG. 40.

Next, as illustrated in step S522 in FIG. 42, a fifth intermediate layer formation process of drying the solvent in the fifth solution that has been dripped and thus forming the fifth intermediate layer of the second high-resistivity layer on the second intermediate layer is performed. Specifically, in this fifth intermediate layer formation process, the fifth solution on the second intermediate layer 24$dr$1 is baked at a low temperature of about from 50 to 130° C. or vacuum dried, for example, and the solvent of the fifth solution is evaporated. Then, as illustrated in FIG. 43D, a fifth intermediate layer 24$q$1 of the second high-resistivity layer 24$q$ is formed on the second intermediate layer 24$dr$1.

Figure 43F:
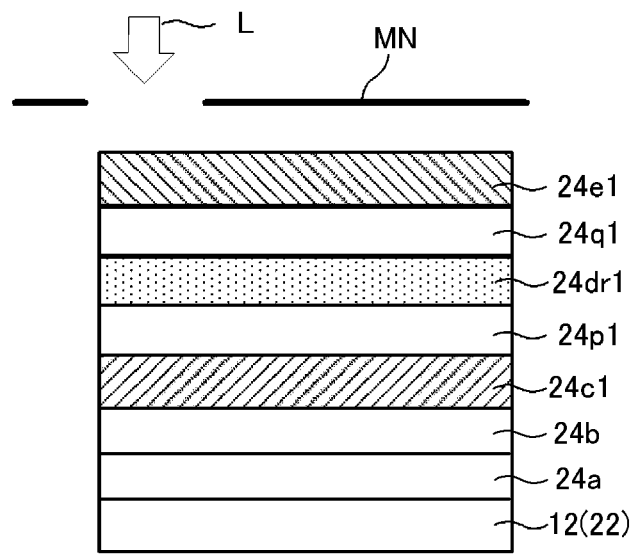
FIG. 43F is a diagram explaining a specific manufacturing process of a configuration of the main portions of the display device illustrated in FIG. 40.
Figure 43G:
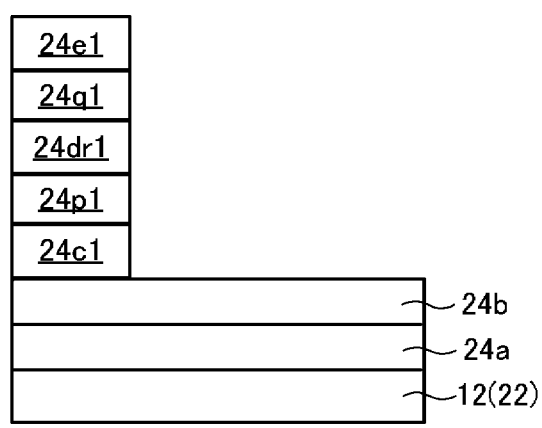
FIG. 43G is a diagram explaining a specific manufacturing process of a configuration of the main portions of the display device illustrated in FIG. 40.

As illustrated in step S27 of FIG. 42, a patterning process of patterning the first intermediate layer 24$c$1, the fourth intermediate layer 24$p$1, the second intermediate layer 24$dr$1, the fifth intermediate layer 24$q$1, and the third intermediate layer 24$e$1 collectively into each desired shape by sequentially performing an exposure process using a predetermined irradiation light and a development process using a predetermined developing solution on the first intermediate layer 24$c$1, the fourth intermediate layer 24$p$1, the second intermediate layer 24$dr$1, the fifth intermediate layer 24$q$1, and the third intermediate layer 24$e$1 is performed. That is, as illustrated in FIG. 43F, a negative resist mask MN for forming the red light-emitting element Xr is placed above the third intermediate layer 24$e$1, and the third intermediate layer 24$e$1 side is irradiated with ultraviolet light (UV light) L of the i line, the g line, the h line, or the like from an opening provided in the negative resist mask MN. This completes the exposure process, and thus the portion irradiated with the ultraviolet light is insoluble due to a cross-linking reaction, a polymerization reaction, a condensation reaction, or the like. Subsequently, by rinsing with a developing solution such as an alkaline developing solution such as tetramethylammonium hydroxide (TMAH) or potassium hydroxide (KOH) or an organic solvent such as PGMEA or ethanol, each portion of the first intermediate layer 24$c$1, the fourth intermediate layer 24$p$1, the second intermediate layer 24$dr$1, the fifth intermediate layer 24$q$1, and the third intermediate layer 24$e$1 irradiated with the ultraviolet light remains as a permanent film, and each portion not irradiated with the ultraviolet light flows down with the developing solution, as illustrated in FIG. 43G.

Figure 43H:
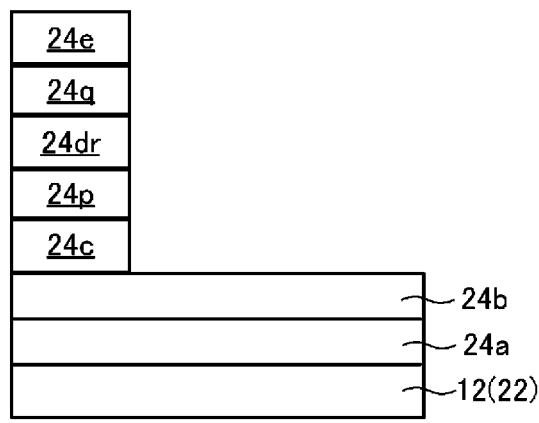
FIG. 43H is a diagram explaining a specific manufacturing process of a configuration of the main portions of the display device illustrated in FIG. 40.

Next, as illustrated in step S28 in FIG. 42, a formation process of curing the first intermediate layer 24$c$1, the fourth intermediate layer 24$p$1, the second intermediate layer 24$dr$1, the fifth intermediate layer 24$q$1, and the third intermediate layer 24$e$1 thus patterned, thereby forming, on the first charge transport layer (hole transport layer 24$b$), the light-emitting layer 24$dr$, the pair of holding layers 24$c$ and 24$e$ sandwiching the light-emitting layer 24$dr$, and the first high-resistivity layer 24$p$ and the second high-resistivity layer 24$q$ provided between the light-emitting layer 24$dr$ and the pair of holding layers 24$c$ and 24$e$ is performed. In this formation process, the first intermediate layer 24$c$1, the fourth intermediate layer 24$p$1, the second intermediate layer 24$dr$1, the fifth intermediate layer 24$q$1, and the third intermediate layer 24$e$1 thus patterned are baked at, for example, about from 80 to 150° C., thereby forming the light-emitting layer 24$dr$ of the light-emitting element Xr, the pair of holding layers (that is, first holding layer 24$c$ and second holding layer 24$e$) sandwiching the light-emitting layer 24$dr$, and the first high-resistivity layer 24$p$ and the second high-resistivity layer 24$q$ provided between the light-emitting layer 24$dr$ and the pair of holding layers 24$c$ and 24$e$ on the hole transport layer 24$b$, as illustrated in FIG. 43H.

Figure 43I:
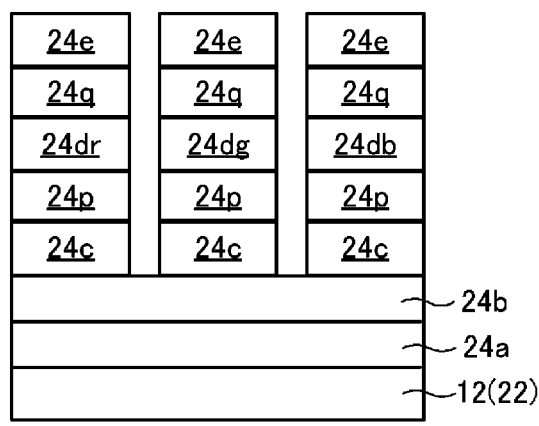
FIG. 43I is a diagram explaining a specific manufacturing process of a configuration of the main portions of the display device illustrated in FIG. 40.
Figure 43J:
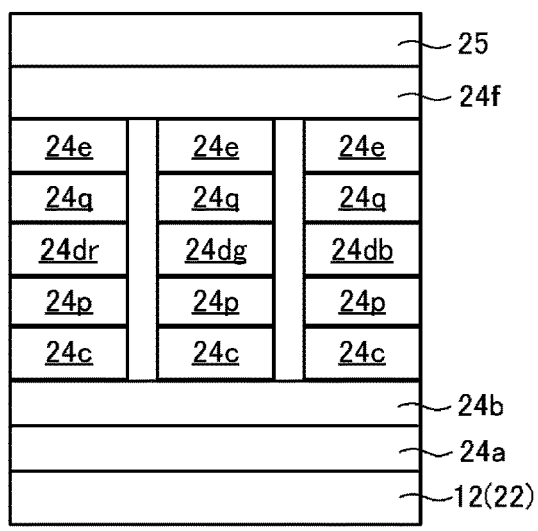
FIG. 43J is a diagram explaining a specific manufacturing process of a configuration of the main portions of the display device illustrated in FIG. 40.

Then, the first solution dripping process, the first intermediate layer formation process, the fourth solution dripping process, the fourth intermediate layer formation process, the second solution dripping process, the second intermediate layer formation process, the fifth solution dripping process, the fifth intermediate layer formation process, the third solution dripping process, the third intermediate layer formation process, the patterning process, and the formation process are repeated sequentially. As a result, as illustrated in FIG. 43I, the light-emitting layer 24$dg$ of the green light-emitting element Xg, the pair of holding layers (that is, first holding layer 24$c$ and second holding layer 24$e$) sandwiching the light-emitting layer 24$dg$, and the first high-resistivity layer 24$p$ and the second high-resistivity layer 24$q$ provided between the light-emitting layer 24$dg$ and the pair of holding layers 24$c$ and 24$e$ are formed, and furthermore the light-emitting layer 24$db$ of the blue light-emitting element Xb, the pair of holding layers (that is, first holding layer 24$c$ and second holding layer 24$e$) sandwiching the light-emitting layer 24$db$, and the first high-resistivity layer 24$p$ and the second high-resistivity layer 24$q$ provided between the light-emitting layer 24$db$ and the pair of holding layers 24$c$ and 24$e$ are formed. As a result, in the present embodiment, the dripping technique and the photolithography method are combined to form a pixel pattern corresponding to the three colors RGB, and the separate-patterning of RGB is completed. Note that, even in a case in which the light-emitting elements Xr, Xg, and Xb are OLEDs, each of the pair of holding layers, the first high-resistivity layer, and the second high-resistivity layer are similarly formed using a material similar to that when the light-emitting elements Xr, Xg, and Xb are QLEDs.

With the above configuration, the present embodiment can achieve actions and effects similar to those of the first embodiment. In the present embodiment, since the first high-resistivity layer 24$p$ and the second high-resistivity layer 24$q$ are provided between the light-emitting layer 24$d$ and the pair of holding layers 24$c$ and 24$e$, quenching in which electrons and holes are recombined before the light-emitting layer 24$d$ emits light can be suppressed from occurring at an interface between the light-emitting layer 24$d$ and another layer.

Eighteenth Embodiment

Figure 44:
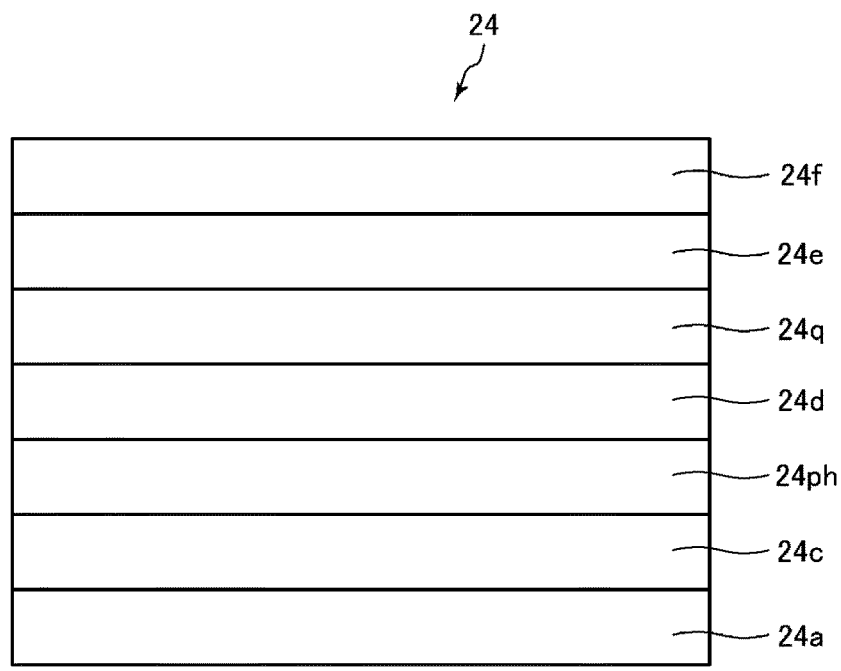
FIG. 44 is a cross-sectional view illustrating a specific configuration of a function layer of a display device according to an eighteenth embodiment of the disclosure.

FIG. 44 is a cross-sectional view illustrating a specific configuration of a function layer of a display device according to an eighteenth embodiment of the disclosure. In the drawing, a main difference between the present embodiment and the seventeenth embodiment described above is integration of the first high-resistivity layer and the hole transport layer. Note that elements common to those in the seventeenth embodiment are denoted by the same reference signs, and duplicate description thereof will be omitted.

In the display device 2 of the present embodiment, as illustrated in FIG. 44, the function layer 24 includes the hole injection layer 24a, the first holding layer 24c, a first high-resistivity layer 24ph, the light-emitting layer 24d, the second high-resistivity layer 24q, the second holding layer 24e, and the electron transport layer 24f. The first high-resistivity layer 24ph has a function of the hole transport layer, and constitutes the high-resistivity layer that also serves as the hole transport layer.

Next, a method for manufacturing the display device 2 of the present embodiment will be specifically described with reference to FIG. 45A to FIG. 45J as well. FIG. 45A to FIG. 45J are diagrams explaining a specific manufacturing process of a configuration of the main portions of the display device illustrated in FIG. 44. Note that, in FIG. 45A to FIG. 45J, for the sake of simplicity in the drawings, illustration of the first electrode 22 and the edge cover film 23 for each subpixel SP is omitted.

Figure 45A:
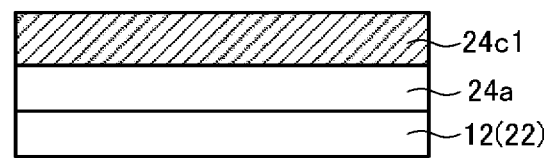
FIG. 45A is a diagram explaining a specific manufacturing process of a configuration of main portions of the display device illustrated in FIG. 44.
Figure 45B:
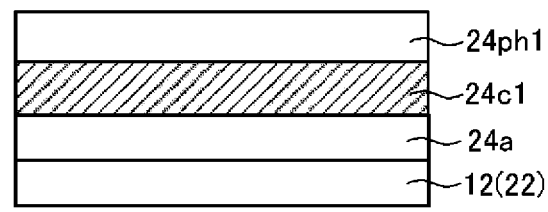
FIG. 45B is a diagram explaining a specific manufacturing process of a configuration of the main portions of the display device illustrated in FIG. 44.
Figure 45C:
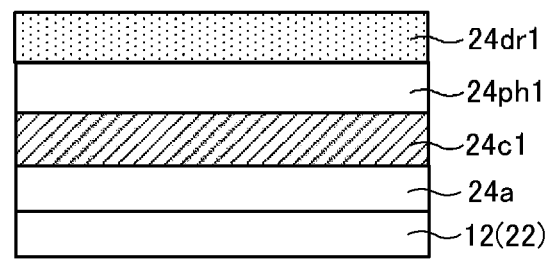
FIG. 45C is a diagram explaining a specific manufacturing process of a configuration of the main portions of the display device illustrated in FIG. 44.
Figure 45D:
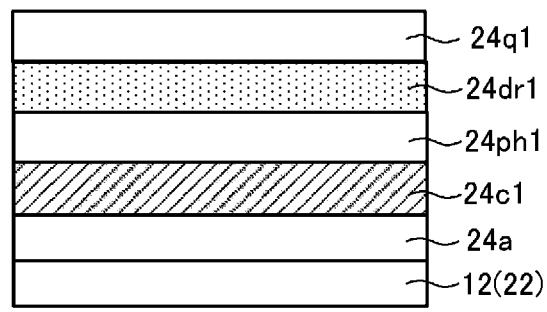
FIG. 45D is a diagram explaining a specific manufacturing process of a configuration of the main portions of the display device illustrated in FIG. 44.
Figure 45E:
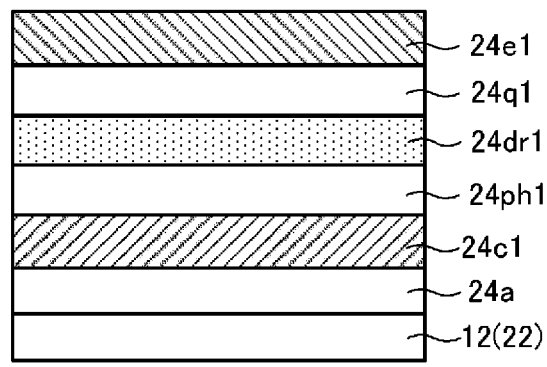
FIG. 45E is a diagram explaining a specific manufacturing process of a configuration of the main portions of the display device illustrated in FIG. 44.
Figure 45F:
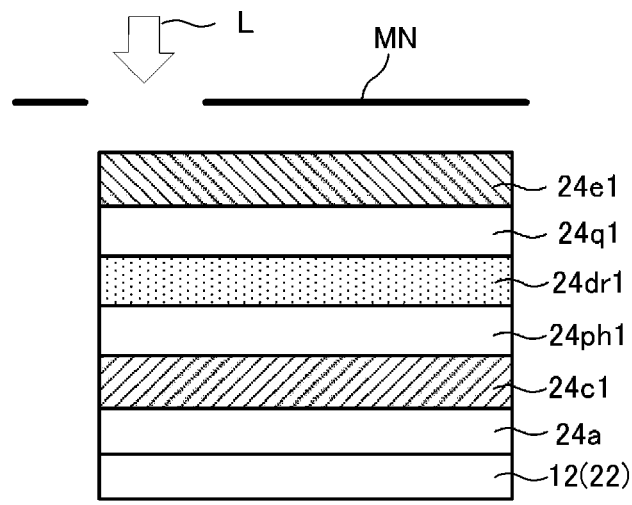
FIG. 45F is a diagram explaining a specific manufacturing process of a configuration of the main portions of the display device illustrated in FIG. 44.
Figure 45G:
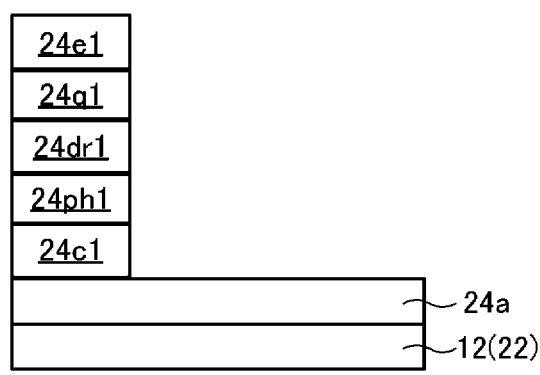
FIG. 45G is a diagram explaining a specific manufacturing process of a configuration of the main portions of the display device illustrated in FIG. 44.
Figure 45H:
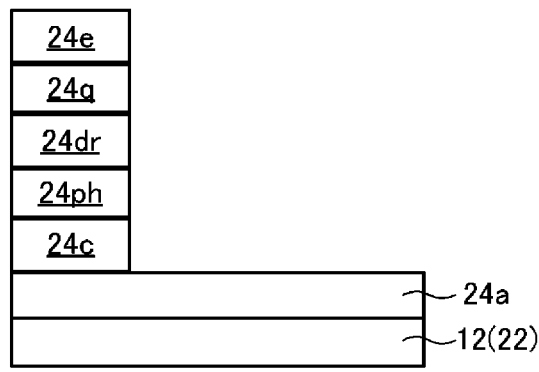
FIG. 45H is a diagram explaining a specific manufacturing process of a configuration of the main portions of the display device illustrated in FIG. 44.
Figure 45I:
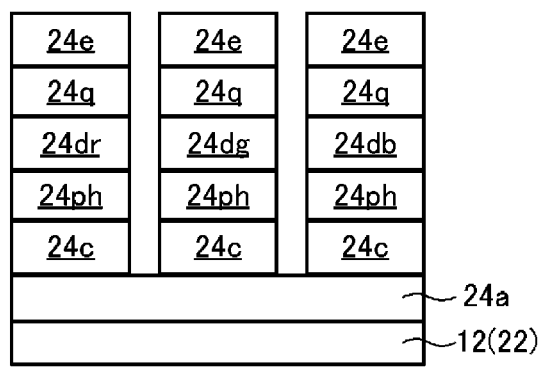
FIG. 45I is a diagram explaining a specific manufacturing process of a configuration of the main portions of the display device illustrated in FIG. 44.
Figure 45J:
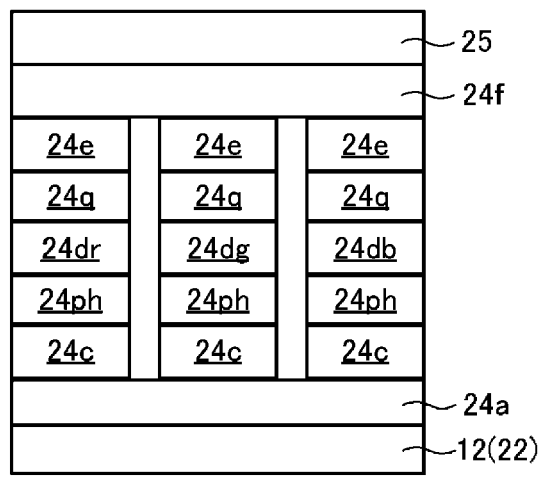
FIG. 45J is a diagram explaining a specific manufacturing process of a configuration of the main portions of the display device illustrated in FIG. 44.

As illustrated in FIG. 45B, in the present embodiment, a fourth intermediate layer 24ph1 of the first high-resistivity layer 24ph is formed on the first intermediate layer 24c1. Specifically, after the first intermediate layer formation process (step S22) is performed, a solution dripping process of dripping a solution for first high-resistivity layer formation including a functional material having a photosensitive function and a hole transport function onto the first intermediate layer 24c1 is performed.

For example, OTPD is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for first high-resistivity layer formation in which these functional materials serve as the solute, the same solvent as in the first solution described above can be used, and the same photoinitiator and/or additive as in the first solution may be included.

Then, following the solution dripping process described above, the solution for first high-resistivity layer formation on the first intermediate layer 24c1 is, for example, baked at a low temperature of about from 50 to 130° C. or vacuum dried, thereby evaporating the solvent of the solution for first high-resistivity layer formation to form the fourth intermediate layer 24ph1 of the first high-resistivity layer 24ph on the first intermediate layer 24c1.

Subsequently, as illustrated in FIG. 45C to FIG. 45J, the second intermediate layer 24dr1 of the light-emitting layer 24dr, the fifth intermediate layer 24q1 of the second high-resistivity layer 24q, and the third intermediate layer 24e1 of the second holding layer (other holding layer) 24e are sequentially layered as in the seventeenth embodiment, and subsequently the patterning process and the formation process are performed, thereby forming the light-emitting layer 24dr in the light-emitting element Xr, the pair of holding layers 24c and 24e sandwiching the light-emitting layer 24dr, and the first high-resistivity layer 24ph and the second high-resistivity layer 24q provided between the light-emitting layer 24dr and the pair of holding layers 24c and 24e. Next, a similar process is performed for the light-emitting element Xg and the light-emitting element Xb, thereby providing the light-emitting layer 24dg in the light-emitting element Xg, the pair of holding layers 24c and 24e sandwiching the light-emitting layer 24dg, and the first high-resistivity layer 24ph and the second high-resistivity layer 24q provided between the light-emitting layer 24dg and the pair of holding layers 24c and 24e, and the light-emitting layer 24db in the light-emitting element Xb, the pair of holding layers 24c and 24e sandwiching the light-emitting layer 24db, and the first high-resistivity layer 24ph and the second high-resistivity layer 24q provided between the light-emitting layer 24db and the pair of holding layers 24c and 24e, and subsequently providing the electron transport layer 24f and the second electrode (cathode electrode) 25.

With the above configuration, the present embodiment can achieve actions and effects similar to those of the seventeenth embodiment. Further, in the present embodiment, the first high-resistivity layer 24ph, which also serves as the hole transport layer, is provided, thereby simplifying the manufacturing process while reducing the number of components of the display device 2.

Nineteenth Embodiment

Figure 46:
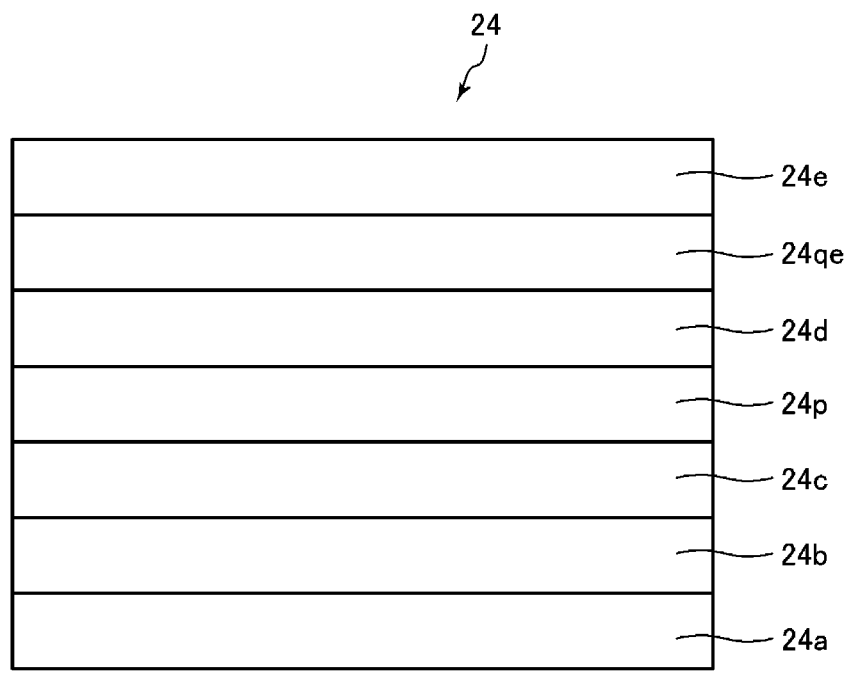
FIG. 46 is a cross-sectional view illustrating a specific configuration of a function layer of a display device according to a nineteenth embodiment of the disclosure.

FIG. 46 is a cross-sectional view illustrating a specific configuration of a function layer of a display device according to a nineteenth embodiment of the disclosure. In the drawing, a main difference between the present embodiment and the seventeenth embodiment described above is integration of the second high-resistivity layer and the electron transport layer. Note that elements common to those in the seventeenth embodiment are denoted by the same reference signs, and duplicate description thereof will be omitted.

In the display device 2 of the present embodiment, as illustrated in FIG. 46, the function layer 24 includes the hole injection layer 24a, the hole transport layer 24b, the first holding layer 24c, the first high-resistivity layer 24p, the light-emitting layer 24d, a second high-resistivity layer 24qe, and the second holding layer 24e. The second high-resistivity layer 24qe has a function of the electron transport layer, and constitutes the high-resistivity layer that also serves as the electron transport layer.

Next, a method for manufacturing the display device 2 of the present embodiment will be specifically described with reference to FIG. 47A to FIG. 47J as well. FIG. 47A to FIG. 47J are diagrams explaining a specific manufacturing process of a configuration of the main portions of the display device illustrated in FIG. 46. Note that, in FIG. 47A to FIG. 47J, for the sake of simplicity in the drawings, illustration of the first electrode 22 and the edge cover film 23 for each subpixel SP is omitted.

Figure 47A:
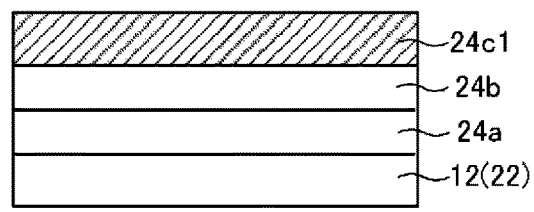
FIG. 47A is a diagram explaining a specific manufacturing process of a configuration of main portions of the display device illustrated in FIG. 46.
Figure 47B:
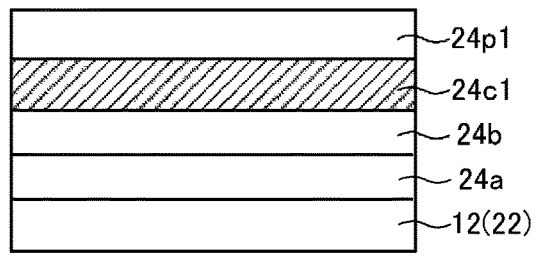
FIG. 47B is a diagram explaining a specific manufacturing process of a configuration of the main portions of the display device illustrated in FIG. 46.
Figure 47C:
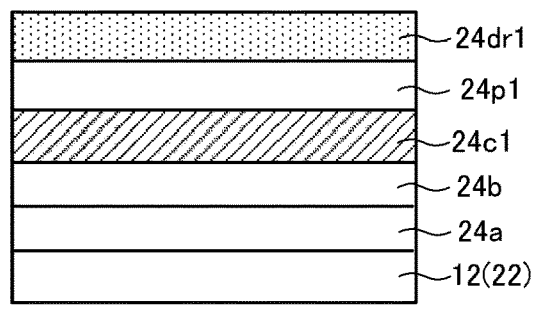
FIG. 47C is a diagram explaining a specific manufacturing process of a configuration of the main portions of the display device illustrated in FIG. 46.
Figure 47D:
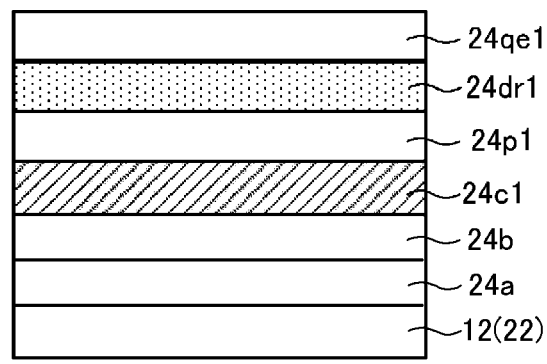
FIG. 47D is a diagram explaining a specific manufacturing process of a configuration of the main portions of the display device illustrated in FIG. 46.
Figure 47E:
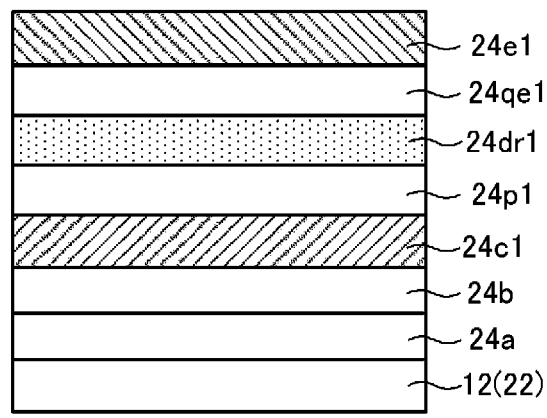
FIG. 47E is a diagram explaining a specific manufacturing process of a configuration of the main portions of the display device illustrated in FIG. 46.
Figure 47F:
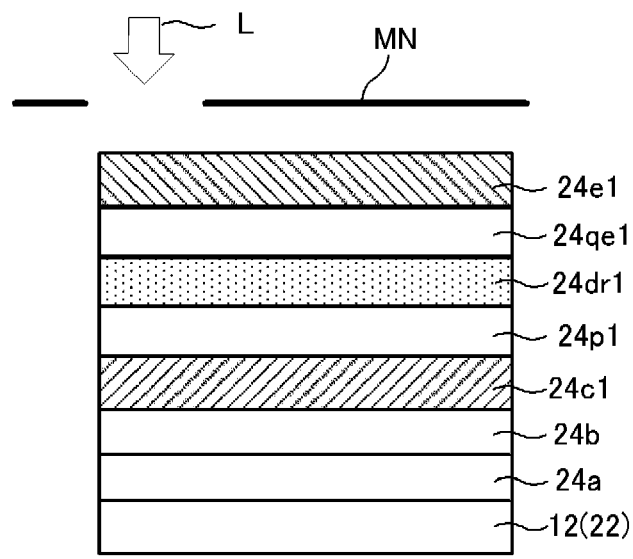
FIG. 47F is a diagram explaining a specific manufacturing process of a configuration of the main portions of the display device illustrated in FIG. 46.
Figure 47G:
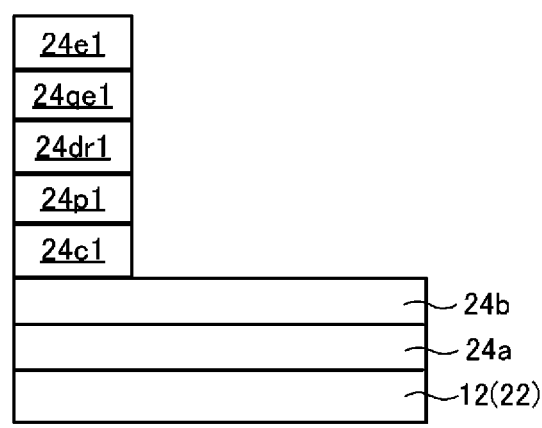
FIG. 47G is a diagram explaining a specific manufacturing process of a configuration of the main portions of the display device illustrated in FIG. 46.
Figure 47H:
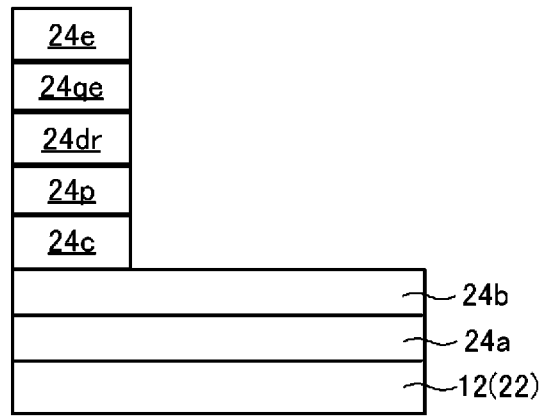
FIG. 47H is a diagram explaining a specific manufacturing process of a configuration of the main portions of the display device illustrated in FIG. 46.
Figure 47I:
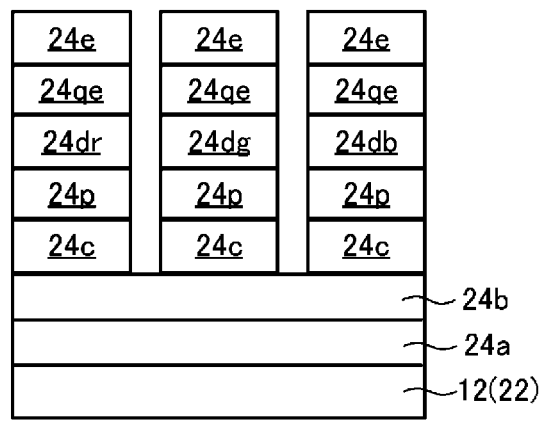
FIG. 47I is a diagram explaining a specific manufacturing process of a configuration of the main portions of the display device illustrated in FIG. 46.
Figure 47J:
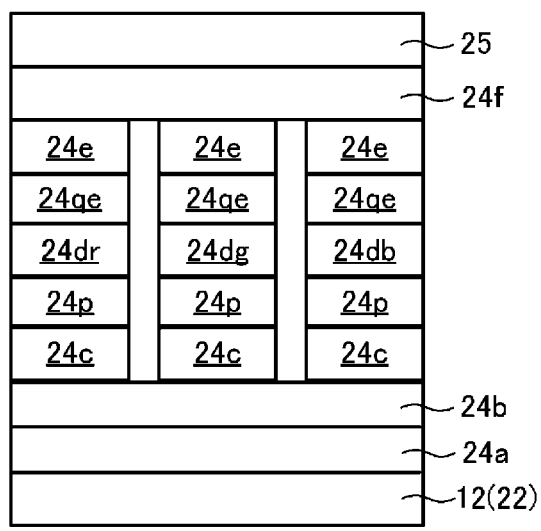
FIG. 47J is a diagram explaining a specific manufacturing process of a configuration of the main portions of the display device illustrated in FIG. 46.

As illustrated in FIG. 47D, in the present embodiment, a fifth intermediate layer 24qe1 of the second high-resistivity layer 24qe is formed on the second intermediate layer 24dr1. Specifically, after the second intermediate layer formation process (step S24) is performed, a solution dripping process of dripping a solution for second high-resistivity layer formation including a functional material having a photosensitive function and an electron transport function onto the second intermediate layer 24dr1 is performed.

As the functional material having a photosensitive function and an electron transport function, a combined material obtained by combining the second photosensitive material described above and an electron transport material such as nanoparticles of zinc oxide (ZnO) or magnesium-doped zinc oxide (MgZnO) or structural particles by a sol-gel method is used, for example. Further, in the solution for second high-resistivity layer formation in which these functional materials serve as the solute, the same solvent as in the third solution described above can be used, and the same photoinitiator and/or additive as in the third solution may be included.

Then, following the solution dripping process described above, the solution for second high-resistivity layer formation on the second intermediate layer 24dr1 is, for example, baked at a low temperature of about from 50 to 80° C. or vacuum dried, thereby evaporating the solvent of the solution for second high-resistivity layer formation to form the fifth intermediate layer 24qe1 of the second high-resistivity layer 24qe on the second intermediate layer 24dr1.

Subsequently, as illustrated in FIG. 47E to FIG. 47J, the third intermediate layer 24e1 of the second holding layer (other holding layer) 24e is layered as in the seventeenth embodiment, and subsequently the patterning process and the formation process are performed, thereby forming the light-emitting layer 24dr in the light-emitting element Xr, the pair of holding layers 24c and 24e sandwiching the light-emitting layer 24dr, and the first high-resistivity layer 24p and the second high-resistivity layer 24qe provided between the light-emitting layer 24dr and the pair of holding layers 24c and 24e. Next, a similar process is performed for the light-emitting element Xg and the light-emitting element Xb, thereby providing the light-emitting layer 24dg in the light-emitting element Xg, the pair of holding layers 24c and 24e sandwiching the light-emitting layer 24dg, and the first high-resistivity layer 24p and the second high-resistivity layer 24qe provided between the light-emitting layer 24dg and the pair of holding layers 24c and 24e, and the light-emitting layer 24db in the light-emitting element Xb, the pair of holding layers 24c and 24e sandwiching the light-emitting layer 24db, and the first high-resistivity layer 24p and the second high-resistivity layer 24qe provided between the light-emitting layer 24db and the pair of holding layers 24c and 24e, and subsequently providing the second electrode (cathode electrode) 25.

With the above configuration, the present embodiment can achieve actions and effects similar to those of the seventeenth embodiment. Further, in the present embodiment, the second high-resistivity layer 24qe, which also serves as the electron transport layer, is provided, thereby simplifying the manufacturing process while reducing the number of components of the display device 2.

Twentieth Embodiment

Figure 48:
FIG. 48 is a cross-sectional view illustrating a specific configuration of a function layer of a display device according to a twentieth embodiment of the disclosure.

FIG. 48 is a cross-sectional view illustrating a specific configuration of a function layer of a display device according to a twentieth embodiment of the disclosure. In the drawing, a main difference between the present embodiment and the seventeenth embodiment described above is integration of the first high-resistivity layer and the hole transport layer and integration of the second high-resistivity layer and the electron transport layer. Note that elements common to those in the seventeenth embodiment are denoted by the same reference signs, and duplicate description thereof will be omitted.

In the display device 2 of the present embodiment, as illustrated in FIG. 48, the function layer 24 includes the hole injection layer 24a, the first holding layer 24c, the first high-resistivity layer 24ph, the light-emitting layer 24d, the second high-resistivity layer 24qe, and the second holding layer 24e. The first high-resistivity layer 24ph has a function of the hole transport layer, and constitutes the high-resistivity layer that also serves as the hole transport layer. The second high-resistivity layer 24qe has a function of the electron transport layer, and constitutes the high-resistivity layer that also serves as the electron transport layer.

Next, a method for manufacturing the display device 2 of the present embodiment will be specifically described with reference to FIG. 49A to FIG. 49J as well. FIG. 49A to FIG. 49J are diagrams explaining a specific manufacturing process of a configuration of the main portions of the display device illustrated in FIG. 48. Note that, in FIG. 49A to FIG. 49J, for the sake of simplicity in the drawings, illustration of the first electrode 22 and the edge cover film 23 for each subpixel SP is omitted.

Figure 49A:
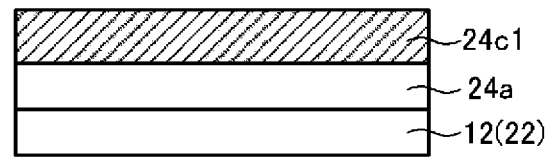
FIG. 49A is a diagram explaining a specific manufacturing process of a configuration of main portions of the display device illustrated in FIG. 48.
Figure 49B:
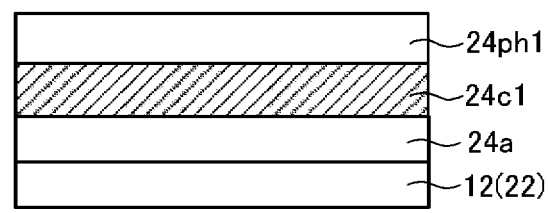
FIG. 49B is a diagram explaining a specific manufacturing process of a configuration of the main portions of the display device illustrated in FIG. 48.

As illustrated in FIG. 49B, in the present embodiment, a fourth intermediate layer 24ph1 of the first high-resistivity layer 24ph is formed on the first intermediate layer 24c1. Specifically, after the first intermediate layer formation process (step S22) is performed, a solution dripping process of dripping a solution for first high-resistivity layer formation including a functional material having a photosensitive function and a hole transport function onto the first intermediate layer 24c1 is performed.

For example, OTPD is used as the functional material having a photosensitive function and a hole transport function. Further, as this functional material, a combined material obtained by combining the first photosensitive material described above and a hole transport material such as polysilane, poly-TPD, TFB, or nickel oxide can be used. Further, in the solution for first high-resistivity layer formation in which these functional materials serve as the solute, the same solvent as in the first solution described above can be used, and the same photoinitiator and/or additive as in the first solution may be included.

Then, following the solution dripping process described above, the solution for first high-resistivity layer formation on the first intermediate layer 24c1 is, for example, baked at a low temperature of about from 50 to 130° C. or vacuum dried, thereby evaporating the solvent of the solution for first high-resistivity layer formation to form the fourth intermediate layer 24ph1 of the first high-resistivity layer 24ph on the first intermediate layer 24c1.

Figure 49C:
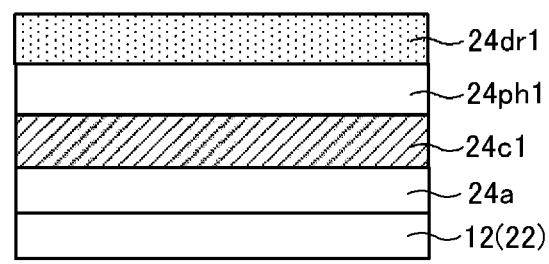
FIG. 49C is a diagram explaining a specific manufacturing process of a configuration of the main portions of the display device illustrated in FIG. 48.
Figure 49D:
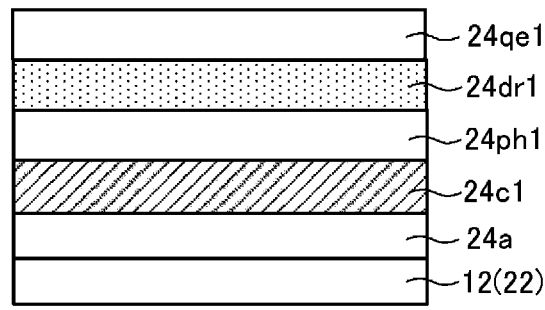
FIG. 49D is a diagram explaining a specific manufacturing process of a configuration of the main portions of the display device illustrated in FIG. 48.
Figure 49E:
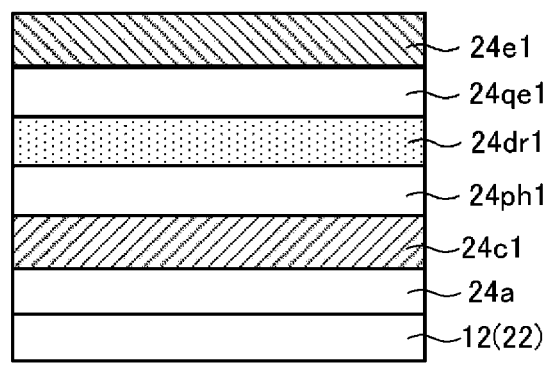
FIG. 49E is a diagram explaining a specific manufacturing process of a configuration of the main portions of the display device illustrated in FIG. 48.
Figure 49F:
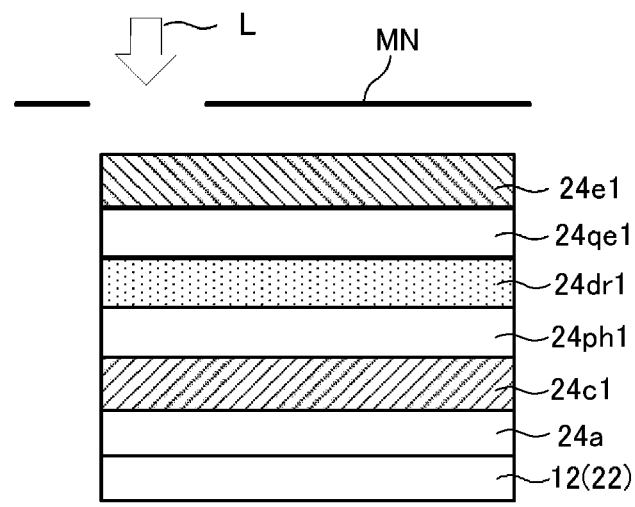
FIG. 49F is a diagram explaining a specific manufacturing process of a configuration of the main portions of the display device illustrated in FIG. 48.
Figure 49G:
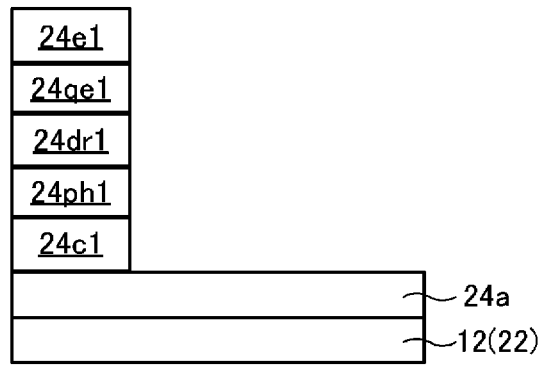
FIG. 49G is a diagram explaining a specific manufacturing process of a configuration of the main portions of the display device illustrated in FIG. 48.
Figure 49H:
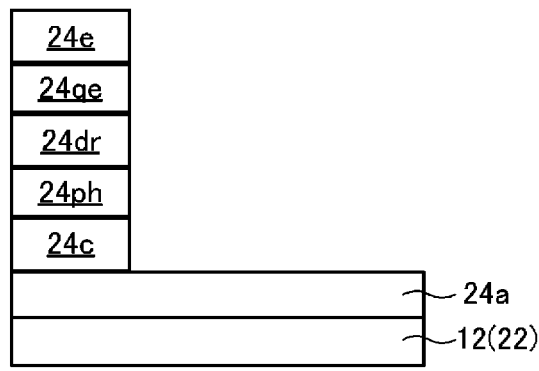
FIG. 49H is a diagram explaining a specific manufacturing process of a configuration of the main portions of the display device illustrated in FIG. 48.
Figure 49I:
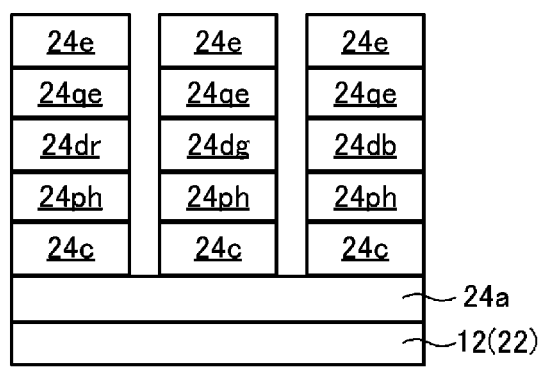
FIG. 49I is a diagram explaining a specific manufacturing process of a configuration of the main portions of the display device illustrated in FIG. 48.
Figure 49J:
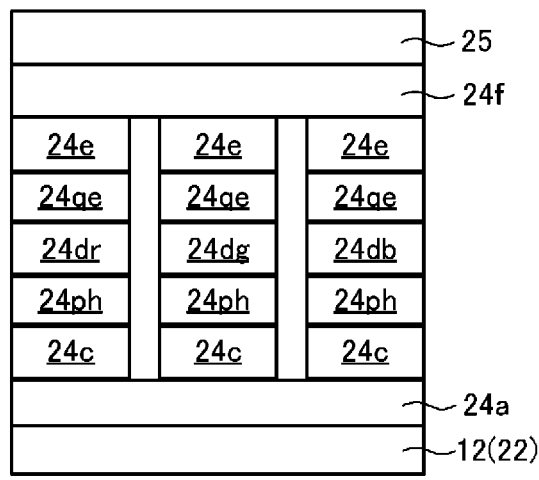
FIG. 49J is a diagram explaining a specific manufacturing process of a configuration of the main portions of the display device illustrated in FIG. 48.

Subsequently, as illustrated in FIG. 49C, similarly to the first embodiment, the second intermediate layer 24dr1 of the light-emitting layer 24dr is formed. Then, as illustrated in FIG. 49D, in the present embodiment, the fifth intermediate layer 24qe1 of the second high-resistivity layer 24qe is formed on the second intermediate layer 24dr1. Specifically, after the second intermediate layer formation process (step S24) is performed, a solution dripping process of dripping a solution for second high-resistivity layer formation including a functional material having a photosensitive function and an electron transport function onto the second intermediate layer 24dr1 is performed.

As the functional material having a photosensitive function and an electron transport function, a combined material obtained by combining the second photosensitive material described above and an electron transport material such as nanoparticles of zinc oxide (ZnO) or magnesium-doped zinc oxide (MgZnO) or structural particles by a sol-gel method is used, for example. Further, in the solution for second high-resistivity layer formation in which these functional materials serve as the solute, the same solvent as in the third solution described above can be used, and the same photoinitiator and/or additive as in the third solution may be included.

Then, following the solution dripping process described above, the solution for second high-resistivity layer formation on the second intermediate layer 24dr1 is, for example, baked at a low temperature of about from 50 to 80° C. or vacuum dried, thereby evaporating the solvent of the solution for second high-resistivity layer formation to form the fifth intermediate layer 24qe1 of the second high-resistivity layer 24qe on the second intermediate layer 24dr1.

Subsequently, as illustrated in FIG. 49E to FIG. 49J, the third intermediate layer 24e1 of the second holding layer (other holding layer) 24e is layered as in the seventeenth embodiment, and subsequently the patterning process and the formation process are performed, thereby forming the light-emitting layer 24*dr* in the light-emitting element Xr, the pair of holding layers 24*c* and 24*e* sandwiching the light-emitting layer 24*dr*, and the first high-resistivity layer 24*ph* and the second high-resistivity layer 24*qe* disposed between the light-emitting layer 24*dr* and the pair of holding layers 24*c* and 24*e*. Next, a similar process is performed for the light-emitting element Xg and the light-emitting element Xb, thereby providing the light-emitting layer 24*dg* in the light-emitting element Xg, the pair of holding layers 24*c* and 24*e* sandwiching the light-emitting layer 24*dg*, and the first high-resistivity layer 24*ph* and the second high-resistivity layer 24*qe* disposed between the light-emitting layer 24*dg* and the pair of holding layers 24*c* and 24*e*, and the light-emitting layer 24*db* in the light-emitting element Xb, the pair of holding layers 24*c* and 24*e* sandwiching the light-emitting layer 24*db*, and the first high-resistivity layer 24*ph* and the second high-resistivity layer 24*qe* disposed between the light-emitting layer 24*db* and the pair of holding layers 24*c* and 24*e*, and subsequently providing the second electrode (cathode electrode) 25.

With the above configuration, the present embodiment can achieve actions and effects similar to those of the seventeenth embodiment. Further, in the present embodiment, the first holding layer 24*ch*, which also serves as the hole transport layer, and the second holding layer 24*qe*, which also serves as the electron transport layer, are provided, thereby simplifying the manufacturing process while reducing the number of components of the display device 2.

The invention claimed is:

1. A display device provided with a display region including a plurality of pixels and a frame region surrounding the display region, the display device comprising:
   a thin film transistor layer; and
   a light-emitting element layer including a plurality of light-emitting elements, each including a first electrode, a function layer, and a second electrode, and each having a different luminescent color,
   wherein the function layer includes
   a light-emitting layer, and
   a pair of holding layers sandwiching the light-emitting layer and each including a photosensitive material and a conductive nanoparticle.

2. The display device according to claim 1,
   wherein a resistivity of each holding layer of the pair of holding layers is less than a resistivity of the light-emitting layer.

3. The display device according to claim 1,
   wherein, in the pair of holding layers, the same type of photosensitive material and the same type of conductive nanoparticle are used.

4. The display device according to claim 1,
   wherein one of the first electrode and the second electrode is an anode electrode and the other is a cathode electrode, and
   the function layer includes
   a hole transport layer provided between the anode electrode and one holding layer of the pair of holding layers, and
   an electron transport layer provided between the cathode electrode and the other holding layer of the pair of holding layers.

5. The display device according to claim 4,
   wherein the function layer includes
   a first high-resistivity layer provided between the light-emitting layer and the one holding layer and having a resistivity higher than a resistivity of the light-emitting layer, and
   a second high-resistivity layer provided between the light-emitting layer and the other holding layer and having a resistivity higher than a resistivity of the light-emitting layer.

6. The display device according to claim 5,
   wherein, in the function layer, the second high-resistivity layer and the electron transport layer are integrated.

7. The display device according to claim 5,
   wherein, in the function layer, the first high-resistivity layer and the hole transport layer are integrated.

8. The display device according to claim 7,
   wherein the function layer includes a hole injection layer provided between the anode electrode and the hole transport layer.

9. The display device according to claim 4,
   wherein the function layer includes a hole injection layer provided between the anode electrode and the one holding layer and provided in common to the plurality of pixels.

10. The display device according to claim 5,
    wherein a photosensitive material is used for each of the first high-resistivity layer and the second high-resistivity layer.

11. The display device according to claim 10,
    wherein the same type of photosensitive material is used for the first high-resistivity layer and the second high-resistivity layer.

12. The display device according to claim 11,
    wherein, in each holding layer of the pair of holding layers, the same type of photosensitive material as a photosensitive material used in the first high-resistivity layer and the second high-resistivity layer is used.

13. The display device according to claim 1,
    wherein the light-emitting layer is a quantum dot light-emitting layer including a quantum dot.

14. The display device according to claim 13,
    wherein a quantum dot layer included in the plurality of light-emitting elements includes
    a red quantum dot light-emitting layer configured to emit red light,
    a green quantum dot light-emitting layer configured to emit green light, and
    a blue quantum dot light-emitting layer configured to emit blue light.

15. The display device according to claim 14,
    wherein a pair of holding layers included in each of the light-emitting elements including the red quantum dot light-emitting layer, the green quantum dot light-emitting layer, and the blue quantum dot light-emitting layer sandwich the red quantum dot light-emitting layer, the green quantum dot light-emitting layer, and the blue quantum dot light-emitting layer, respectively.

16. A method for manufacturing a display device provided with a display region including a plurality of pixels and a frame region surrounding the display region, the display device including a thin film transistor layer, and a light-emitting element layer including a plurality of light-emitting elements, each including a first electrode, a function layer, and a second electrode, and each having a different luminescent color, the method comprising:
    a) forming the function layer on the first electrode, wherein the a) forming the function layer includes b) forming a first charge transport layer included in the function layer on the first electrode, c) forming one holding layer of a pair of holding layers that sandwich a light-emitting layer and are included in the function layer on the first charge transport layer using a first photosensitive material and a first conductive nanoparticle, d) forming the light-emitting layer on the one holding layer, e) forming the other holding layer of the pair of holding layers included in the function layer on the light-emitting layer using a second photosensitive material and a second conductive nanoparticle, and f) forming a second charge transport layer included in the function layer on the other holding layer.

17. The method for manufacturing a display device, according to claim 16, wherein the c) forming the one holding layer, the d) forming the light-emitting layer, and the e) forming the other holding layer include g) dripping a first solution including the first photosensitive material and the first conductive nanoparticle onto the first charge transport layer, h) forming a first intermediate layer of the one holding layer on the first charge transport layer by drying a solvent in the first solution dripped, i) dripping a second solution included in the light-emitting layer and including a quantum dot onto the first intermediate layer, j) forming a second intermediate layer of the light-emitting layer on the first intermediate layer by drying a solvent in the second solution dripped, k) dripping a third solution including the second photosensitive material and the second conductive nanoparticle onto the second intermediate layer, l) forming a third intermediate layer of the other holding layer on the second intermediate layer by drying a solvent in the third solution dripped, m) patterning the first intermediate layer, the second intermediate layer, and the third intermediate layer by sequentially performing exposing using an irradiation light and developing using a developing solution on the first intermediate layer, the second intermediate layer, and the third intermediate layer, and n) forming the light-emitting layer and the pair of holding layers sandwiching the light-emitting layer on the first charge transport layer by curing the first intermediate layer, the second intermediate layer, and the third intermediate layer patterned.

18. The method for manufacturing a display device, according to claim 17, wherein the g) dripping the first solution, the h) forming the first intermediate layer, the i) dripping the second solution, the j) forming the second intermediate layer, the k) dripping the third solution, the l) forming the third intermediate layer, the m) patterning the first intermediate layer, and the n) forming the light-emitting layer are repeatedly performed sequentially for each luminescent color.

* * * * *